US012635164B2

(12) United States Patent
Chiang et al.

(10) Patent No.: US 12,635,164 B2
(45) Date of Patent: May 19, 2026

(54) SEMICONDUCTOR TRANSISTOR DEVICES INCLUDING NANOSTRUCTURES BETWEEN DIELECTRIC WALLS AND METHODS OF MANUFACTURING

(71) Applicant: Taiwan Semiconductor Manufacturing Co., Ltd., Hsinchu (TW)

(72) Inventors: Kuo-Cheng Chiang, Zhubei City (TW); Guan-Lin Chen, Baoshan Township (TW); Jung-Chien Cheng, Tainan City (TW); Shi Ning Ju, Hsinchu (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 444 days.

(21) Appl. No.: 18/311,787

(22) Filed: May 3, 2023

(65) Prior Publication Data

US 2024/0258415 A1     Aug. 1, 2024

Related U.S. Application Data

(60) Provisional application No. 63/481,652, filed on Jan. 26, 2023.

(51) Int. Cl.
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10D 84/83* | (2025.01) |

(52) U.S. Cl.
CPC .......... *H10D 30/43* (2025.01); *H10D 30/6735* (2025.01); *H10D 62/121* (2025.01); *H10D 84/0151* (2025.01); *H10D 84/038* (2025.01); *H10D 84/83* (2025.01)

(58) Field of Classification Search
CPC .............. H10D 30/6735; H10D 84/83; H10D 84/0151; H10D 30/43; H10D 84/038; H10D 62/121
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

FOREIGN PATENT DOCUMENTS

TW          202243023 A     11/2022

*Primary Examiner* — Changhyun Yi
(74) *Attorney, Agent, or Firm* — Slater Matsil, LLP

(57)          ABSTRACT

A device includes a first stack of nanostructures formed over a substrate; a second stack of nanostructures formed adjacent to the first stack; a first gate structure on the nanostructures of the first stack; a second gate structure on the nanostructures of the second stack; a first insulating wall separating the first gate structure and the second gate structure; a hard mask layer on the first gate structure and on the second gate structure; and a gate contact extending through the hard mask layer to physically and electrically contact the first gate structure.

20 Claims, 68 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2021/0083054 A1 | 3/2021 | Liaw | |
| 2021/0335783 A1 | 10/2021 | Chiu et al. | |
| 2021/0407999 A1 | 12/2021 | Huang et al. | |
| 2022/0173097 A1* | 6/2022 | Yang | H10D 84/834 |
| 2022/0328625 A1 | 10/2022 | Pan et al. | |
| 2022/0344464 A1 | 10/2022 | Chiu et al. | |
| 2022/0352313 A1 | 11/2022 | Chen et al. | |
| 2022/0399231 A1 | 12/2022 | You et al. | |
| 2023/0008494 A1 | 1/2023 | Chen et al. | |

* cited by examiner

SEMICONDUCTOR TRANSISTOR DEVICES INCLUDING NANOSTRUCTURES BETWEEN DIELECTRIC WALLS AND METHODS OF MANUFACTURING

PRIORITY CLAIM AND CROSS-REFERENCE

This application claims the benefit of U.S. Provisional Application No. 63/481,652, filed on Jan. 26, 2023, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
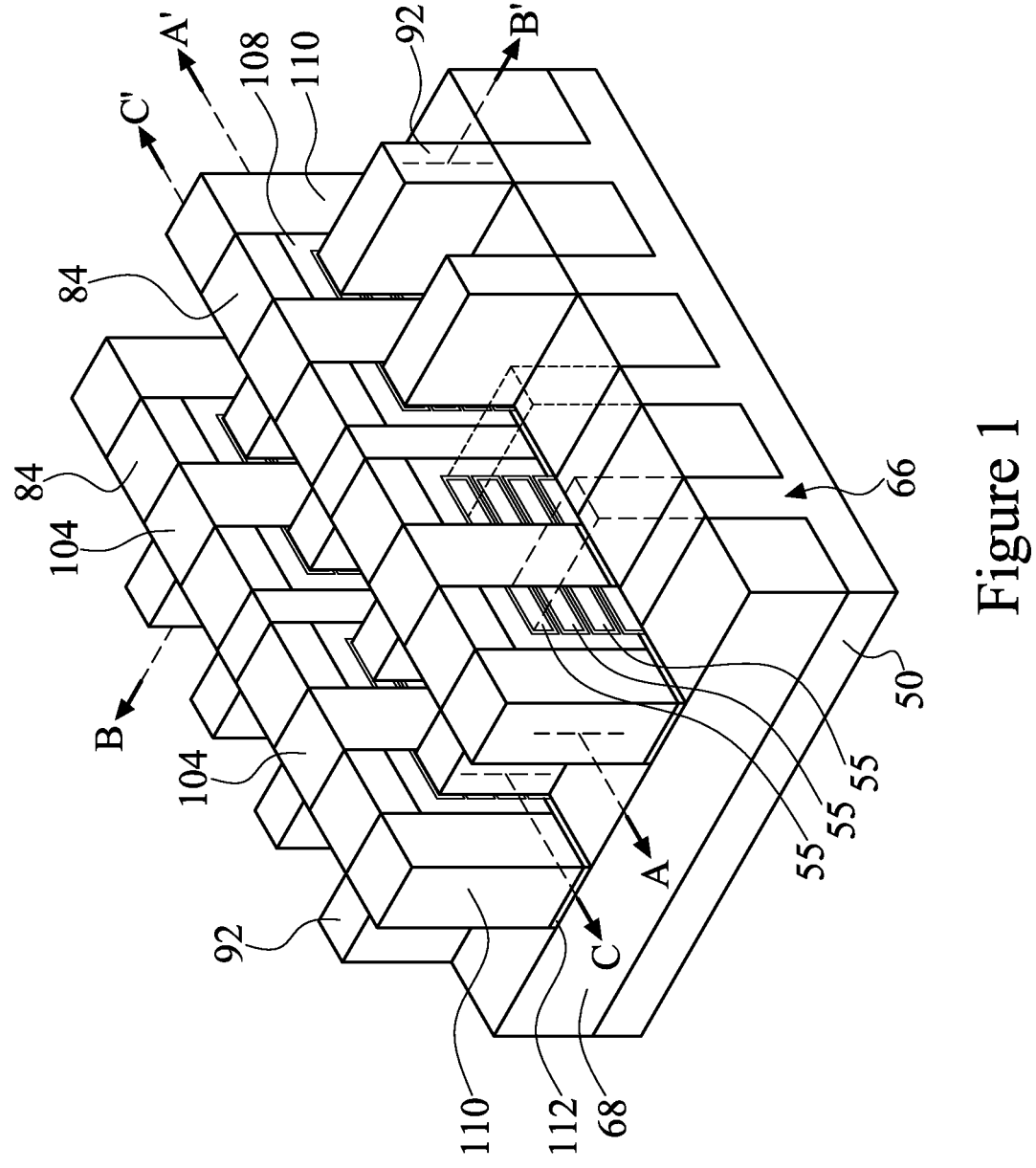
FIG. 1 illustrates an example of a nanostructure field-effect transistor (nano-FET) structure in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments describe the formation of a device comprising multiple nano-FETs having gate structures separated by isolation walls. The nanostructures of the nano-FETs are covered by hard masks that enable the isolation walls to be formed using self-aligned processes. This can allow for smaller separation between the gate structures of the nano-FETs or improved isolation between the gate structures of the nano-FETs. Additionally, covering the nanostructures with hard masks during manufacturing allows the gate electrodes of the nano-FETs to be formed having a smaller size, such as having a smaller height and/or a smaller end cap width. Forming smaller gate electrodes can reduce parasitic capacitances, improve device density, and improve device performance.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs (NWFETs), nanosheet FETs (NSFETs), gate-all-around ("GAA") FETs, forksheet FETs, or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate), wherein the nanostructures 55 act as channel regions for the nano-FETs. The nanostructures 55 may include p-type nanostructures, n-type nanostructures, or a combination thereof. Isolation regions 68 are disposed between adjacent fins 66, which may protrude above and from between neighboring isolation regions 68. Although the isolation regions 68 are described/ illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 106 are over top surfaces of the fins 66 and at least partially surround the nanostructures 55. For example, the gate dielectric layers 106 may be along top surfaces, sidewalls, and/or bottom surfaces of the nanostructures 55. Gate electrodes 108 are over the gate dielectric layers 106. The gate dielectric layers 106 and the gate electrodes 108 may be collectively referred to as "gate structures" or "gate stacks." Neighboring nanostructures 55 and gate structures are separated by first isolation walls 104 and second isolation walls 110. The gate structures are covered by a hard mask 84. Epitaxial source/drain regions 92 are disposed on the fins 66 on opposing sides of the gate structures. Source/drain region(s) 92 may refer to a source or a drain, individually or collectively dependent upon the context.

FIG. 1 further illustrates reference cross-sections that are used in later figures. Cross-section A-A' is along a gate electrode 108 and in a longitudinal direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions 92 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs).

FIGS. 2 through 26D are cross-sectional views of intermediate stages in the manufacturing of nano-FETs, in accordance with some embodiments. FIGS. 2, 3, 4B, 5B, 7B, 8B, 9B, 10B, 11B, 12B, 13B, 14B, 15B, 16B, 17B, 18B, 19B, 20B, 21B, 22B, 23B, 24B, 25B, and 26B illustrate reference cross-section A-A' illustrated in FIG. 1. FIGS. 5C, 6C, 7C, 8C, 9C, 10C, 11D, 12C, 18C, 19C, 20C, 21C, and 26D illustrate reference cross-section B-B' illustrated in FIG. 1. FIGS. 6B, 11C, and 26C illustrate reference cross-section C-C' illustrated in FIG. 1.

Figure 2:
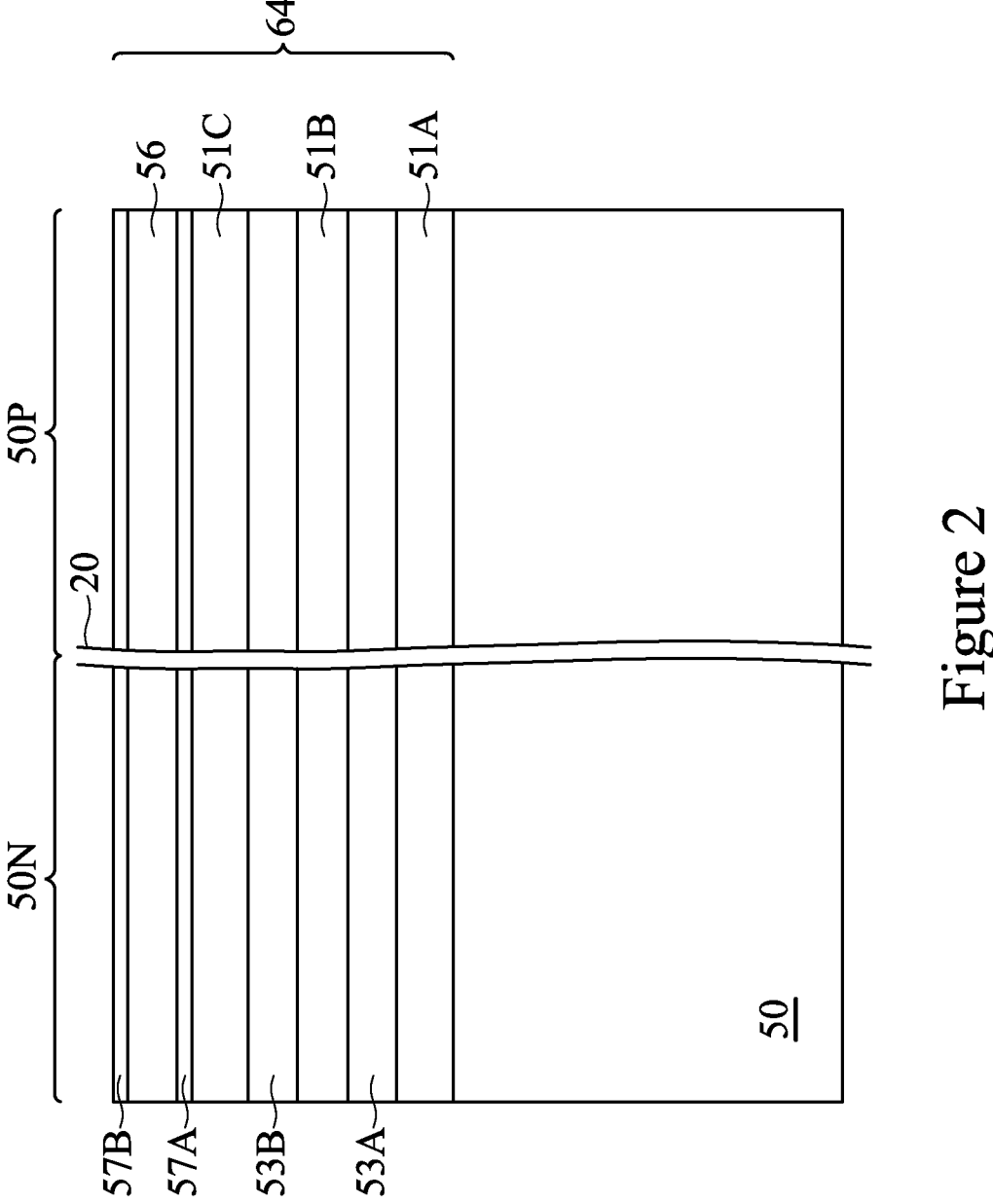
FIGS. 2, 3, 4A, 4B, 5A, 5B, 5C, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 13A, 13B, 14A, 14B, 15A, 15B, 16A, 16B, 17A, 17B, 18A, 18B, 18C, 19A, 19B, 19C, 20A, 20B, 20C, 21A, 21B, 21C, 22A, 22B, 23A, 23B, 24A, 24B, 25A, 25B, 26A, 26B, 26C, and 26D are perspective views and cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. In other cases, the n-type region 50N may be adjacent or contiguous with the p-type region 50P. Although one n-type region 50N and one p-type region 50P are illustrated, any number of n-type regions 50N and p-type regions 50P may be provided. Subsequent figures illustrate either an n-type region 50N or a p-type region 50P unless otherwise indicated or described.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-B (collectively referred to as second semiconductor layers 53). The multi-layer stack 64 also includes a third semiconductor layer 57A formed over the topmost first semiconductor layer (e.g. 51C in FIG. 2), a fourth semiconductor layer 56 formed over the third semiconductor layer 57A, and a fifth semiconductor layer 57B formed over the fourth semiconductor layer 56.

For purposes of illustration and as discussed in greater detail below, the first semiconductor layers 51 will be removed and the second semiconductor layers 53 will be patterned to form channel regions (e.g., nanostructures 54) of nano-FETs in the n-type region 50N and/or the p-type region 50P. In other embodiments, the second semiconductor layers 53 may be removed and the first semiconductor layers 51 may be patterned to form channel regions of nano-FETs in the n-type region 50N and/or the p-type region 50P. In some embodiments, the channel regions in both the n-type region 50N and the p-type region 50P may have a same material composition (e.g., silicon, or another semiconductor material) and be formed simultaneously. Additionally, the fourth semiconductor layer 56 will be removed and replaced by a hard mask material to form the hard masks 84.

The multi-layer stack 64 is illustrated as including three layers of the first semiconductor layers 51 and two layers of the second semiconductor layers 53 for illustrative purposes. In other embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. Other deposition processes, such as low pressure CVD (LPCVD), atomic layer CVD (ALCVD), ultrahigh vacuum CVD (UHVCVD), reduced pressure CVD (RPCVD), a combination thereof, or the like, may also be utilized. In various embodiments, the first semiconductor layers 51 may be formed of a first semiconductor material, such as silicon-germanium or the like. In some embodiments, the first semiconductor material is silicon-germanium having an atomic percentage of germanium in the range of about 15% to about 30%, though other compositions are possible. The second semiconductor layers 53 may be formed of a second semiconductor material, such as silicon, silicon carbon, or the like. In some embodiments, the second semiconductor material may be a material suitable for both n-type and p-type nano-FETs, such as silicon. The fourth semiconductor layer 56 may be formed of a third semiconductor material, such as silicon-germanium or the like. In some embodiments, the third semiconductor material is silicon-germanium having a higher atomic percentage of germanium than the first semiconductor material. In some embodiments, the third semiconductor material is silicon-germanium having an atomic percentage of germanium in the range of about 30% to about 50%, though other compositions are possible. The third semiconductor layer 57A and the fifth semiconductor layer 57B may be formed of material(s) similar to those of the other layers of the multi-layer stack 64, such as silicon. In some embodiments, the third semiconductor 57A and/or the fifth semiconductor layer 57B may be formed of silicon-germanium, which may have an atomic percentage of germanium less than that of the fourth semiconductor layer 56. Other semiconductor materials or combinations thereof are possible.

In some embodiments, the layers of the multi-layer stack 64 may have a thickness in the range of about 4 nm to about 20 nm, though other thicknesses are possible. Different layers of the multi-layer stack 64 may have different thicknesses, in some embodiments. For example, as shown in FIG. 2, the third semiconductor layer 57A and the fifth semiconductor layer 57B may be thinner than the fourth semiconductor layer 56, in some embodiments. In some embodiments, the thickness of the fourth semiconductor layer 56 may be greater than a thickness of any of the first semiconductor layers 51 and/or the second semiconductor layers 53. In some embodiments, the fourth semiconductor layer 56 has a thickness in the range of about 4 nm to about 10 nm, though other thicknesses are possible.

The first semiconductor material and the second semiconductor material may be materials having a high etch selectivity to one another. As such, the first semiconductor layers 51 of the first semiconductor material may be selectively removed without significantly removing the second semiconductor layers 53 of the second semiconductor material, thereby allowing the second semiconductor layers 53 to be patterned to form channel regions of nano-FETs. In some embodiments, the third semiconductor material may have a high etch selectivity to the first semiconductor material and/or the second semiconductor material. For example, the relatively larger atomic percentage of germanium of the third semiconductor material may allow the fourth semiconductor layer 56 to be selectively removed using an appropriate etching process.

Figure 3:
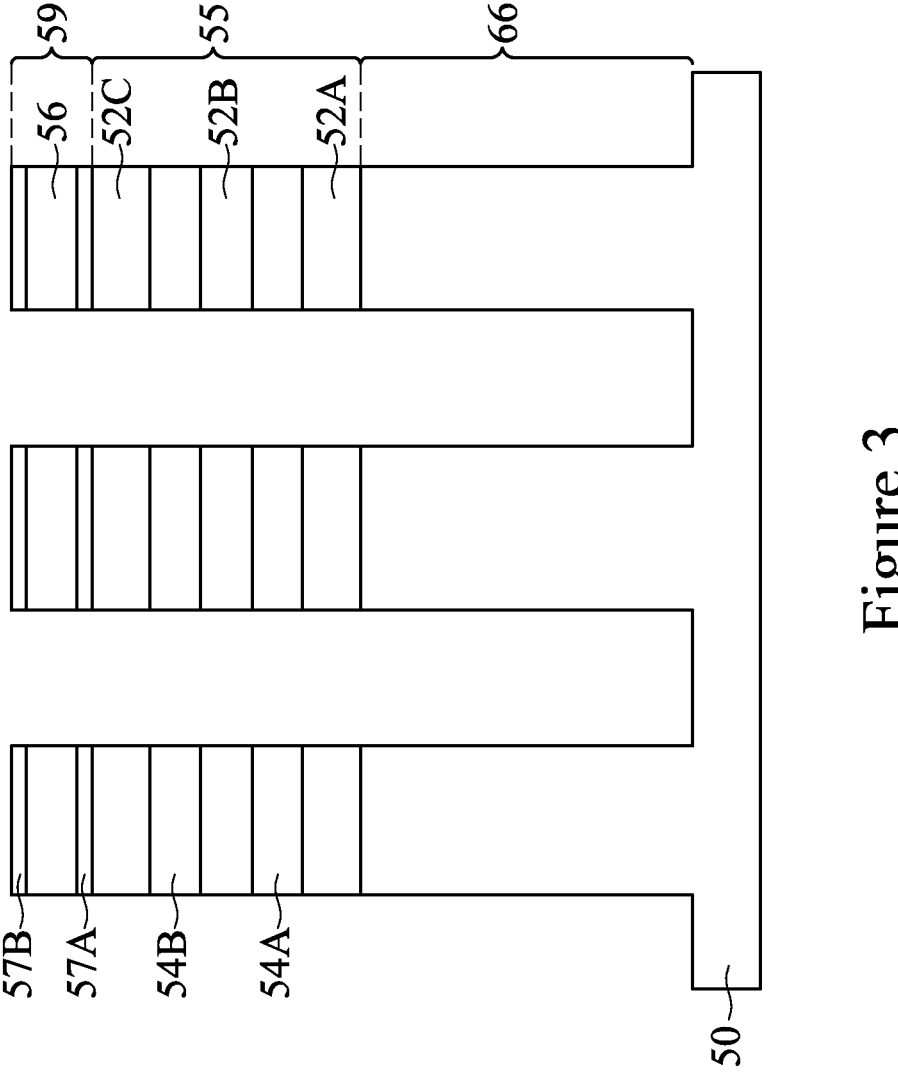

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-B (collectively referred to as the second nanostructures 54) from the second semiconductor layers 53. The first nanostructures 52 and the second nanostructures 54 may further be collectively referred to as nanostructures 55. Over the nanostructures 55 are patterned portions of the third semiconductor layer 57A, the fourth semiconductor layer 56, and the fifth semiconductor layer 57B, which may further be collectively referred to as sacrificial structures 59.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width (e.g., vertical sidewalls) throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape. The sacrificial structures 59 may also have vertical or tapered sidewalls. In some embodiments, the fins 66 may have a width in the range of about 5 nm to about 100 nm, though other widths are possible.

Figure 4A:
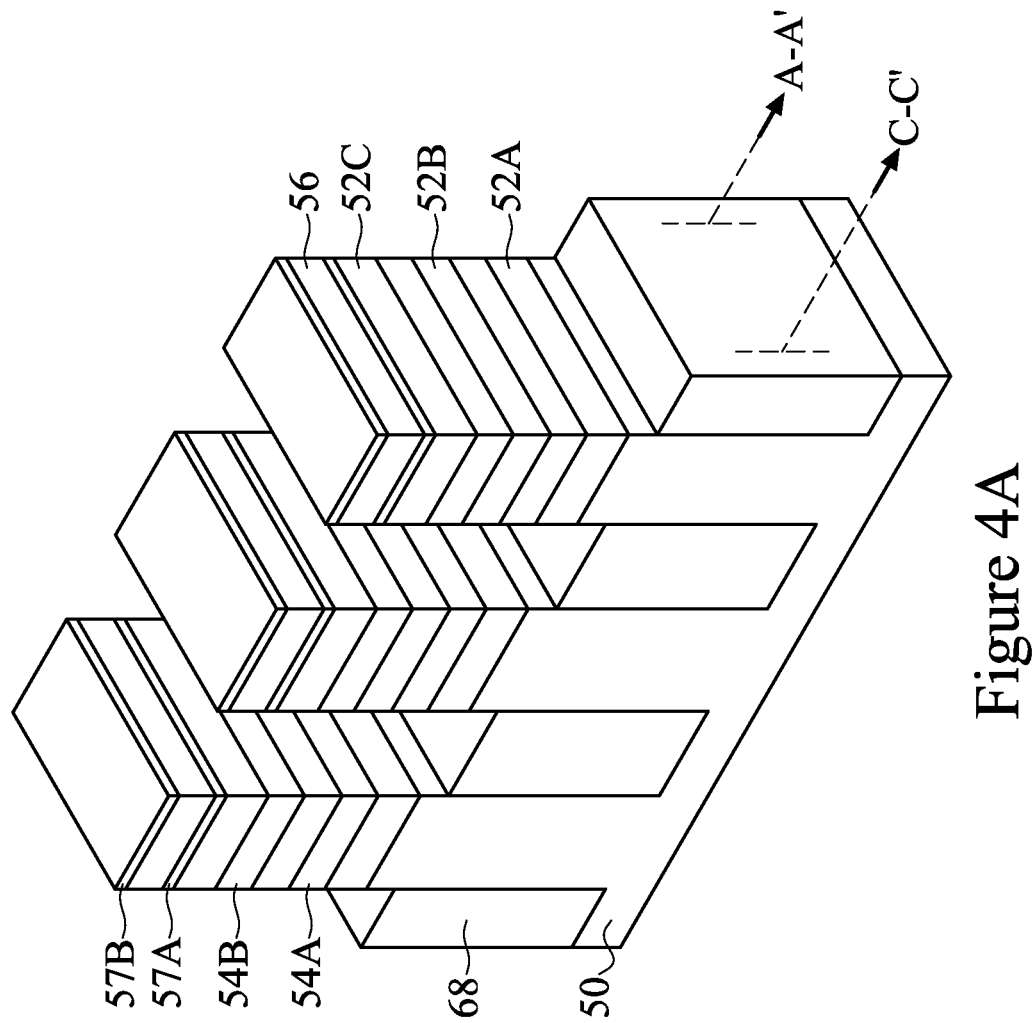
Figure 4B:
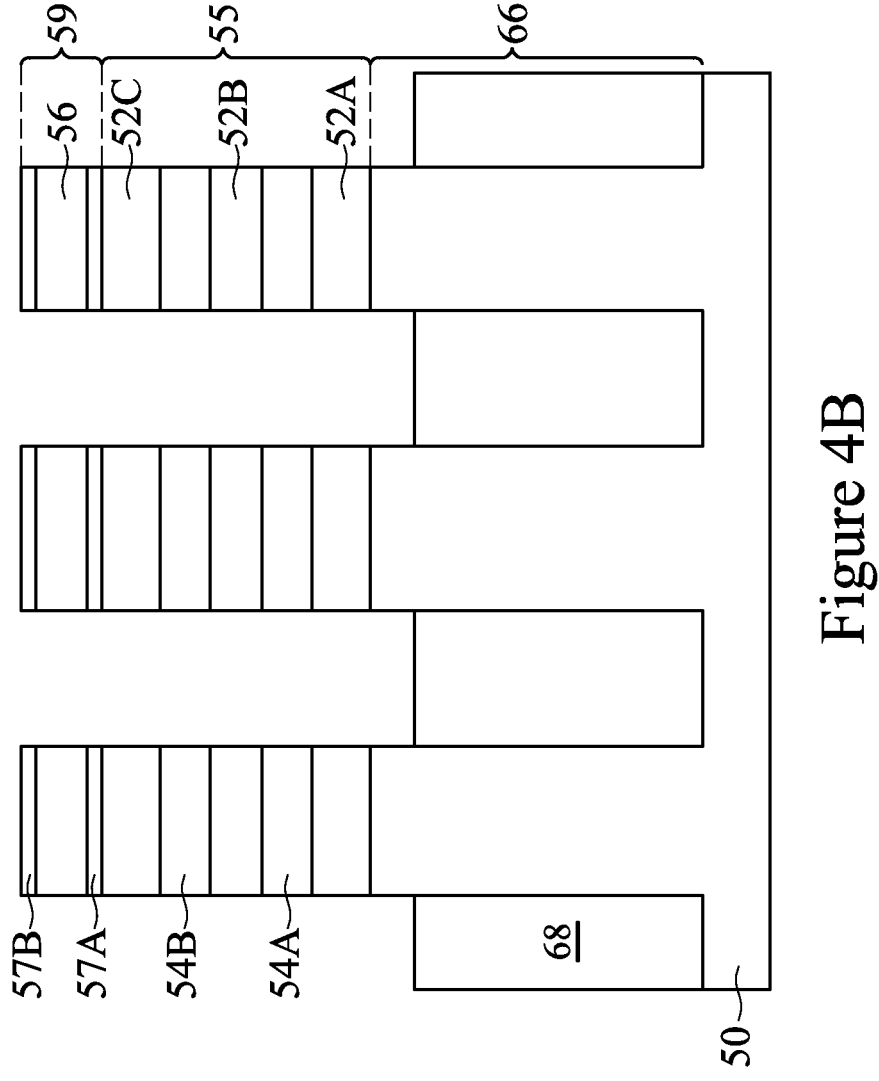

FIGS. 4A and 4B illustrate the formation of shallow trench isolation (STI) regions 68 adjacent the fins 66, in accordance with some embodiments. FIG. 4A illustrates a perspective view including cross-sections A-A' and C-C', and FIG. 4B illustrates a cross-sectional view along cross-section A-A'. Corresponding cross-sections A-A' and C-C' are indicated in the perspective view of FIG. 4A, and apply similarly to perspective views shown in FIGS. 5A through 12A. The STI regions 68 may be formed by depositing an insulation material over the substrate 50, the fins 66, nanostructures 55, and sacrificial structures 59, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55 and the sacrificial structures 59. Although the insulation material is illustrated as a single layer, some embodiments may utilize multiple layers. For example, in some embodiments a liner (not separately illustrated) may first be formed along a surface of the substrate 50, the fins 66, the nanostructures 55, and the sacrificial structures 59. Thereafter, a fill material, such as those discussed above may be formed over the liner.

A removal process is then applied to the insulation material to remove excess insulation material. In some embodiments, a planarization process such as a chemical mechanical polish (CMP), an etch-back process, combinations thereof, or the like may be utilized. The planarization process exposes the sacrificial structures 59 such that top surfaces of the sacrificial structures 59 and the insulation material are level after the planarization process is complete.

The insulation material is then recessed to form the STI regions 68. The insulation material is recessed such that upper portions of fins 66 protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4B is just one example of how the fins 66, the nanostructures 55, and the sacrificial structure 59 may be formed. In some embodiments, the fins 66, the nanostructures 55, and/or the sacrificial structures 59 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66, the nanostructures 55, and/or the sacrificial structures 59. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIGS. 4A and 4B, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together. In other embodiments, some or all of the implants of the n-type region 50N and/or the p-type region 50P may be performed before formation of the multi-layer stack 64.

Figure 5A:
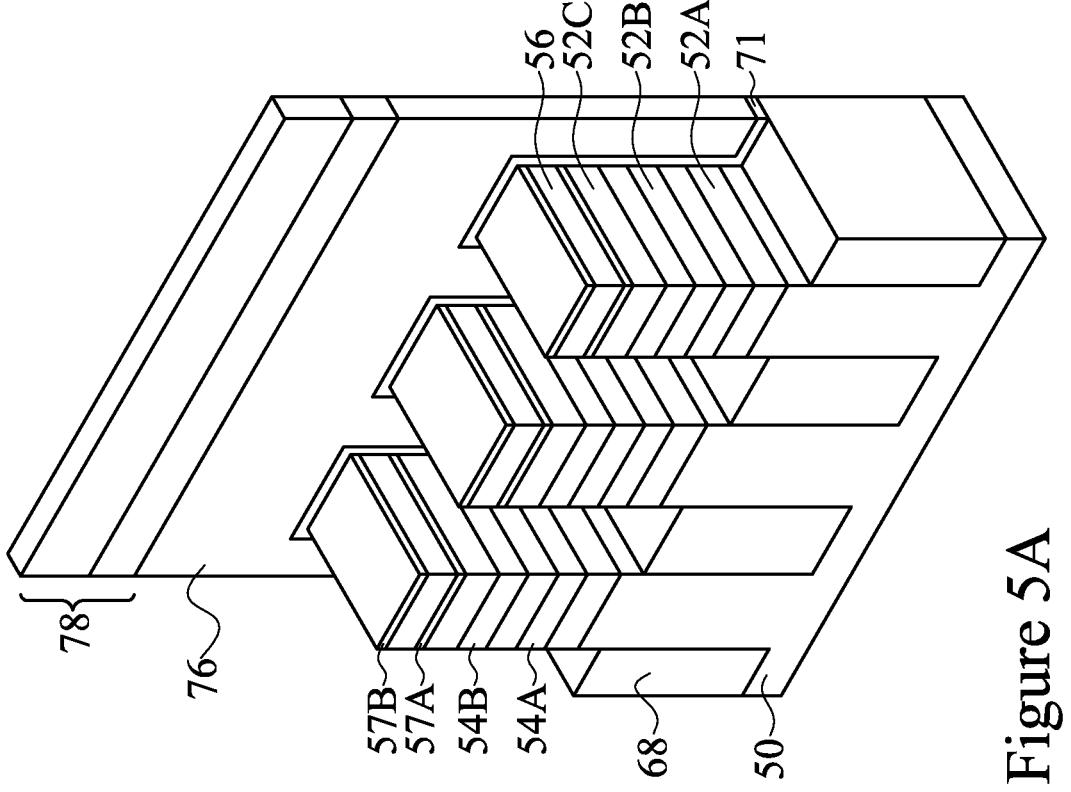
Figure 5B:
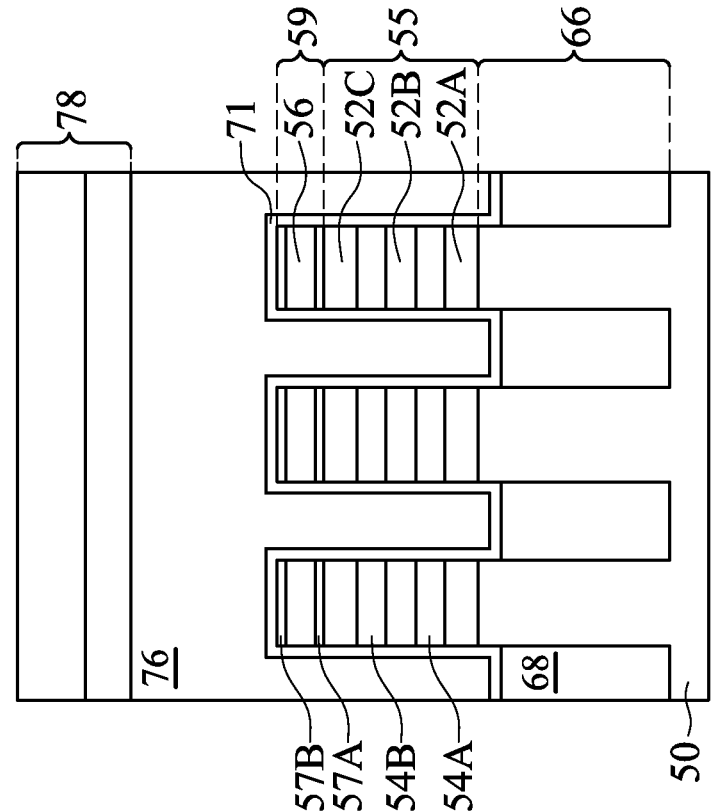
Figure 5C:
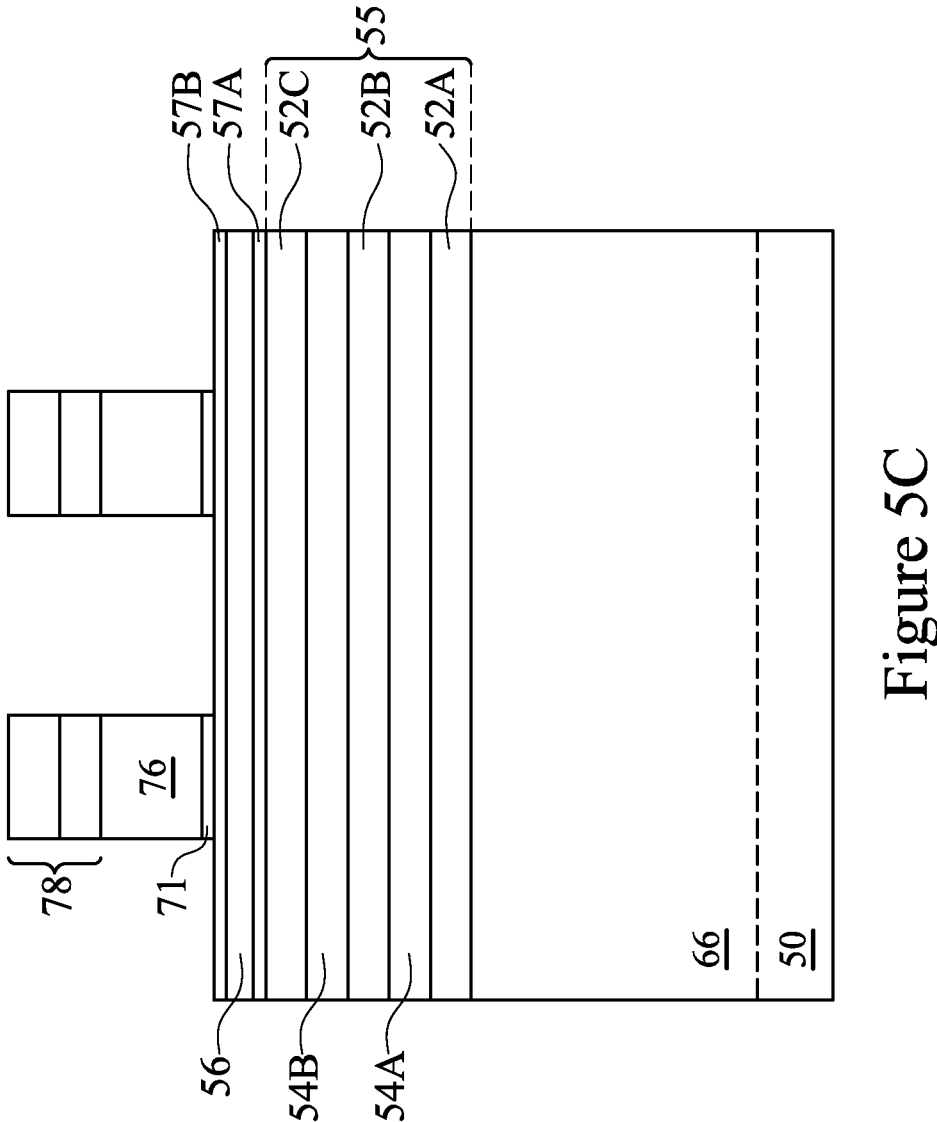

In FIGS. 5A, 5B, and 5C, dummy gate dielectrics 71, dummy gates 76, and masks 78 are formed on the fins 66, nanostructures 55, and/or the sacrificial structures 59, in accordance with some embodiments. FIG. 5A illustrates a perspective view including cross-sections A-A' and C-C', FIG. 5B illustrates a cross-sectional view along cross-section A-A', and FIG. 5C illustrates a cross-sectional view along cross-section B-B'. A dummy dielectric layer 71 is formed over the fins 66, nanostructures 55, and/or the sacrificial structures 59. The dummy gate dielectric layer 71 may be, for example, silicon oxide, silicon nitride, a combination thereof, or the like, and may be deposited or thermally grown according to acceptable techniques. In other embodiments, the dummy dielectric layer 71 does not cover the STI regions 68.

A dummy gate layer 76 is formed over the dummy gate dielectric layer 71, and mask layers 78 are formed over the dummy gate layer 76. The dummy gate layer 76 may be deposited over the dummy gate dielectric layer 71 and then planarized, such as by a CMP. The mask layers 78 may be deposited over the dummy gate layer 76. The dummy gate layer 76 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 76 may be deposited by physical vapor deposition (PVD), CVD, sputter deposition, or other techniques for depositing the selected material. The dummy gate layer 76 may be made of other materials that have a high etching selectivity from the etching of isolation regions. The mask layers 78 may include, for example, one or more layers of silicon oxide, silicon nitride, silicon oxynitride, or the like.

The mask layers 78 may be patterned using acceptable photolithography and etching techniques to form masks 78. The pattern of the masks 78 then may be transferred to the dummy gate layer 76 and to the dummy gate dielectric layer 71 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 6A:
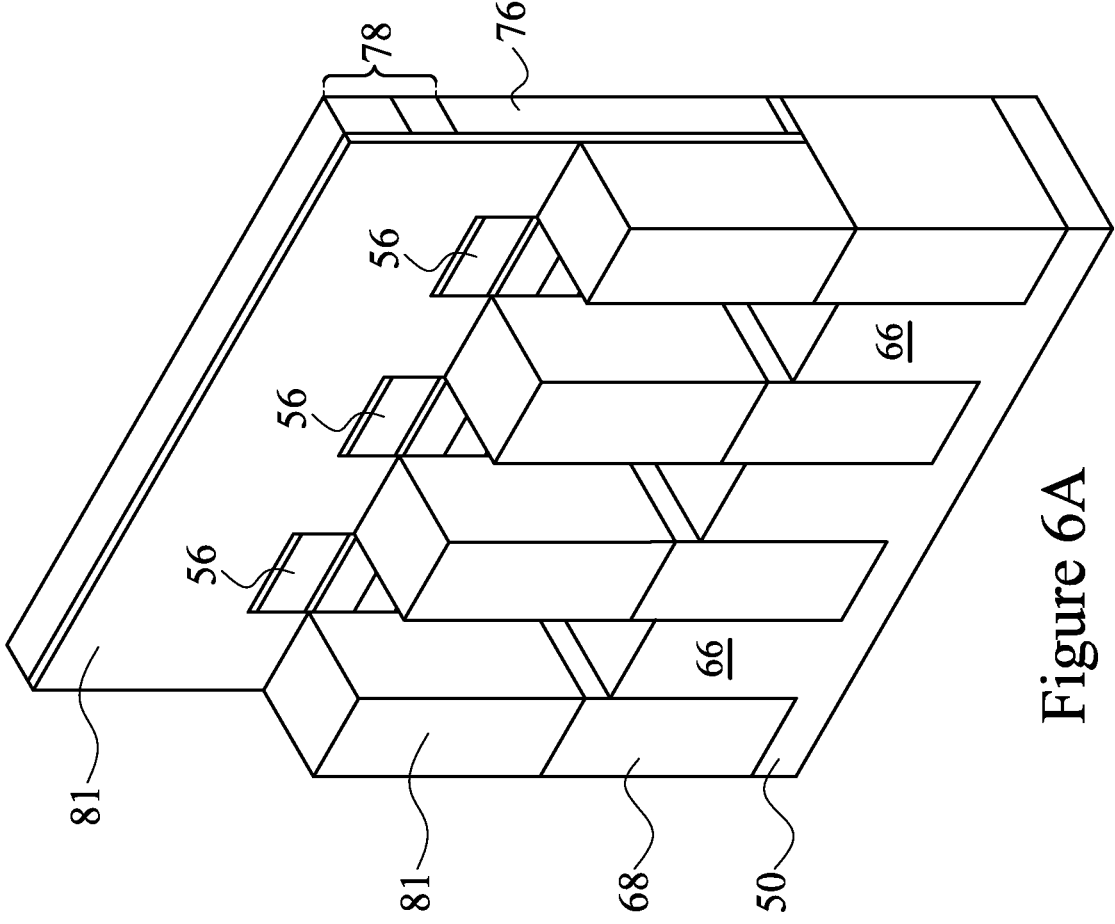
Figure 6B:
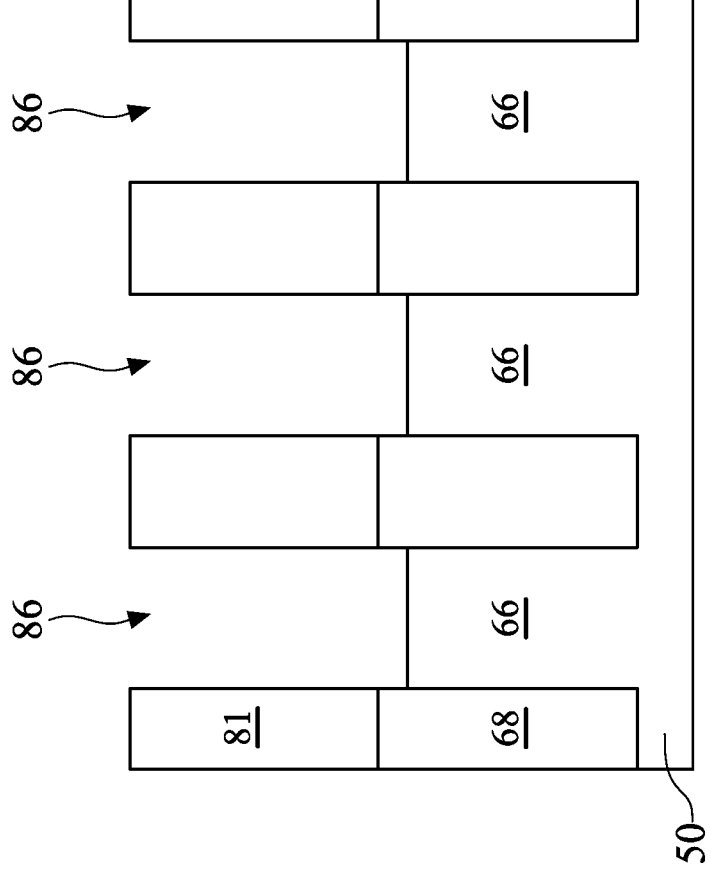
Figure 6C:
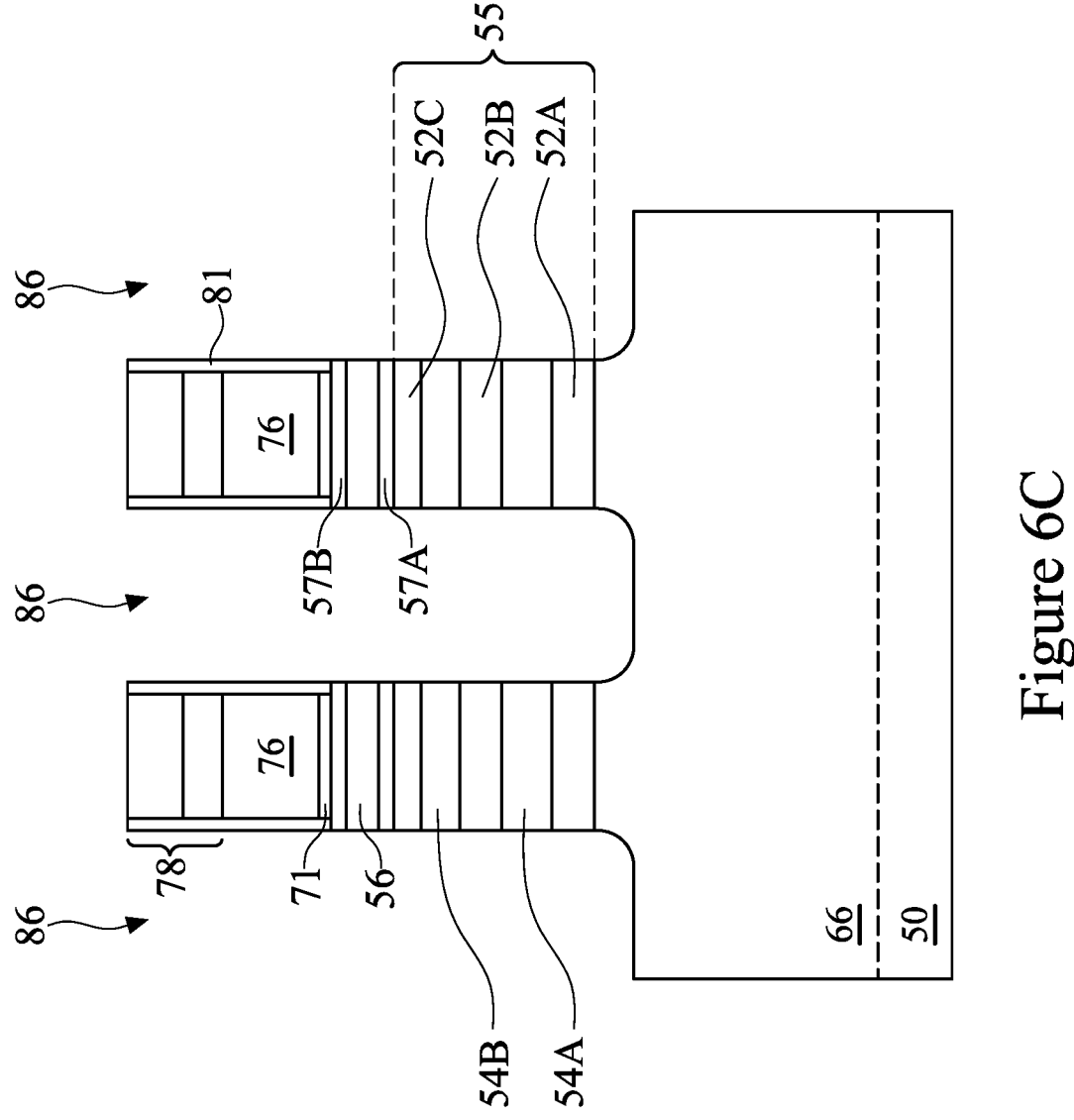

In FIGS. 6A, 6B, and 6C, a spacer layer 81 is formed and then first recesses 86 are formed, in accordance with some embodiments. FIG. 6A illustrates a perspective view including cross-sections A-A' and C-C', FIG. 6B illustrates a cross-sectional view along cross-section C-C', and FIG. 6C illustrates a cross-sectional view along cross-section B-B'. The spacer layer 81 may be formed, for example, by depositing one or more layers of insulating material and then etching the insulating material. The layer(s) of insulating material may be deposited on top surfaces of the STI regions 68; top surfaces and sidewalls of the fins 66, the nanostructures 55, the sacrificial structures 59, and the masks 78; and sidewalls of the dummy gates 76 and the dummy gate dielectrics 71. The layer(s) of insulating material may be include one or more layers of silicon oxide, silicon nitride, silicon oxynitride, silicon oxycarbide, silicon oxycarbonitride, a combination thereof, or the like. In some embodiments, the layer(s) may comprise another suitable material, such as a low-dielectric constant (low-k) material having a k-value less than about 3.5. The layer(s) of insulating material may be deposited using techniques such as thermal oxidation, CVD, ALD, the like, or using any other suitable techniques. In some embodiments, the spacer layer 81 is formed from layers of different materials having different etch rates. Other materials or combinations of materials are possible.

In some embodiments, implants for lightly doped source/drain (LDD) regions (not separately illustrated) may be performed after the deposition of the insulating layer(s) or between the deposition of two insulating layers of the spacer layer 81. In embodiments with different device types, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $10^{15}$ atoms/cm$^3$ to about $10^{19}$ atoms/cm$^3$. An anneal may be used to repair implant damage and to activate the implanted impurities.

The layer(s) of insulating material are then etched to form the spacer layer 81. As will be discussed in greater detail below, the spacer layer 81 acts to self-align subsequently-formed source/drain regions 92, as well as to protect sidewalls of the fins 66 and/or nanostructure 55 during subsequent processing. The layer(s) of insulating material may be etched using a suitable etching process, such as an isotropic etching process (e.g., a wet etching process), an anisotropic etching process (e.g., a dry etching process), a combination thereof, or the like. In some embodiments, the insulating material of a first layer has a different etch rate than the insulating material of a second underlying layer, such that the first layer may act as an etch stop layer when patterning the second layer and such that the second layer may act as a mask when patterning the first layer. As shown in FIGS. 6A-6C, the spacer layer 81 may extend over and along sidewalls of the fins 66, the nanostructures 55, and the sacrificial structures 59. As shown in FIGS. 6A and 6B, in some embodiments, portions of the spacer layer 81 between neighboring fins 66 form spacers, sometimes referred to herein as spacers 81 or fin sidewall spacers 81. In some embodiments, top surfaces of the spacers 81 have a height that is about the same as or greater than a height of the nanostructures 55.

It is noted that the above disclosure generally describes a process of forming spacers and LDD regions. Other processes and sequences may be used. For example, fewer or additional spacers may be utilized, different sequence of steps may be utilized, additional insulating layers may be formed and removed, air gaps may be formed, and/or the like. Furthermore, n-type and p-type devices may be formed using different structures and steps.

Further, in FIGS. 6A-6C, first recesses 86 are formed in the fins 66, the nanostructures 55, the sacrificial structures 59, and the substrate 50, in accordance with some embodiments. Epitaxial source/drain regions 92 will be subsequently formed in the first recesses 86. The first recesses 86 may extend through the sacrificial structures 59 and the nanostructures 55 and into the substrate 50. In some embodiments, the fins 66 may be etched such that bottom surfaces of the first recesses 86 are below top surfaces of the STI regions 68. In other embodiments, top surfaces of the STI regions 58 may be about level with or lower than bottom surfaces of the first recesses 86.

The first recesses 86 may be formed by etching the fins 66, the nanostructures 55, the sacrificial structures 59, and the substrate 50 using anisotropic etching processes, such as RIE, NBE, or the like. In some embodiments, the spacer layer 81 (including the spacers 81) and the masks 78 mask portions of the fins 66, the nanostructures 55, the sacrificial structures 59, and the substrate 50 during the etching processes used to form the first recesses 86. A single etch process or multiple etch processes may be used to etch each layer of the nanostructures 55, the sacrificial structures 59, and/or the fins 66. Timed etch processes may be used to stop the etching of the first recesses 86 after the first recesses 86 reach a desired depth, in some embodiments.

Figure 7A:
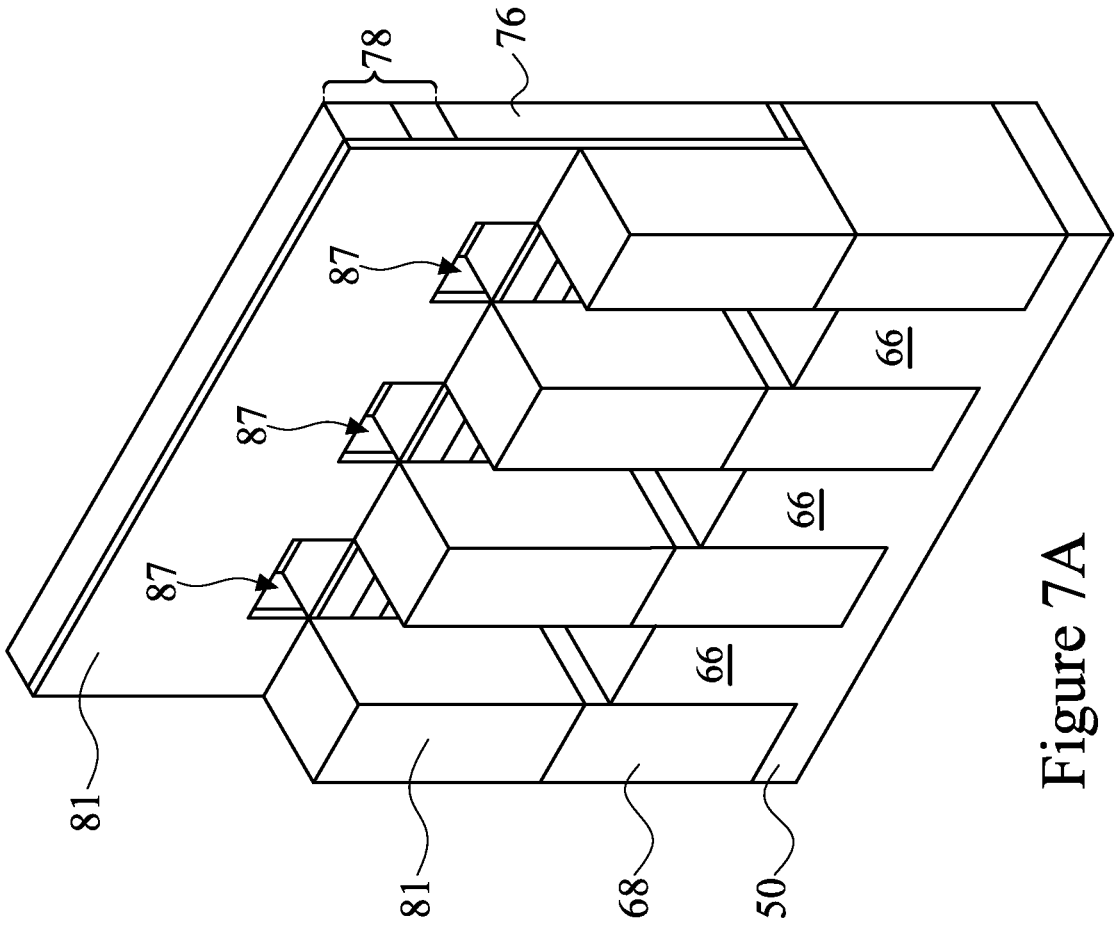
Figure 7B:
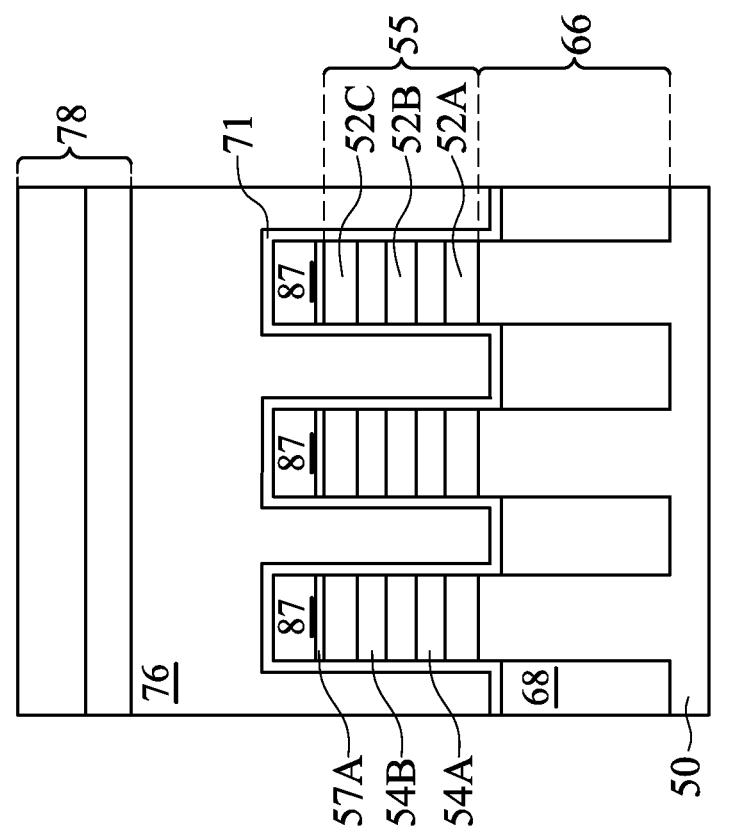
Figure 7C:
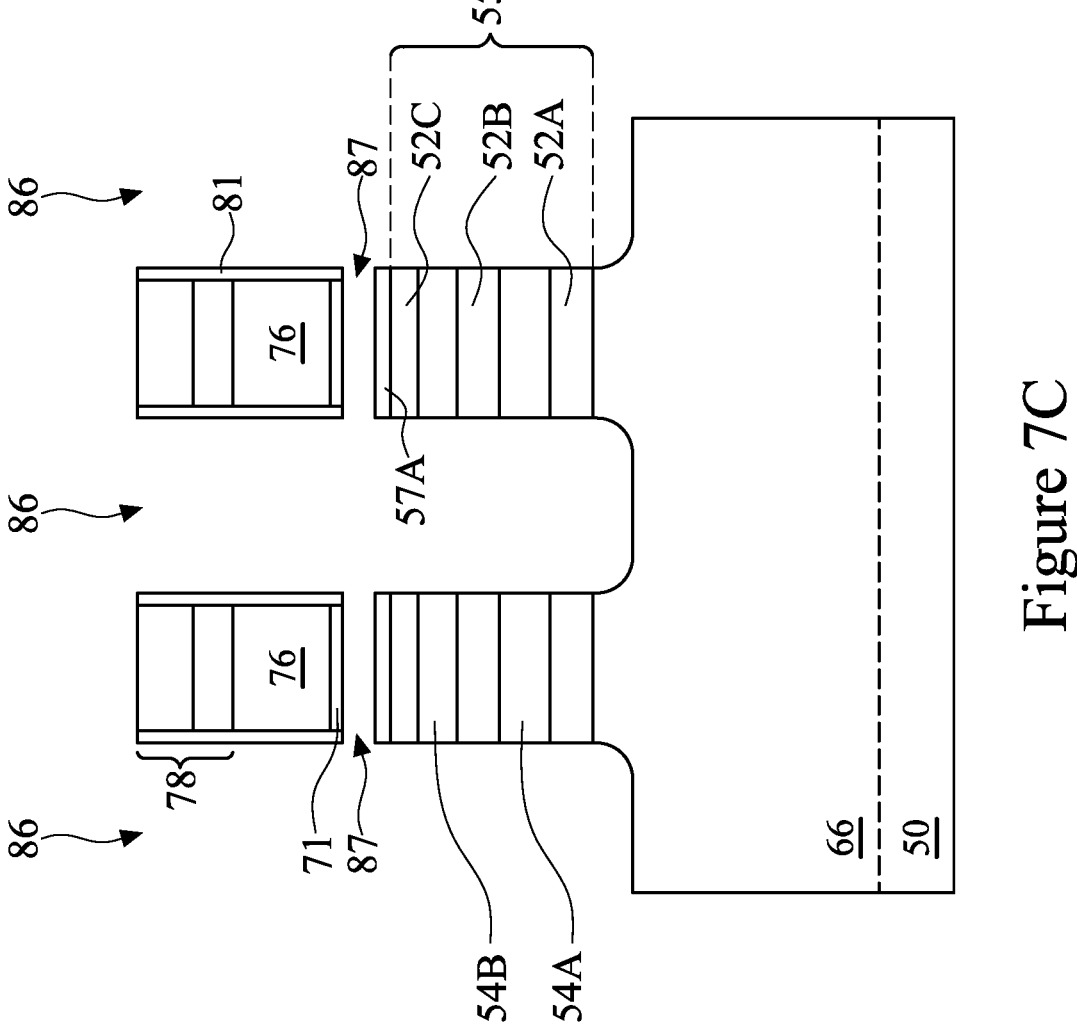

In FIGS. 7A, 7B, and 7C, the fourth semiconductor layer 56 is selectively removed to form second recesses 87, in accordance with some embodiments. FIG. 7A illustrates a perspective view including cross-sections A-A' and C-C', FIG. 7B illustrates a cross-sectional view along cross-section A-A', and FIG. 7C illustrates a cross-sectional view along cross-section B-B'. The second recesses 87 are openings above the nanostructures 55 that may extend fully across the nanostructures 55. As shown in FIGS. 7A-7C, the second recesses 87 may be covered by portions of the spacer layer 81, the dummy gates 76, and/or the masks 78. In some embodiments, the fourth semiconductor layer 56 is removed using a selective etching process that etches the third semiconductor material of the fourth semiconductor layer 56 without significantly etching the first semiconductor material and the second semiconductor material of the nanostructures 55. For example, in some embodiments, the selective etching process may include tetramethylammonium hydroxide (TMAH), ammonium hydroxide (NH$_4$OH), HCl, F$_2$, NH$_3$, or the like. Other etching processes are possible. In some embodiments, the selective etching process may also remove some or all of the third semiconductor layer 57A and/or the fifth semiconductor layer 57B. For example, in the embodiment shown in FIGS. 7A-7C, the fifth semiconductor layer 57B is removed by the selective etching process, and the third semiconductor layer 57A remains after the selective etching process.

Figure 8A:
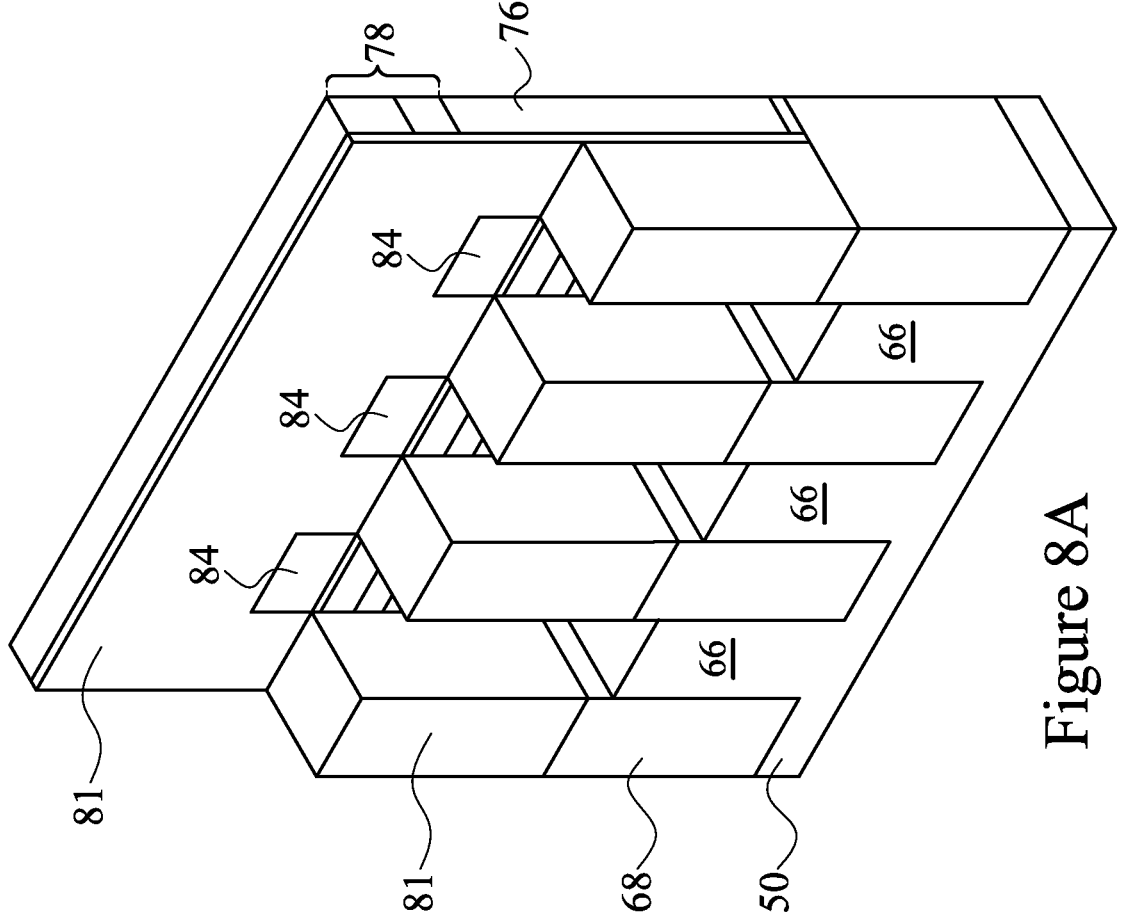
Figure 8B:
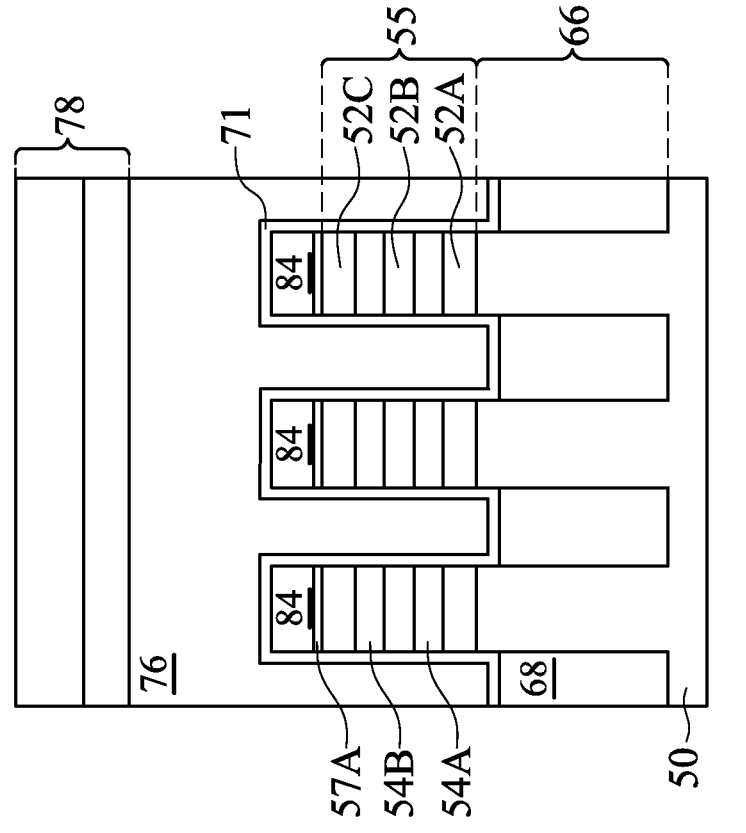
Figure 8C:
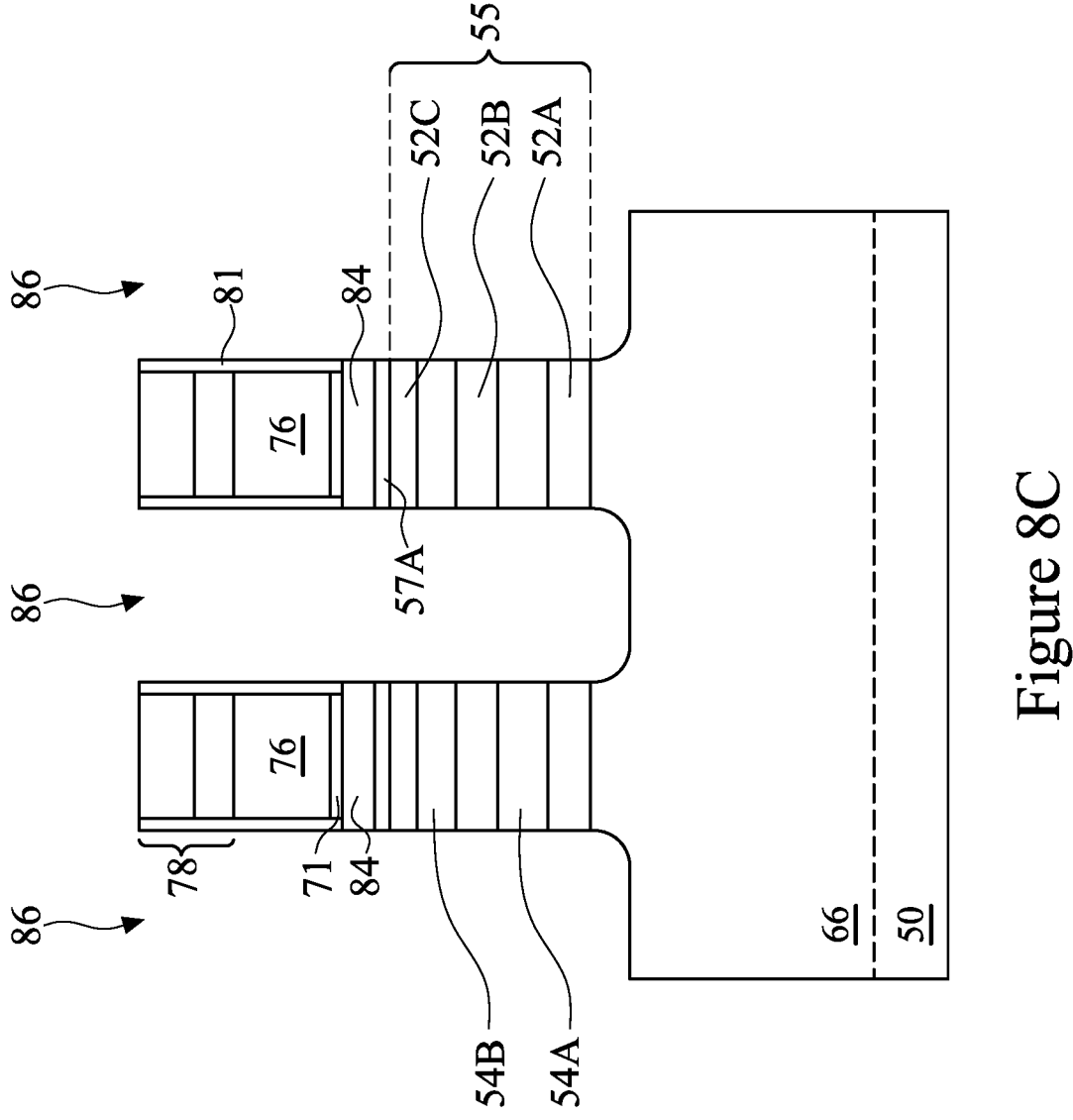

In FIGS. 8A, 8B, and 8C, a hard mask material is deposited in the second recesses 87 to form hard masks 84, in accordance with some embodiments. FIG. 8A illustrates a perspective view including cross-sections A-A' and C-C', FIG. 8B illustrates a cross-sectional view along cross-section A-A', and FIG. 8C illustrates a cross-sectional view along cross-section B-B'. The hard masks 84 may be formed, for example, by depositing the hard mask material over the structure and then etching the hard mask material such that only portions within the second recesses 87 remain. The hard mask material may include any acceptable dielectric material(s), such as silicon oxide, silicon nitride, silicon oxynitride, silicon carbonitride, silicon oxycarbide, silicon oxycarbonitride, combinations thereof, or the like. Acceptable deposition processes include ALD, CVD, PVD, or the like. Other materials or deposition processes are possible.

After depositing the hard mask material, exposed regions of the hard mask material (e.g., regions outside of the second recesses 87) may be removed using one or more etching processes. The etching processes may be isotropic or anisotropic. For example, in some embodiments, the excess hard mask material may be etched using an anisotropic etching process such as RIE, NBE, or the like. Other etching processes are possible. After removing the excess hard mask material, the sidewalls of the hard masks 84 may be substantially straight, convex, or concave. The sidewalls of the hard masks 84 may be approximately coplanar with the sidewalls of the nanostructures 55 and/or the spacer layer 81. In other embodiments, the sidewalls of the hard masks 84 may be offset from (e.g., extend beyond or be recessed from) adjacent sidewall surfaces. In some embodiments, the hard masks 84 have a thickness in the range of about 4 nm to about 8 nm, though other thicknesses are possible. Bottom surfaces of the hard masks 84 may be higher than, lower than, or about level with top surfaces of the spacers 81. In some cases, the formation of hard masks 84 as described herein can allow for the subsequent formation of gate electrodes having a smaller height, which can reduce parasitic capacitance within a nano-FET, described in greater detail below.

Figure 9A:
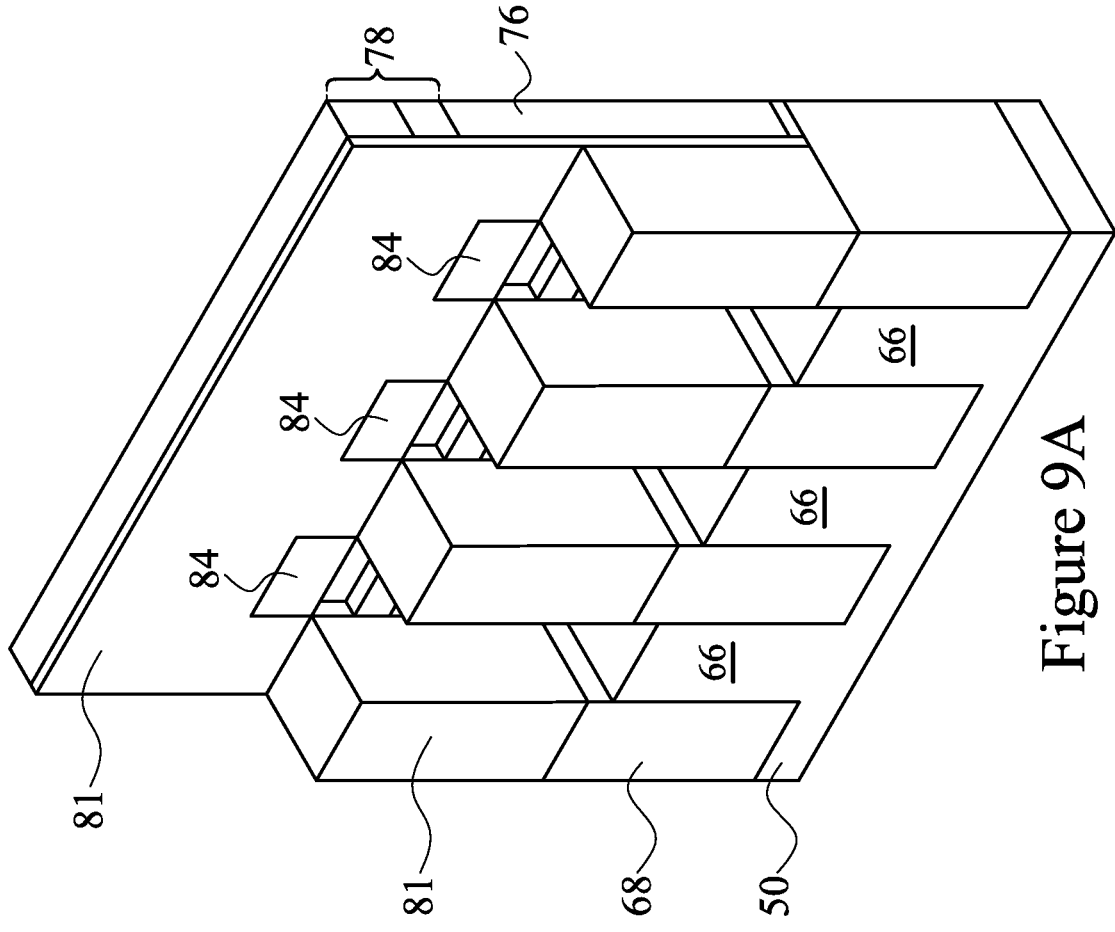
Figure 9B:
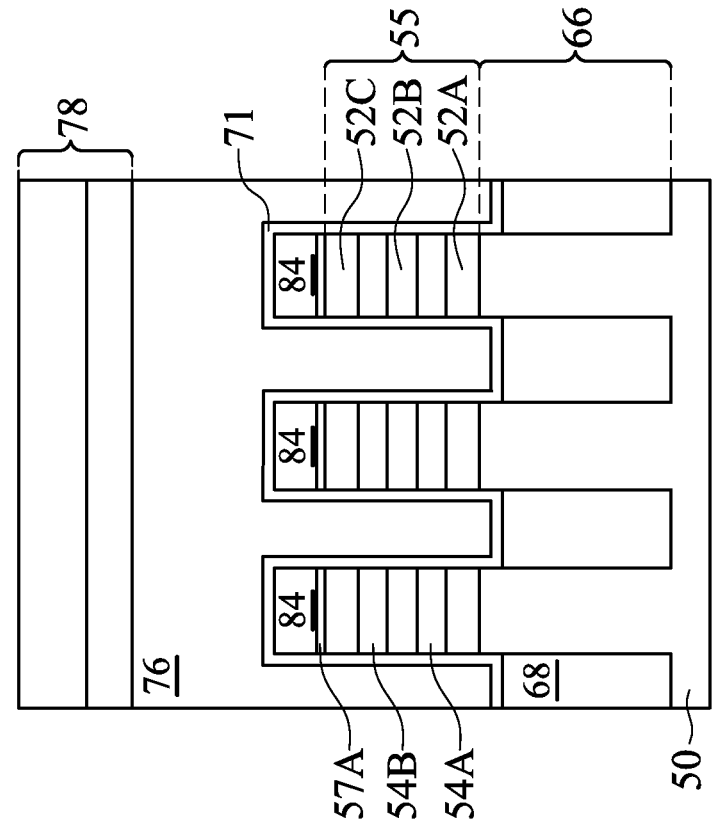
Figure 9C:
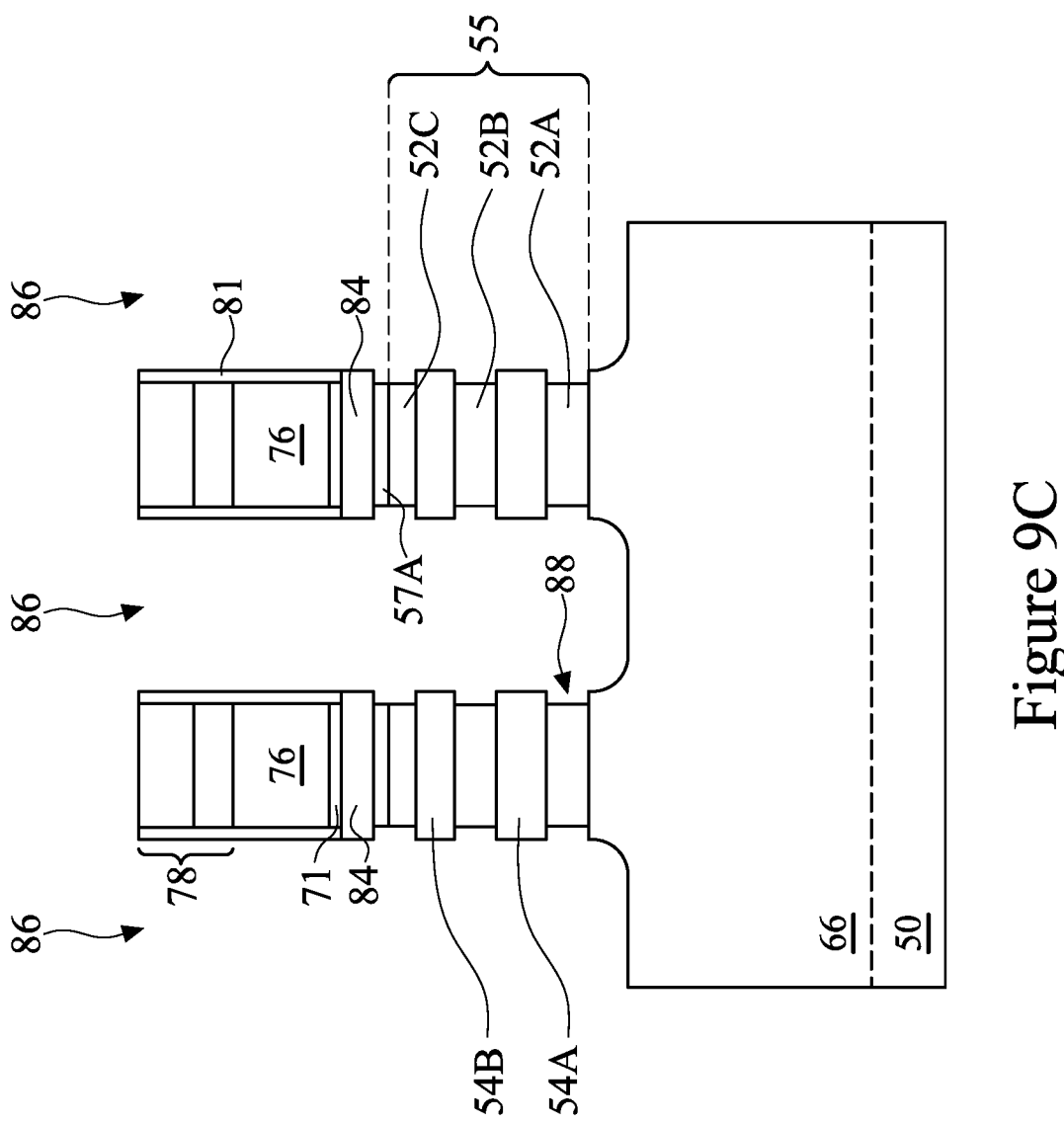

In FIGS. 9A, 9B, and 9C, portions of sidewalls of the layers of the multi-layer stack 64 formed of the first semiconductor material (e.g., the first nanostructures 52) exposed by the first recesses 86 are etched to form sidewall recesses 88, in accordance with some embodiments. FIG. 9A illustrates a perspective view including cross-sections A-A' and C-C', FIG. 9B illustrates a cross-sectional view along cross-section A-A', and FIG. 9C illustrates a cross-sectional view along cross-section B-B'. Although sidewalls of the first nanostructures 52 and the second nanostructures 54 in sidewall recesses 88 are illustrated as being straight in FIGS. 9A and 9C, the sidewalls may be concave or convex. The sidewalls may be etched using isotropic etching processes, such as a wet etching process or the like. Etchants selective to the first semiconductor material may be used to etch the first nanostructures 52 such that the second nanostructures 54 and the substrate 50 remain relatively unetched as compared to the first nanostructures 52. In an embodiment in which the first nanostructures 52 include, e.g., silicon-germanium, and the second nanostructures 54 include, e.g., silicon or silicon carbide, an etching process including tetramethylammonium hydroxide (TMAH), ammonium hydroxide (NH₄OH), or the like may be used to etch sidewalls of the first nanostructures 52. In some embodiments, the etching process used to recess the sidewalls can also trim (e.g., reduce the thicknesses of) the etched portions of the second nanostructures 54.

Figure 10A:
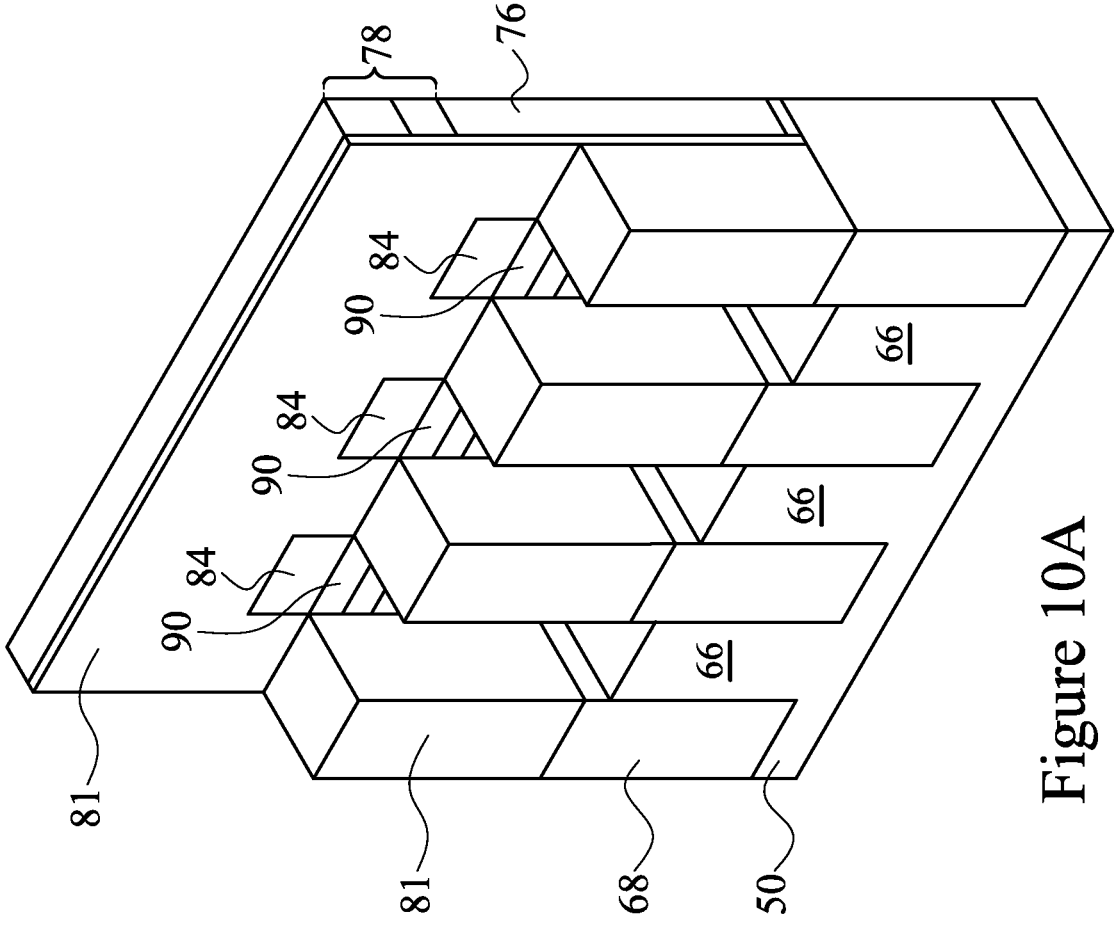
Figure 10B:
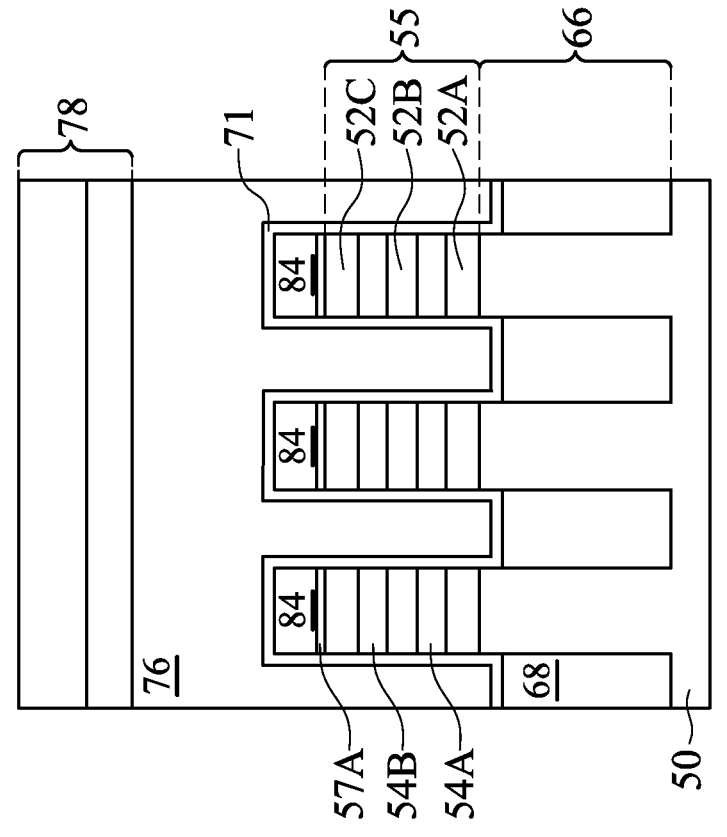
Figure 10C:
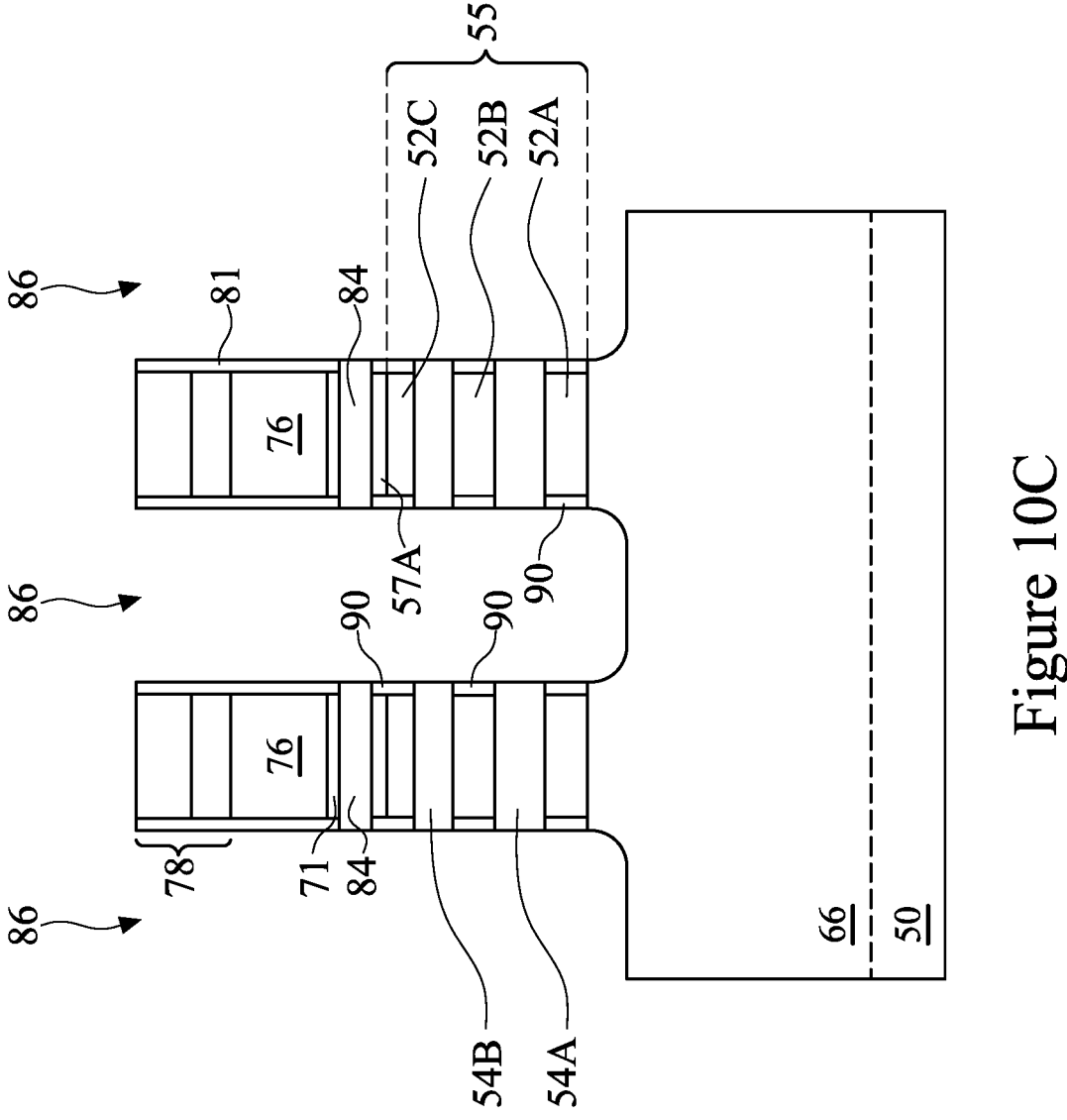

In FIGS. 10A, 10B, and 10C, inner spacers 90 are formed in the sidewall recesses 88, in accordance with some embodiments. FIG. 10A illustrates a perspective view including cross-sections A-A' and C-C', FIG. 10B illustrates a cross-sectional view along cross-section A-A', and FIG. 10C illustrates a cross-sectional view along cross-section B-B'. The inner spacers 90 may be formed by depositing an inner spacer layer (not separately illustrated) over the structures illustrated in FIGS. 9A-9C. The inner spacers 90 act as isolation features between subsequently formed source/drain regions and a gate structure. As will be discussed in greater detail below, source/drain regions will be formed in the recesses 86, while the first nanostructures 52 will be replaced with gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 90. Although outer sidewalls of the inner spacers 90 are illustrated as being coplanar with sidewalls of the second nanostructures 54, the outer sidewalls of the inner spacers 90 may extend beyond or be recessed from sidewalls of the second nanostructures 54 in other embodiments. Moreover, although the outer sidewalls of the inner spacers 90 are illustrated as being straight in FIGS. 10A and 10C, the outer sidewalls of the inner spacers 90 may be concave or convex. The inner spacer layer may be etched using an anisotropic etching process, such as RIE, NBE, or the like. The inner spacers 90 may be used to prevent damage to subsequently formed source/drain regions (such as the epitaxial source/drain regions 92, discussed below with respect to FIGS. 11A-11C) by subsequent etching processes, such as etching processes used to form gate structures.

Figure 11A:
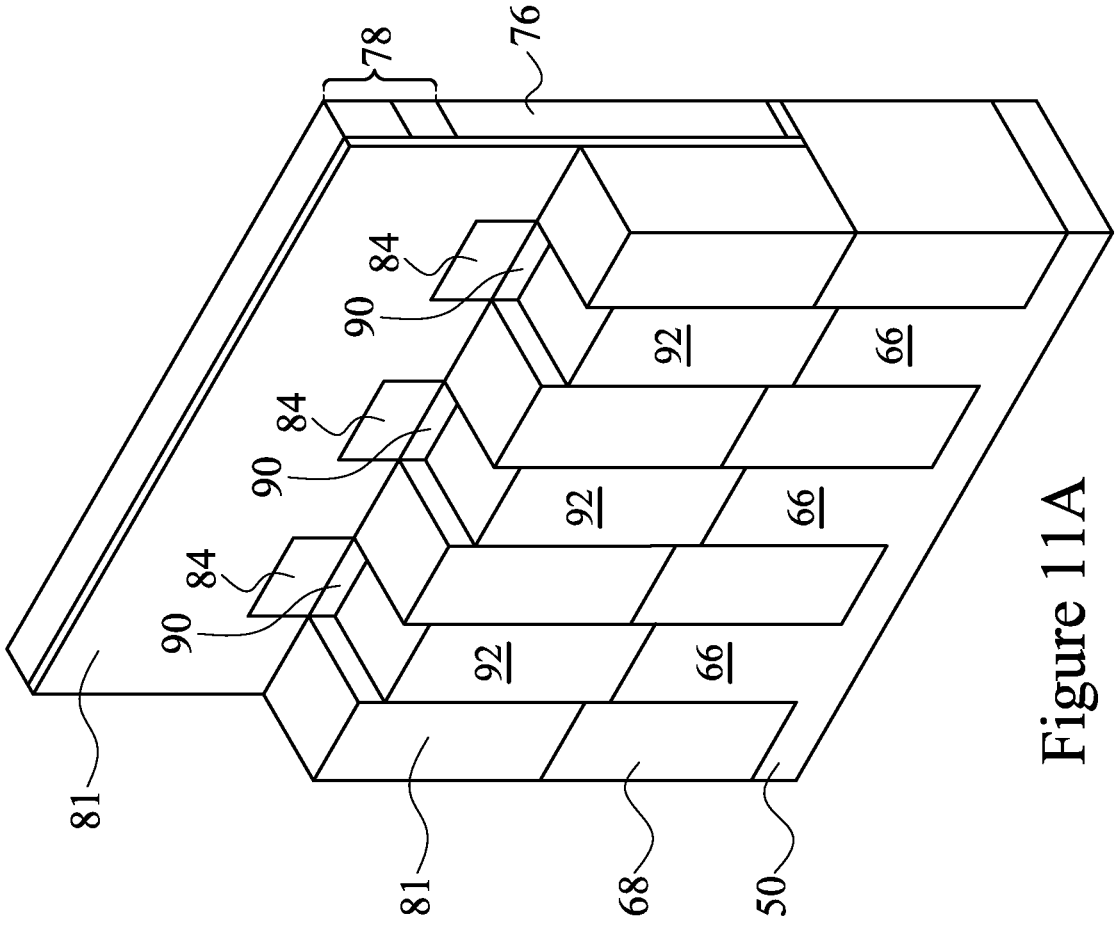
Figure 11B:
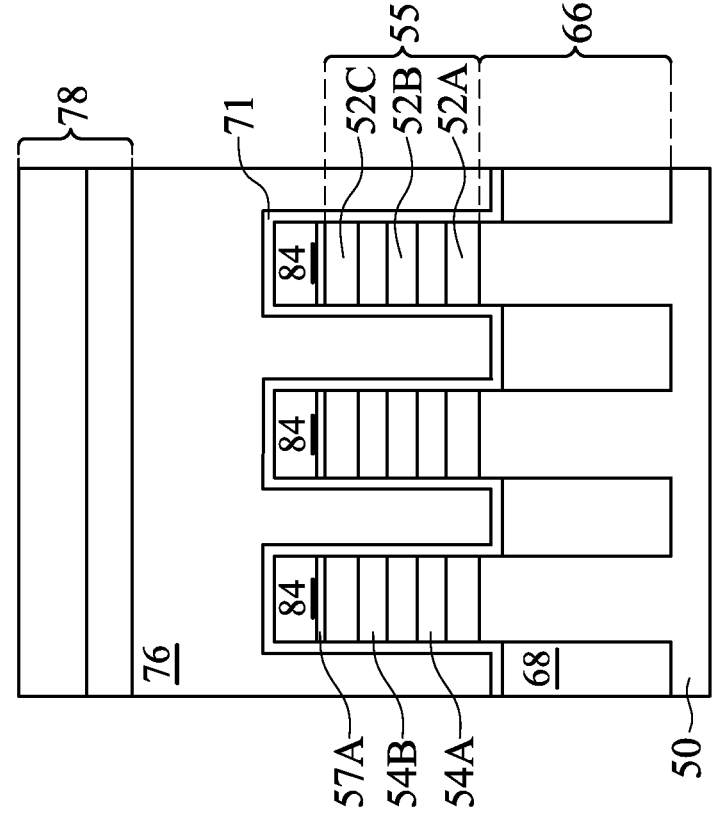
Figure 11C:
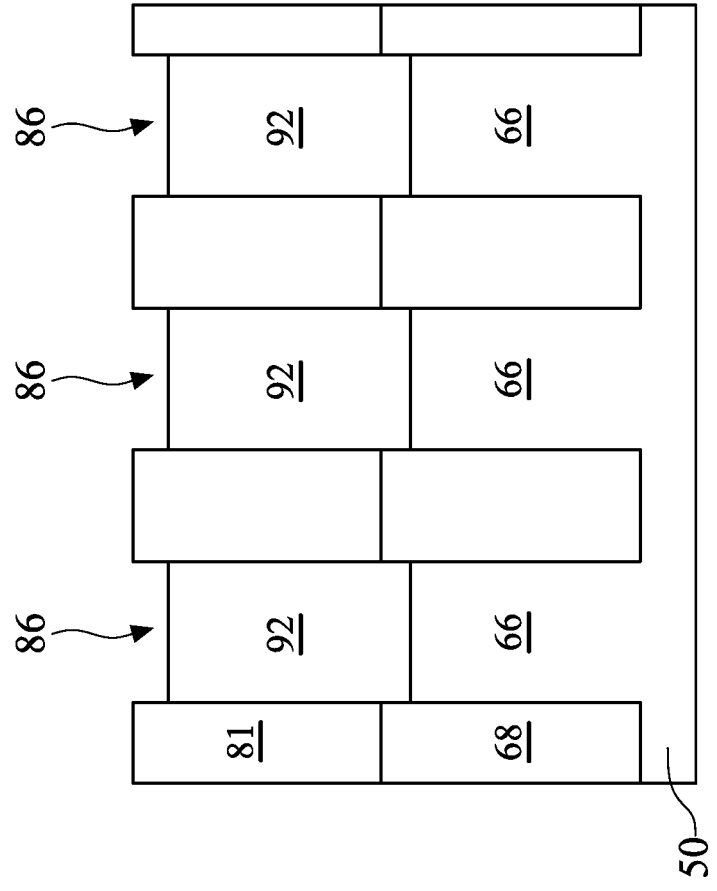
Figure 11D:
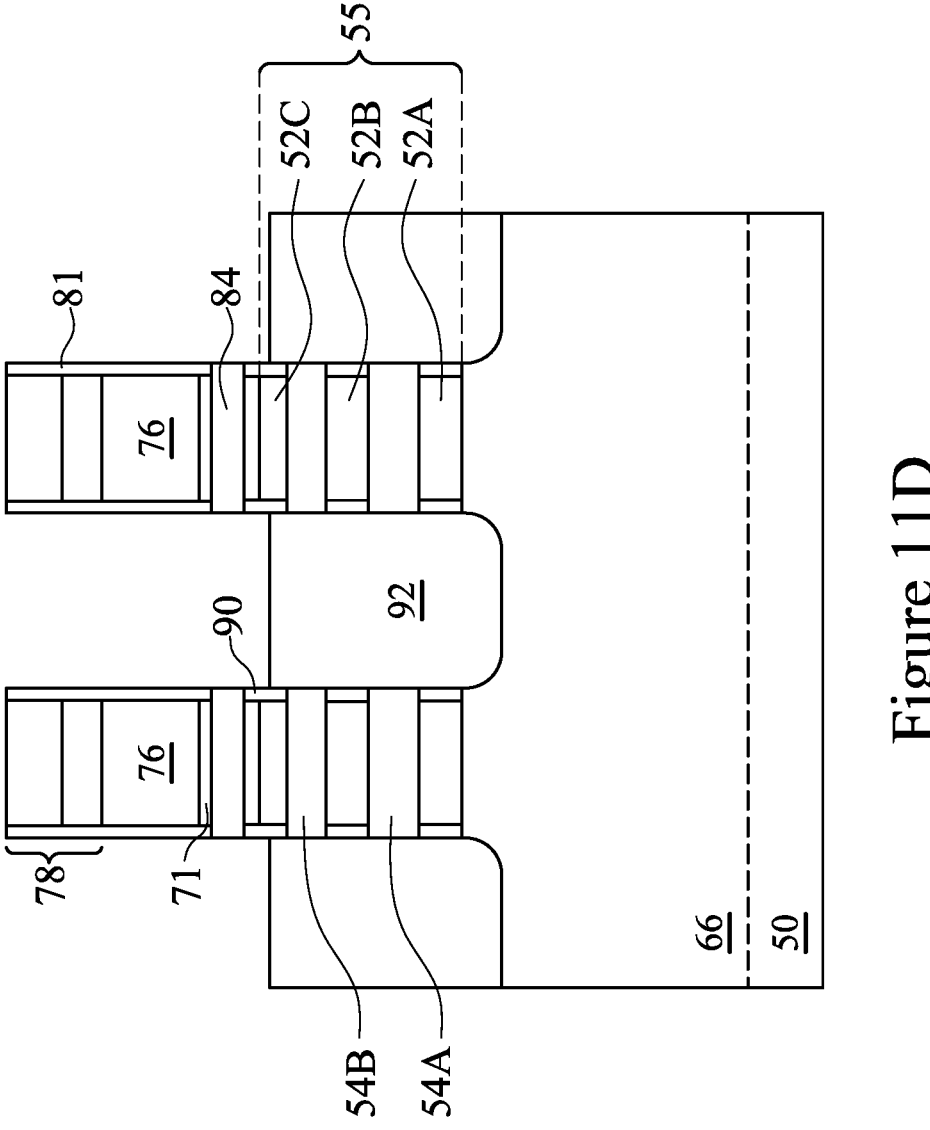

In FIGS. 11A, 11B, 11C, and 11D, epitaxial source/drain regions 92 are formed in the first recesses 86, in accordance with some embodiments. FIG. 11A illustrates a perspective view including cross-sections A-A' and C-C', FIG. 11B illustrates a cross-sectional view along cross-section A-A', FIG. 11C illustrates a cross-sectional view along cross-section C-C', and FIG. 11D illustrates a cross-sectional view along cross-section B-B'. In some embodiments, the source/drain regions 92 may exert stress on the second nanostructures 54 in the n-type region 50N and on the first nanostructures 52 in the p-type region 50P, thereby improving performance. As illustrated in FIG. 11D, the epitaxial source/drain regions 92 are formed in the first recesses 86 such that each dummy gate 76 is disposed between respective neighboring pairs of the epitaxial source/drain regions 92. The inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

As illustrated in FIG. 11C, the spacers 81 are used to separate neighboring epitaxial source/drain regions 92. In some embodiments, the spacers 81 have a height greater than a height of the epitaxial source/drain regions 92. In this manner, the spacers 81 block epitaxial growth of the epitaxial source/drain regions 92 such that the epitaxial source/ drain regions 92 do not extend laterally beyond the spacers 81. In some embodiments, top surfaces of the epitaxial source/drain regions 92 are about level with or lower than top surfaces of the hard masks 84. For example, top surfaces of the epitaxial source/drain regions 92 may be closer to the substrate 50 than bottom surfaces of the hard masks 84, as shown in FIGS. 11A and 11D. In some cases, the epitaxial source/drain regions 92 may physically contact inner spacers 90 but do not physically contact the hard masks 84. In some embodiments, the epitaxial source/drain regions 92 have a height in the range of about 30 nm to about 80 nm, though other heights are possible.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may comprise one or more semiconductor material layers. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, arsenic doped silicon, or the like. Other materials are possible. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may comprise one or more semiconductor material layers. The epitaxial source/drain regions 92 may include any acceptable material appropriate for p-type nano-FETs, such as silicon-germanium, boron doped silicon-germanium, germanium, boron doped silicon-germanium carbide, germanium tin, boron doped silicon, or the like. Other materials are possible. The epitaxial source/drain regions 92 may also have surfaces raised from respective surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $10^{19}$ atoms/cm$^3$ and about $10^{21}$ atoms/cm$^3$. The n-type and/or p-type impurities for source/drain regions may be any of the impurities previously discussed or other impurities. In some embodiments, the epitaxial source/drain regions 92 may be in situ doped during growth.

Figure 12A:
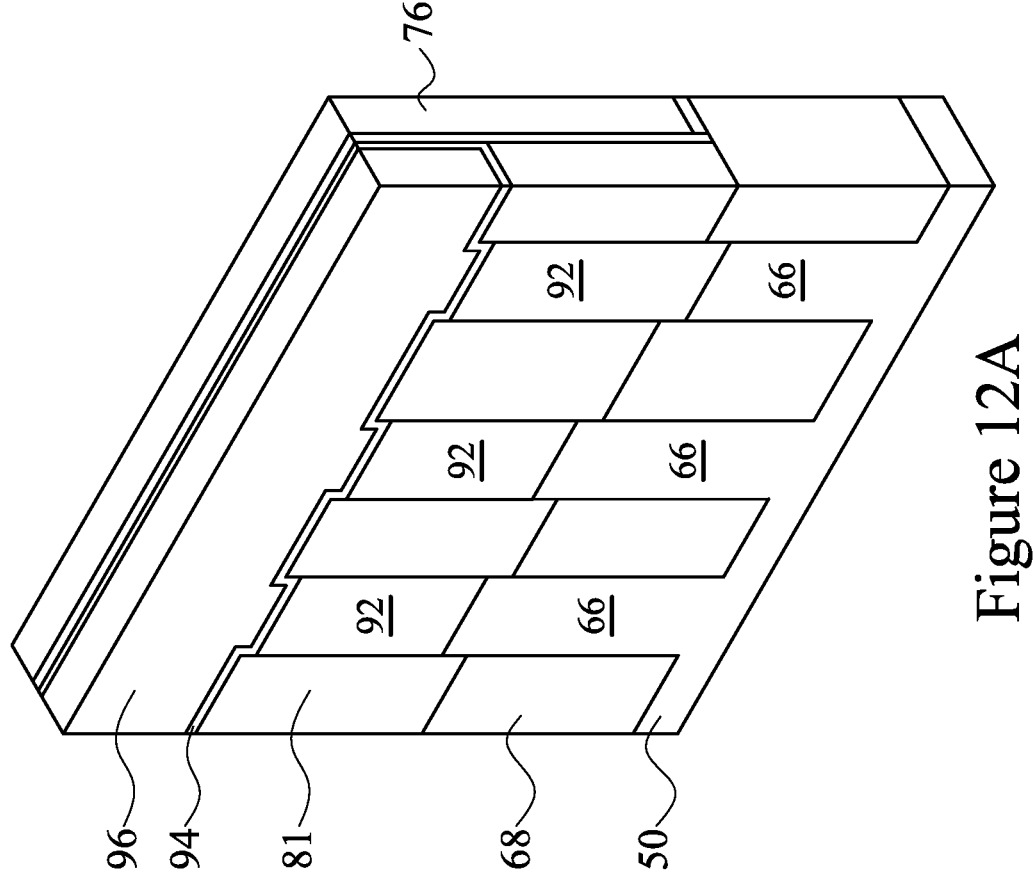
Figure 12B:
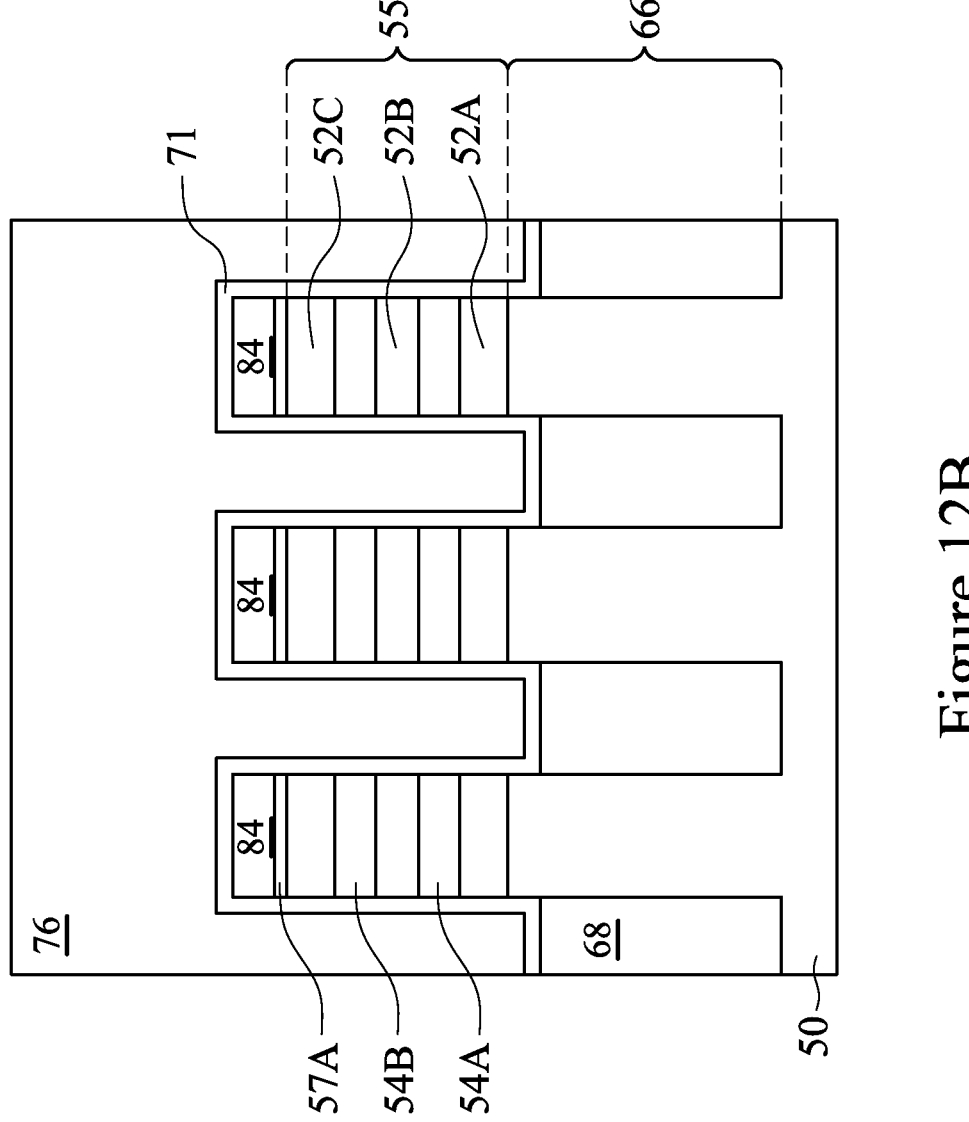
Figure 12C:
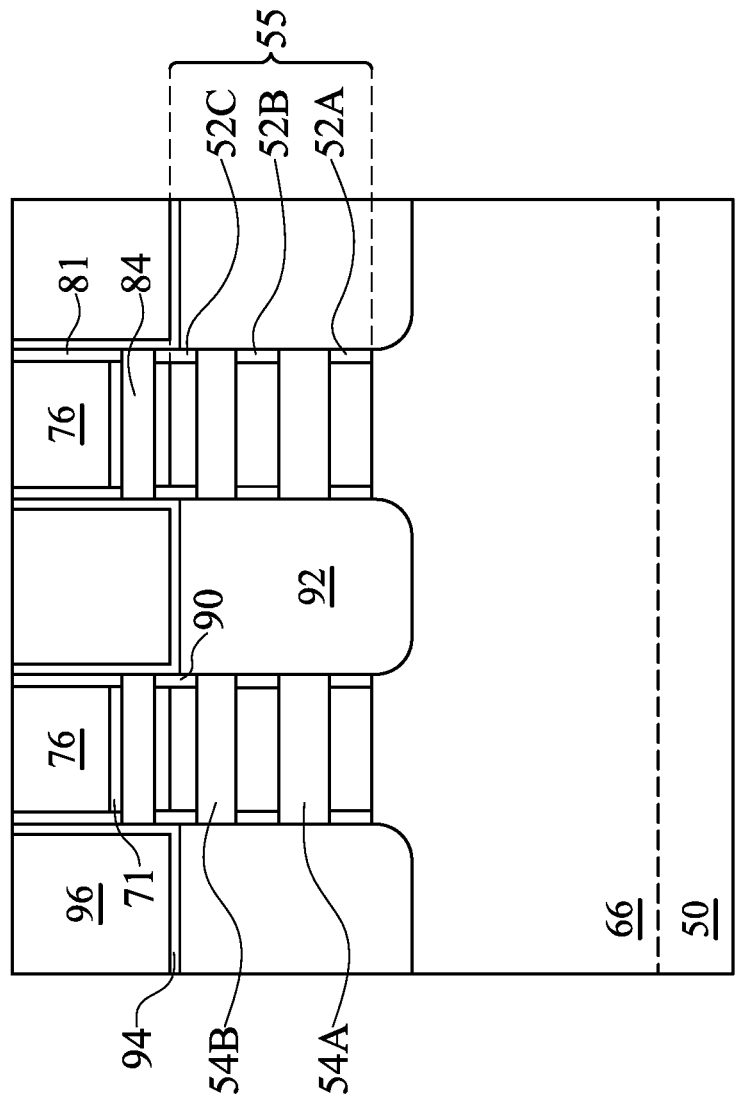

In FIGS. 12A, 12B, and 12C, a first interlayer dielectric (ILD) 96 is deposited over the structure, in accordance with some embodiments. FIG. 12A illustrates a perspective view including cross-sections A-A' and C-C', FIG. 12B illustrates a cross-sectional view along cross-section A-A', and FIG. 12C illustrates a cross-sectional view along cross-section B-B'. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the spacer layer 81. The CESL 94 may comprise a dielectric material, such as, silicon nitride, silicon oxide, silicon oxynitride, or the like, having a different etch rate than the material of the overlying first ILD 96.

Further in FIGS. 12A-12C, a planarization process, such as a CMP process, may be performed to level the top surface of the first ILD 96 with the top surfaces of the dummy gates 76 or the masks 78. The planarization process may also remove the masks 78 on the dummy gates 76, and portions of the spacer layer 81 along sidewalls of the masks 78. After the planarization process, top surfaces of the dummy gates 76, the spacer layer 81, and the first ILD 96 may be level within process variations. Accordingly, the top surfaces of the dummy gates 76 are exposed through the first ILD 96. In other embodiments, the masks 78 may remain, in which case the planarization process levels the top surface of the first ILD 96 with top surface of the masks 78 and the spacer layer 81.

Figure 13A:
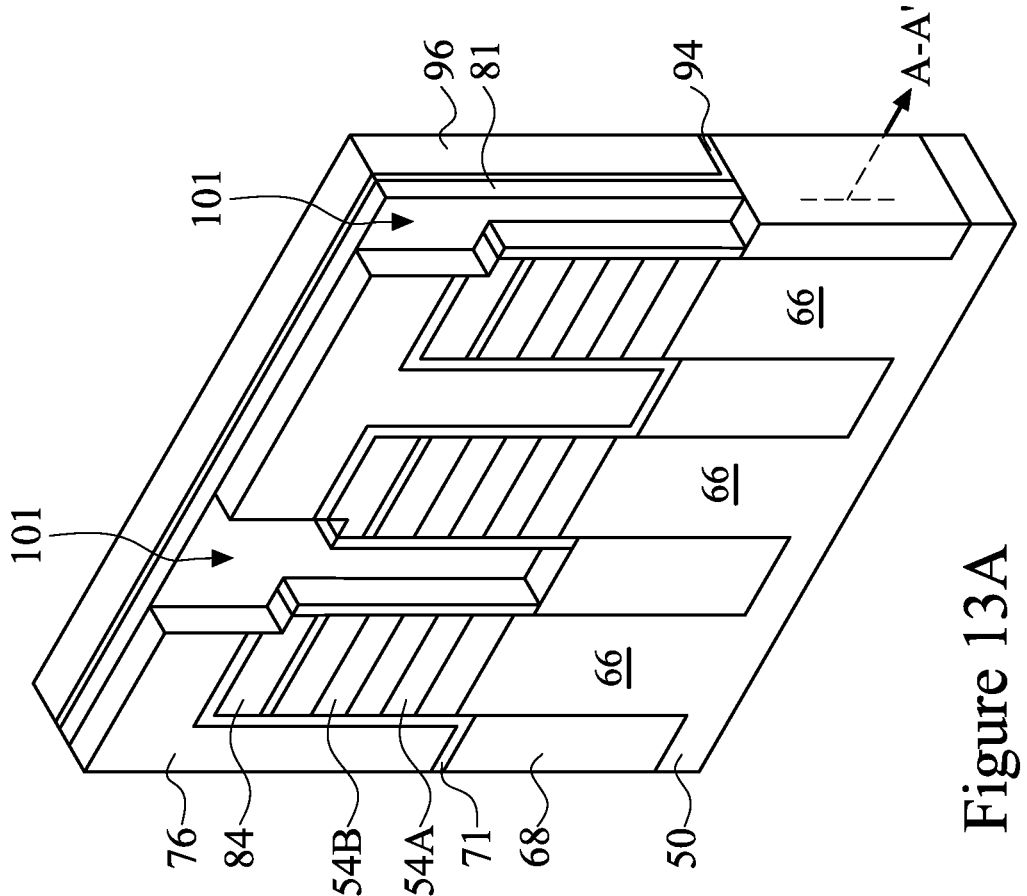
Figure 13B:
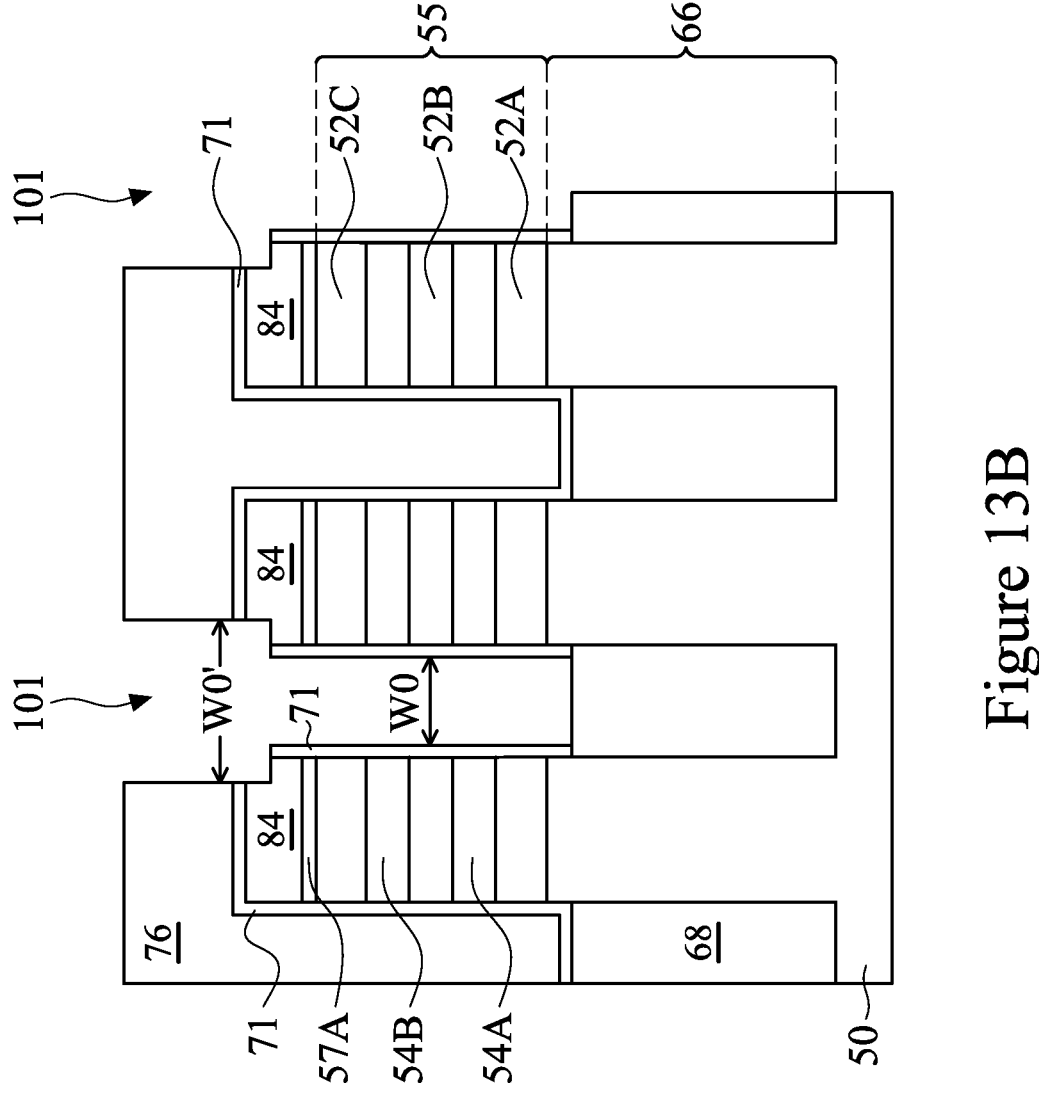

In FIGS. 13A and 13B, second recesses 101 are formed in the dummy gates 76, in accordance with some embodiments. FIG. 13A illustrates a perspective view including cross-section A-A', and FIG. 13B illustrates a cross-sectional view along cross-section A-A'. A corresponding cross-section A-A' is indicated in the perspective view of FIG. 13A, and applies similarly to perspective views shown in FIGS. 14A through 26A. The second recesses 101 extend between some neighboring nanostructures 55. In some embodiments, the second recesses 101 may have a width W0 between nanostructures 55 that is in the range of about 10 nm to about 30 nm, though other widths are possible. First isolation walls 104 (see FIGS. 14A-14B) are subsequently formed in the second recesses 101.

The second recesses 101 may be formed by forming a photoresist or other mask structure and patterning the photoresist using acceptable photolithography techniques. The second recesses 101 may be formed by then using the patterned photoresist as an etch mask while etching the dummy gates 76, the hard masks 84, and the dummy gate dielectrics 71. A single etch process or multiple etch processes may be used to etch the various materials or layers when forming the second recesses 101. The etching process may remove portions of the dummy gates 76, the hard masks 84, and the dummy gate dielectrics 71 over and between nanostructures 55. For example, the etching process may remove portions of the dummy gates 76 that are between some neighboring nanostructures 55. In some embodiments, the etching process may include an anisotropic dry etch process. For example, the etch process may include a dry etch process using reaction gas(es) that selectively etch the dummy gates 76 at a faster rate than the first ILD 96 or the spacer layer 81. After forming the second recesses 101, the photoresist may be removed using suitable techniques.

In some embodiments, the hard masks 84 may be used as etch stop layers during formation of the second recesses 101. For example, the etching process may selectively etch the dummy gates 76 at a faster rate than the hard masks 84. Thus, the etching process may partially etch the hard masks 84, such as shown in FIGS. 13A-13B, though in other embodiments the hard masks 84 may remain substantially unetched. In this manner, the presence of the hard masks 84 allows the second recesses 101 to be self-aligned between neighboring nanostructures 55. In some embodiments, due to the presence of the hard masks 84, the second recesses 101 may have a width W0' above the nanostructures 55 that is greater than the width W0 between the nanostructures 55. For example, the second recesses 101 may have a width W0' in the range of about 25 nm to about 100 nm, though other widths are possible. Forming second recesses 101 using a self-aligned process as described herein allows nano-FETs to be formed having a smaller pitch without increased risk of shorting or processing defects. Thus, device density may be increased, which can reduce device size or manufacturing cost. Forming self-aligned second recesses 101 also reduces process sensitivity and can improve yield.

In some embodiments, the dummy gate dielectrics 71 may be used as etch stop layers when the dummy gates 76 are etched. After formation of the second recesses 101, portions of the dummy gate dielectrics 71 may remain on sidewalls of the second recesses 101, as shown in FIGS. 13A-13B. Remaining portions of the dummy gate dielectrics 71 within the second recesses 101 may be removed using a separate etch, in some embodiments. In other embodiments, the etching process that forms the second recesses 101 may also remove the dummy gate dielectrics 71 within the second recesses 101.

Figure 14A:
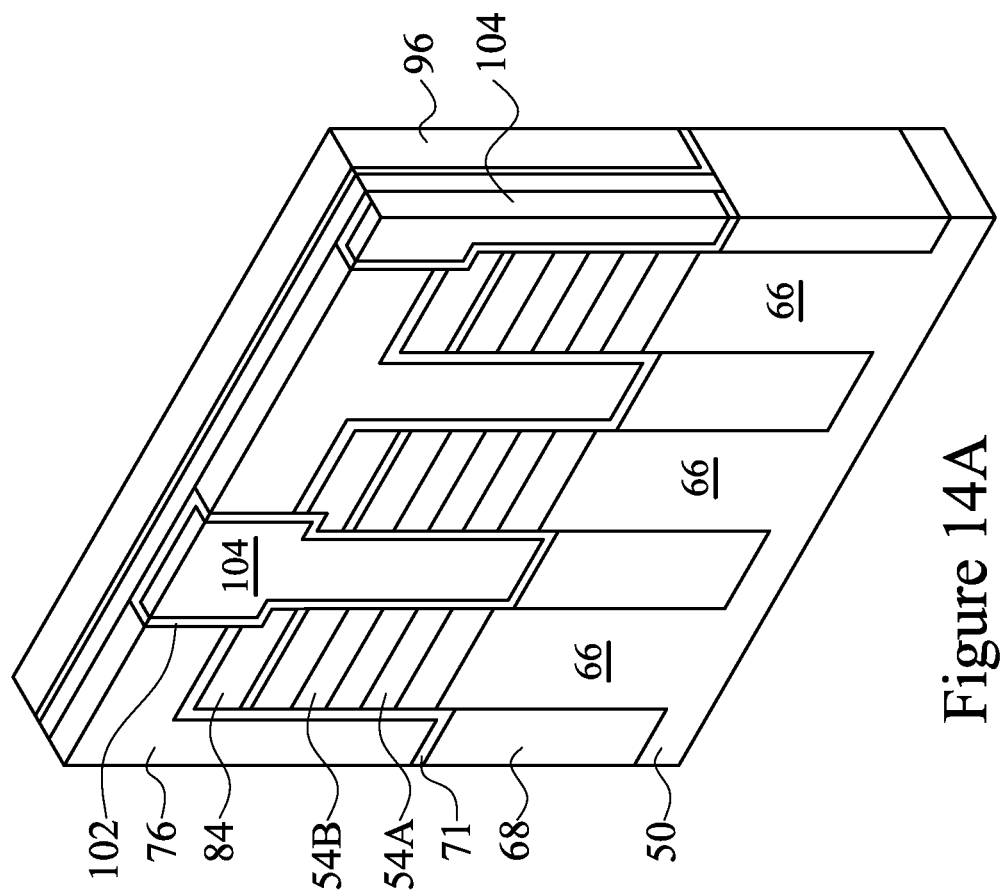
Figure 14B:
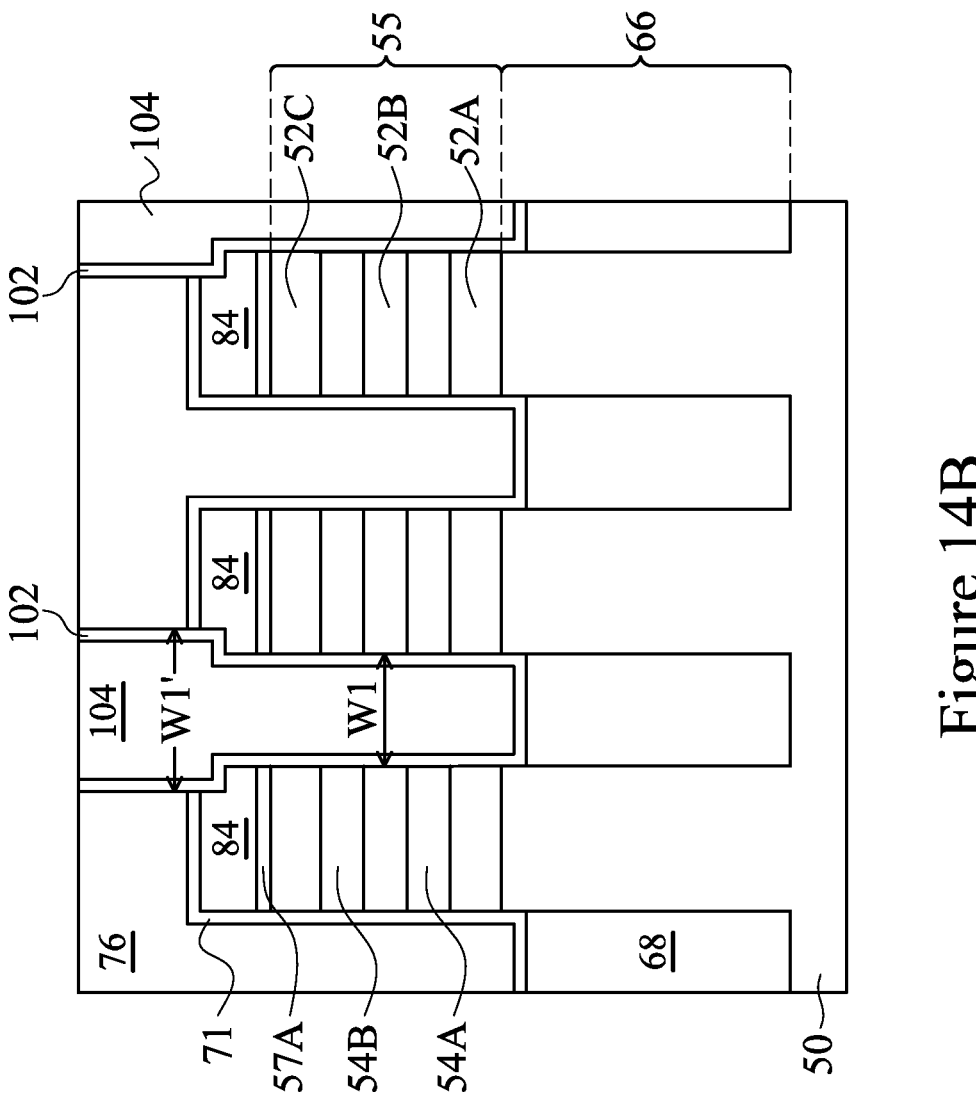

In FIGS. 14A and 14B, first isolation walls 104 are formed in the second recesses 101, in accordance with some embodiments. FIG. 14A illustrates a perspective view including cross-section A-A', and FIG. 14B illustrates a cross-sectional view along cross-section A-A'. The first isolation walls 104 isolate, insulate, and separate neighboring subsequently formed gate structures. The first isolation walls 104 are formed by depositing dielectric material within the second recesses 101. In some embodiments, before depositing the dielectric material, remaining portions of the dummy gate dielectrics 71 within the second recesses 101 are removed using a suitable etching process. The dielectric material of the first isolation walls 104 may comprise one or more layers of one or more different materials, such as silicon oxide, silicon nitride, silicon carbonitride, silicon oxycarbide, silicon oxycarbonitride, a combination thereof, or the like. Other materials or combinations of materials are possible. The dielectric material may be deposited using one or more suitable techniques such as ALD, CVD, PVD, or the like. In some embodiments, an optional liner 102 is deposited in the second recesses 101 before depositing the dielectric material. The liner 102 may be formed of a material such as silicon oxide or the like, which may be different from the dielectric material of the first isolation walls 104. In some embodiments, the material of the liner 102 may be similar to the material of the dummy gate dielectrics 71. The liner 102 may be deposited using a suitable process, such as thermal oxidation, ALD, CVD, PVD, or the like. In some embodiments, a planarization process (e.g., a CMP process or the like) may be performed to remove excess liner 102 or dielectric material.

Because the second recesses 101 are formed using a self-aligned process, the first isolation walls 104 may be considered self-aligned structures, in some cases. Forming the first isolation walls 104 using self-aligned processes can improve uniformity, reduce process sensitivity, and improve yield. In some cases, the formation of first isolation walls 104 using self-aligned processes can allow for improved uniformity and less variation. In some cases, forming first isolation walls 104 as described herein can allow for the subsequent formation of gate electrodes having a smaller size, which can reduce parasitic capacitance within a nano-FET, described in greater detail below. In some embodiments, the first isolation walls 104 may have a width W1 that is in the range of about 10 nm to about 30 nm. In some embodiments, the first isolation walls 104 may have a width W1' above the nanostructures 55 that is greater than the width W1 between the nanostructures 55. For example, the first isolation walls 104 may have a width W1' in the range of about 25 nm to about 100 nm. Other widths are possible. In some cases, the formation of first isolation walls 104 as described herein can allow for the channel regions of nano-FETs to be formed having a smaller separation distance, which can improve device density.

Figure 15A:
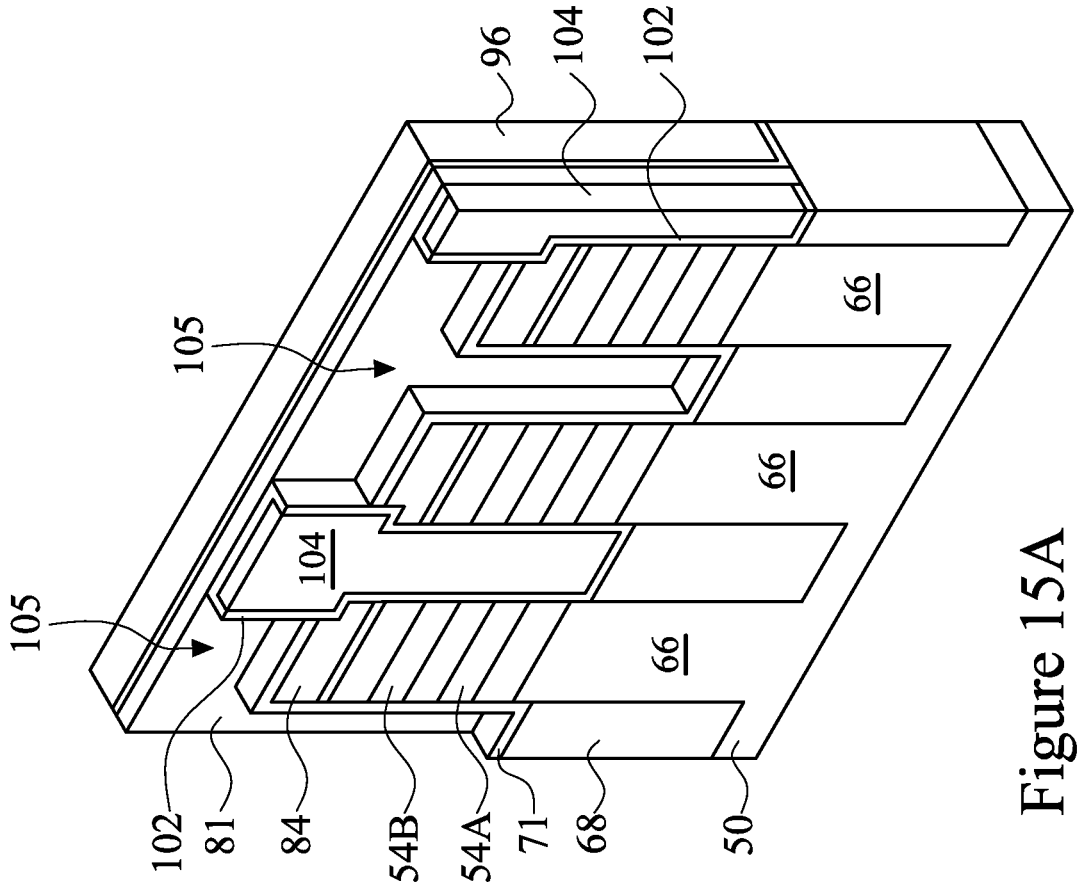
Figure 15B:
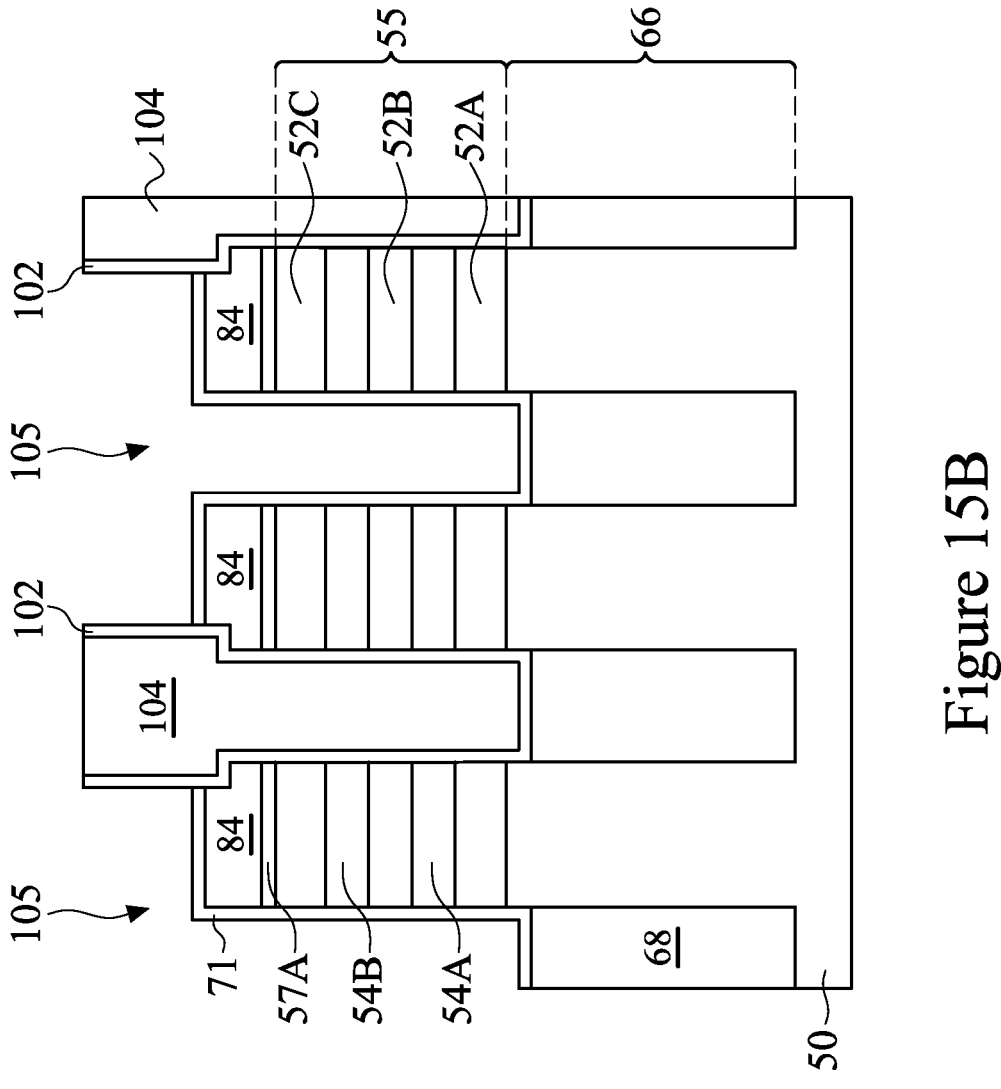

In FIGS. 15A and 15B, remaining portions of the dummy gates 76 are removed, forming third recesses 105, in accordance with some embodiments. FIG. 15A illustrates a perspective view including cross-section A-A', and FIG. 15B illustrates a cross-sectional view along cross-section A-A'. In some embodiments, the remaining portions of the dummy gates 76 are removed by an anisotropic dry etch process. For example, the etching process may include a dry etch process using reaction gas(es) that selectively etch the dummy gates 76 at a faster rate than the first ILD 96, the spacer layer 81, the liner 102, and the dummy gate dielectrics 71. In this manner, the dummy gate dielectrics 71 and the liner 102 may be used as etch stop layers when the dummy gates 76 are etched. In other embodiments, the dummy gate dielectrics 71 and the liner 102 are also removed as part of the etching process that forms the third recesses 105.

Figure 16A:
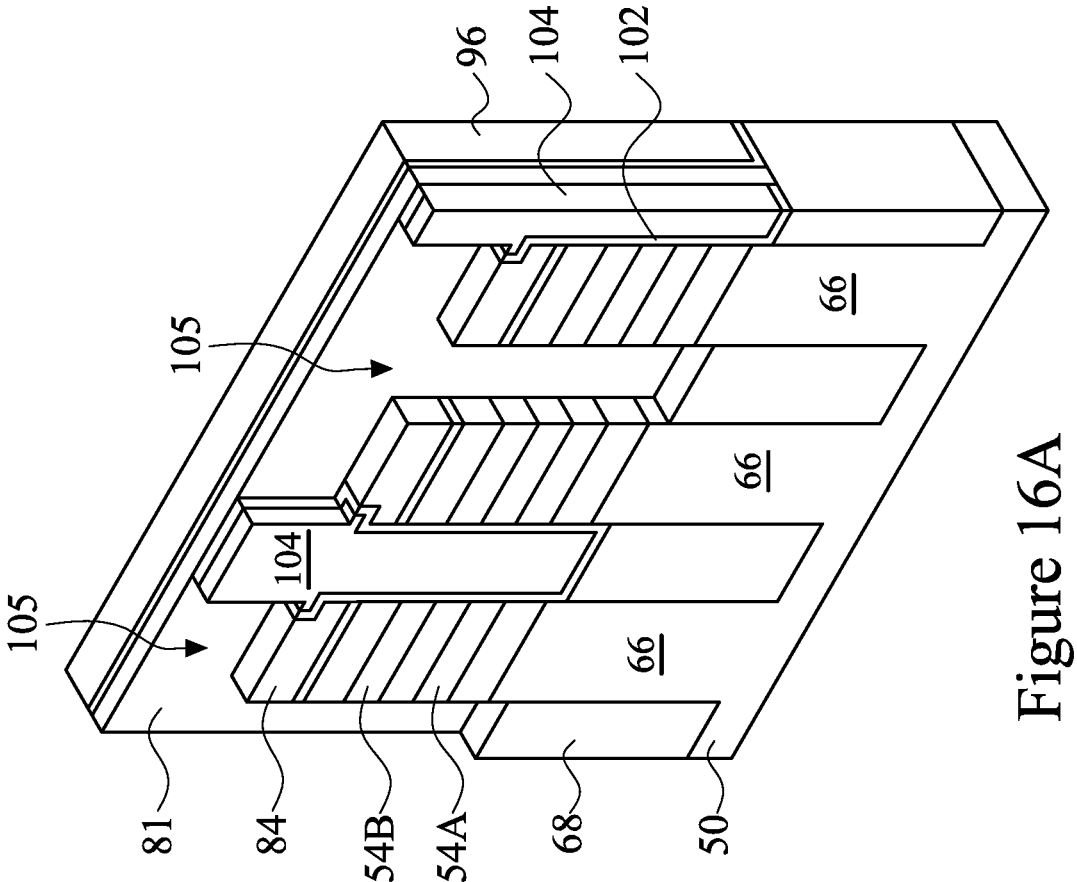
Figure 16B:
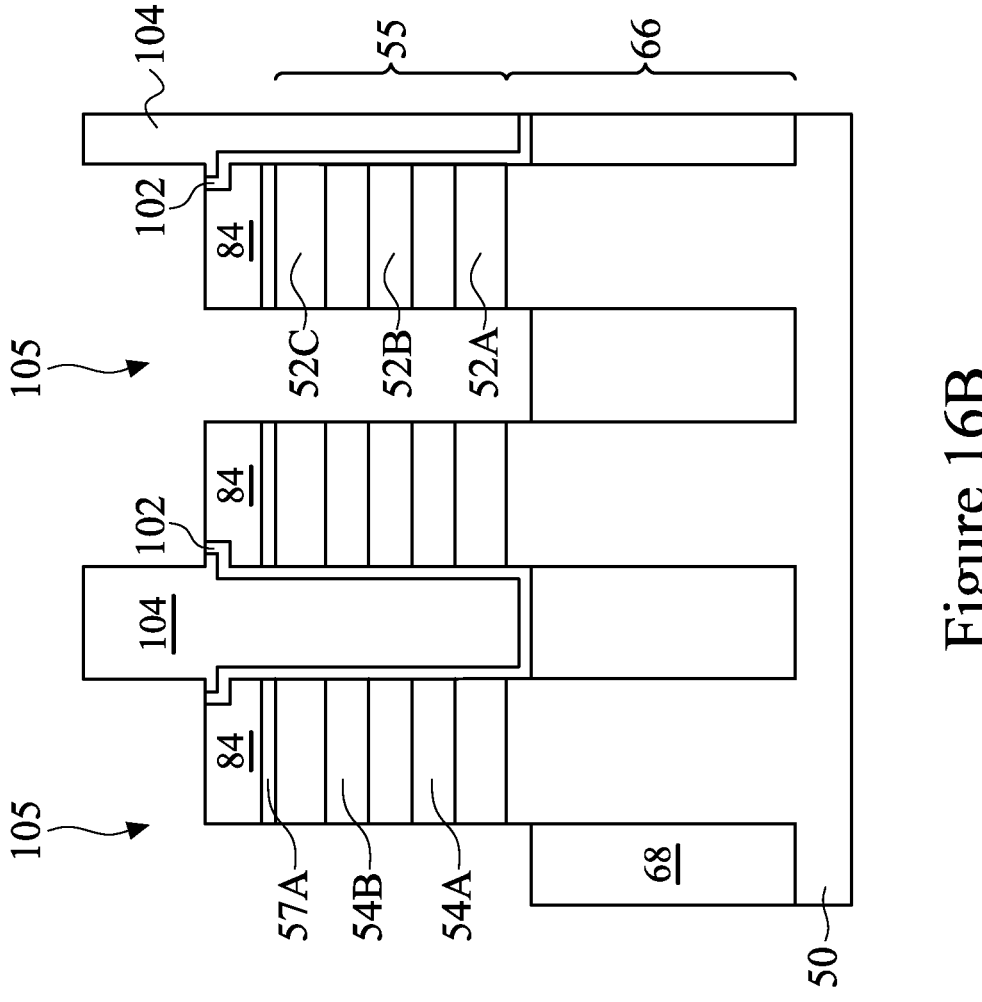

In FIGS. 16A and 16B, portions of the dummy gate dielectrics 71 and the liner 102 within the third recesses 105 are removed, in accordance with some embodiments. FIG. 16A illustrates a perspective view including cross-section A-A', and FIG. 16B illustrates a cross-sectional view along cross-section A-A'. In some embodiments, the dummy gate dielectrics 71 and the liner 102 are removed by an anisotropic dry etch process. For example, the etch process may include a dry etch process using reaction gas(es) that selectively etch the dummy gate dielectrics 71 and the liner 102 at a faster rate than the first ILD 96, the spacer layer 81, the hard masks 84, the first isolation walls 104, and the nanostructures 55. Removing the dummy gate dielectrics 71 and the liner 102 may expose surfaces of the first isolation walls 104, the hard masks 84, the nanostructures 55, and/or the STI regions 68. In some cases, the etch process may trim or partially remove portions of the first isolation walls 104, as shown in FIG. 16A-16B.

Figure 17A:
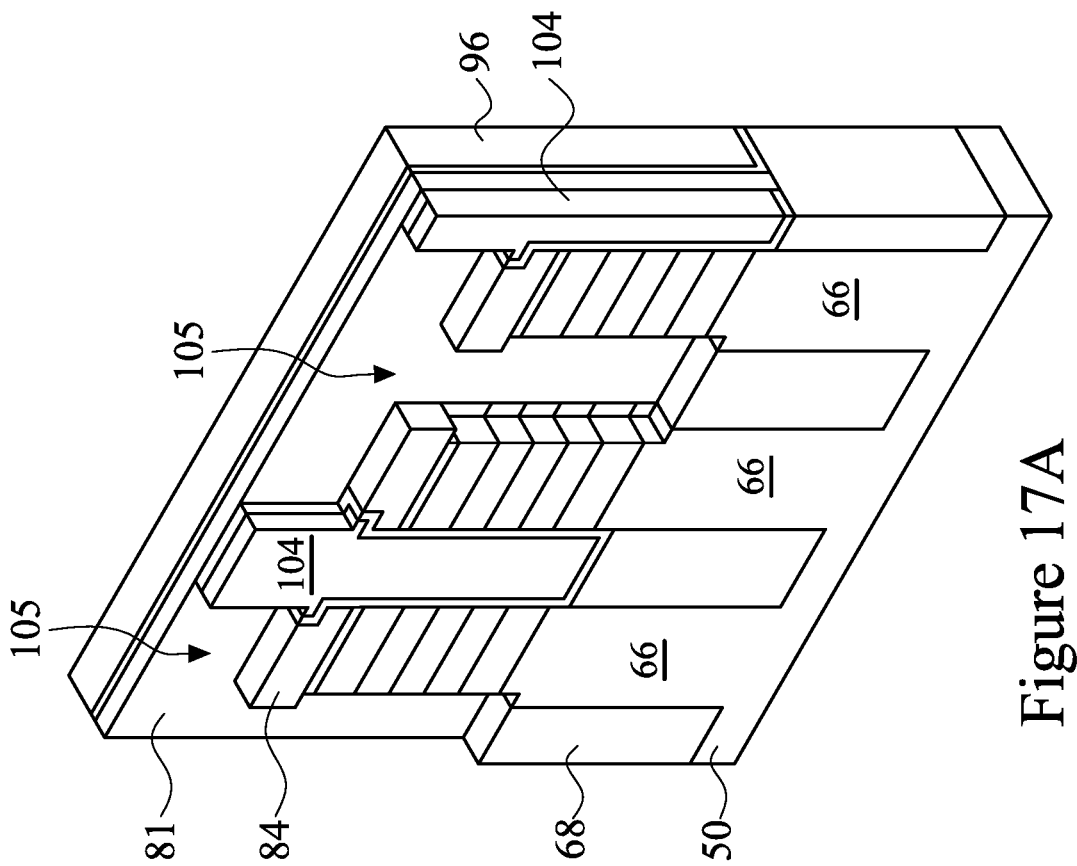
Figure 17B:
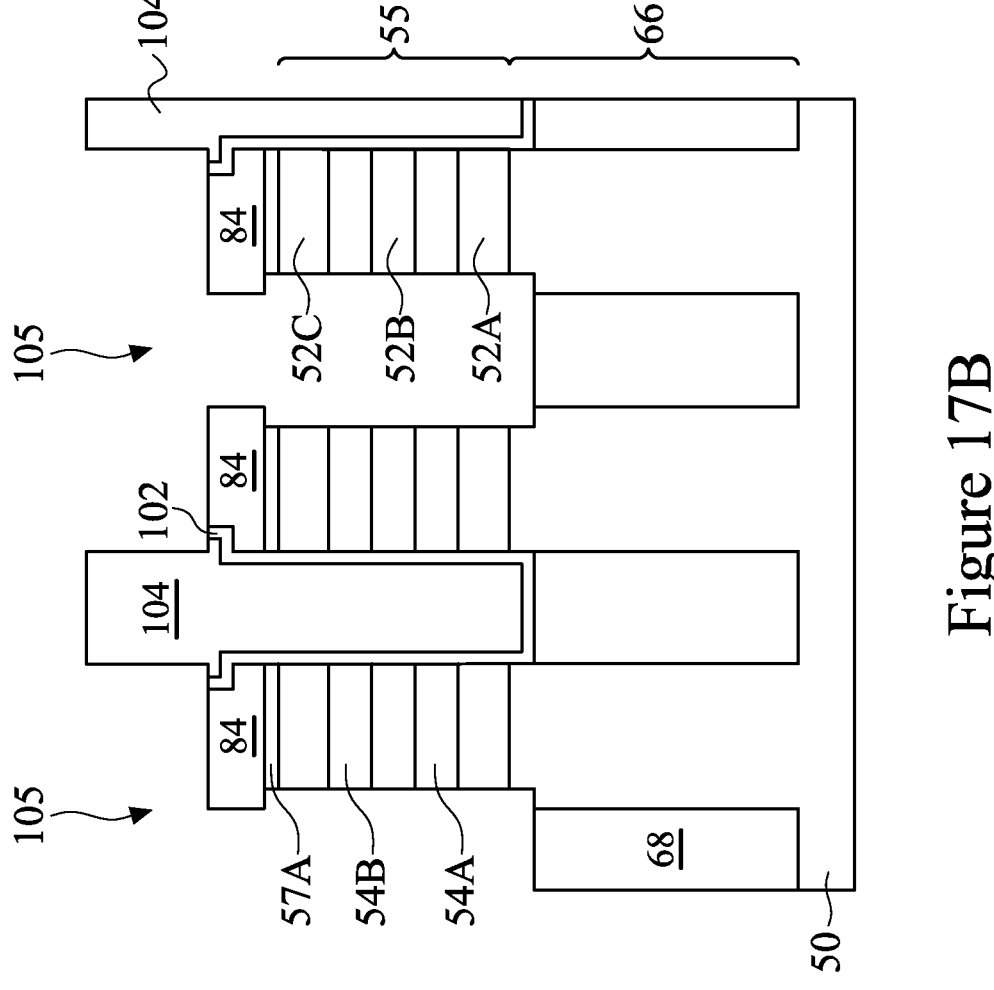

In FIGS. 17A and 17B, the nanostructures 55 are trimmed, in accordance with some embodiments. FIG. 17A illustrates a perspective view including cross-section A-A', and FIG. 17B illustrates a cross-sectional view along cross-section A-A'. The nanostructures 55 may be trimmed to reduce the risk of shorting between electrode layers 108 (see FIGS. 21A-21C), to allow for greater control of the deposition of the electrode layers 108, and to allow for the subsequent deposition of the mask layers 111 (see FIGS. 22A-22B) without requiring greater separation between the nanostructures 55. In some embodiments, the trimming comprises recessing exposed sidewalls of the first nanostructures 52 and the second nanostructures 54. The trimming may also recess sidewalls of the third semiconductor layer 57A or the fins 66. The trimming may include one or more etch processes that selectively etch the first semiconductor material of the first nanostructures 52, the second semiconductor material of the second nanostructures 54, and/or the material of the third semiconductor layer 57A at a faster rate than the spacer layer 81, the hard masks 84, the first isolation walls 104, and the STI regions 68. The etch process may be isotropic, and may include a wet etch process or the like. In some embodiments, the etch process may be a timed etch. Other etching processes are possible. In some embodiments, the trimming may laterally recess exposed sidewalls of the nanostructures 55 a distance in the range of about 4 nm to about 8 nm, though other distances are possible. For example, the exposed sidewalls may be the sidewalls of the nanostructures 55 that are opposite (e.g., farther from) the adjacent first isolation walls 104, as shown in FIGS. 17A-17B. In some cases, after the trimming, the hard masks 84 may overhang the underlying nanostructures 55, as shown in FIGS. 17A-17B.

Figure 18A:
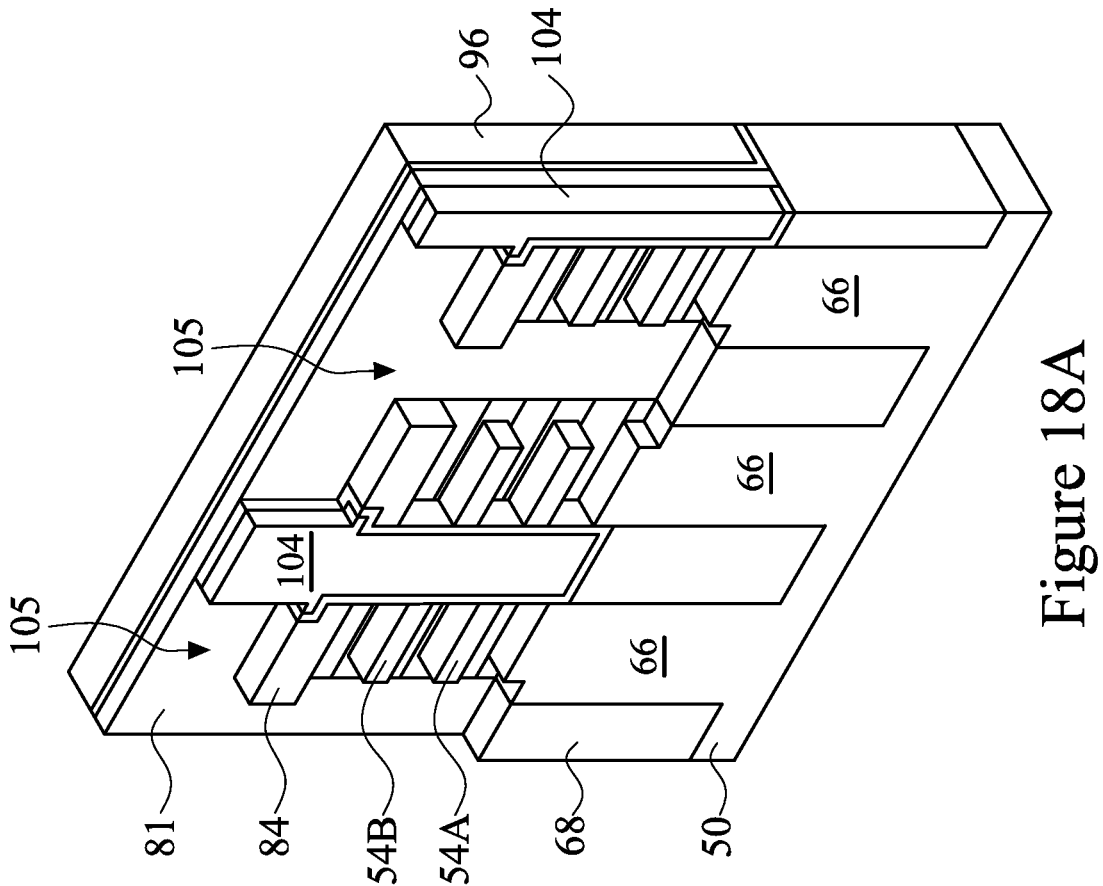
Figure 18B:
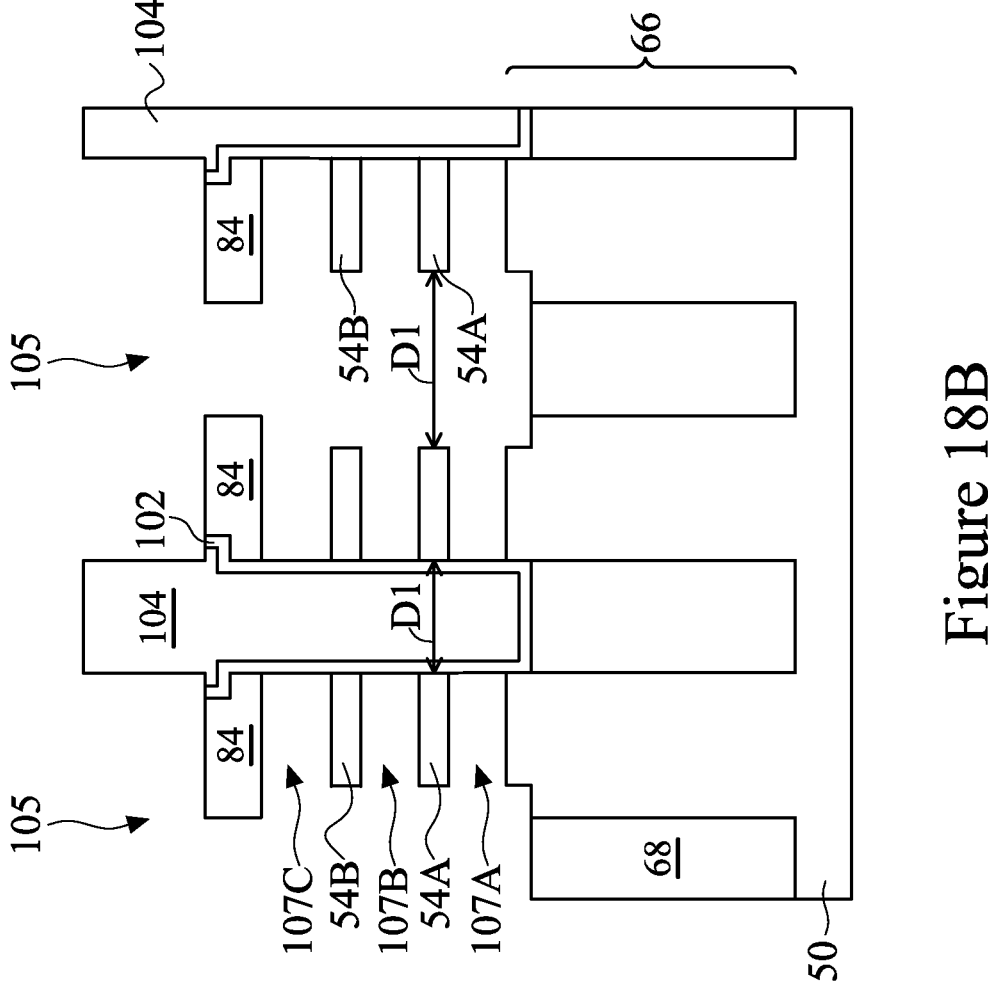
Figure 18C:
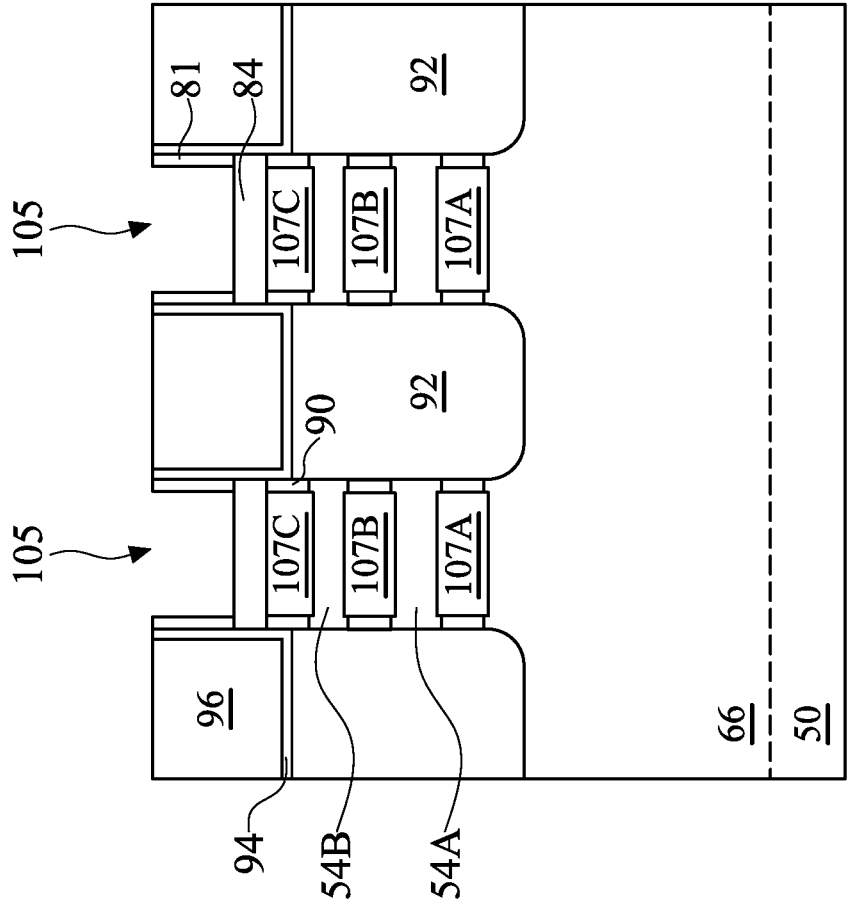

In FIGS. 18A, 18B and 18C, the first nanostructures 52 are removed, in accordance with some embodiments. FIG. 18A illustrates a perspective view including cross-section A-A', FIG. 18B illustrates a cross-sectional view along cross-section A-A', and FIG. 18C illustrates a cross-sectional view along cross-section B-B'. The first nanostructures 52 may be removed, for example, using an etch process that is selective to the first semiconductor material of the first nanostructures 52, while the second nanostructures 54, the fins 66, the spacer layer 81, the hard masks 84, the first isolation walls 104, the liner 102, and the STI regions 68 remain substantially unetched. The etch process may be isotropic, and may include a wet etch process or the like. In embodiments in which the first nanostructures 52 comprise, e.g., silicon-germanium, and the second nanostructures 54A include, e.g., silicon or silicon carbide, then tetramethylammonium hydroxide (TMAH), ammonium hydroxide (NH$_4$OH), or the like may be used to remove the first nanostructures 52. Other materials or etchants are possible.

Removing the first nanostructures 52 forms fourth recesses 107 within the third recesses 105. The fourth recesses 107 may be lateral recesses located above and below the second nanostructures 54. For example, as indicated in FIGS. 18B and 18C, removing the first nanostructures 52 forms fourth recesses 107A between fins 66 and overlying second nanostructures 54, fourth recesses 107B between vertically stacked second nanostructures 54, and fourth recesses 107C between hard masks 84 and underlying second nanostructures 54. As shown in FIGS. 18A and 18B, the etch process can expose regions of the liner 102 that were covered by the first nanostructures 52. In some cases, the etch process used to remove the first nanostructures 52 can also partially etch (e.g., trim or thin) surfaces of the second nanostructures 54 and/or the third semiconductor layer 57A. In some cases, the etch process may remove the third semiconductor layer 57A, as shown in FIGS. 18A-18B.

The remaining second nanostructures 54 are used to provide channel regions for nano-FETs, and thus may also be referred to as channel regions 54 or channels 54 herein. In some embodiments, the channel regions 54 may have a width (e.g., a "channel width") that is in the range of about 5 nm to about 100 nm, though other widths are possible. The channel regions 54 may have a thickness in the range of about 4 nm to about 10 nm, though other thicknesses are possible. Adjacent channel regions 54 may have a vertical separation in the range of about 6 nm to about 20 nm and may have a vertical pitch in the range of about 10 nm to about 30 nm, though other distances are possible. Pairs of neighboring channel regions 54 may be laterally separated by a distance D1, which may be in the range of about 10 nm to about 30 nm, though other distances are possible. Different pairs of neighboring channel regions 54 may be separated by different lateral distances, in some cases. The separation distance D1 may be similar to the width W1 (see FIG. 14B), in some cases. The techniques described herein can allow for channel regions 54 to be formed having a smaller separation distance D1, which can improve device density and reduce size and cost.

Figure 19A:
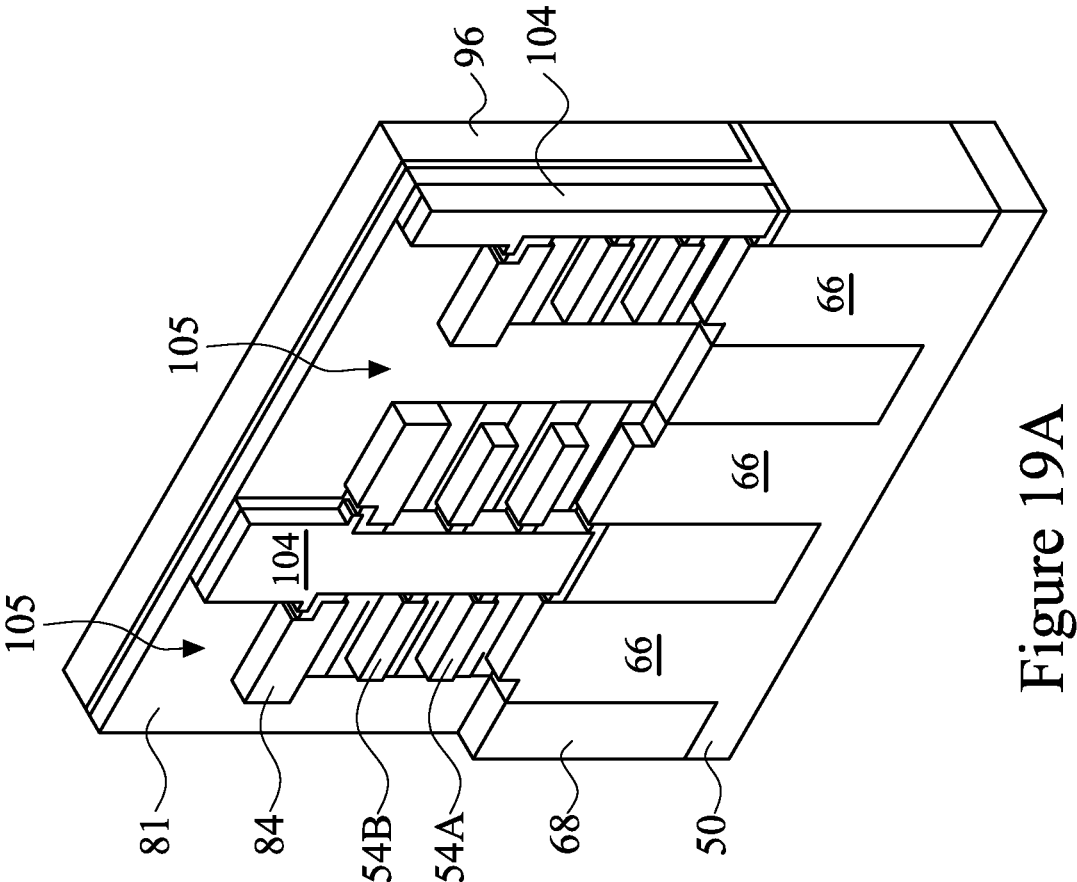
Figure 19B:
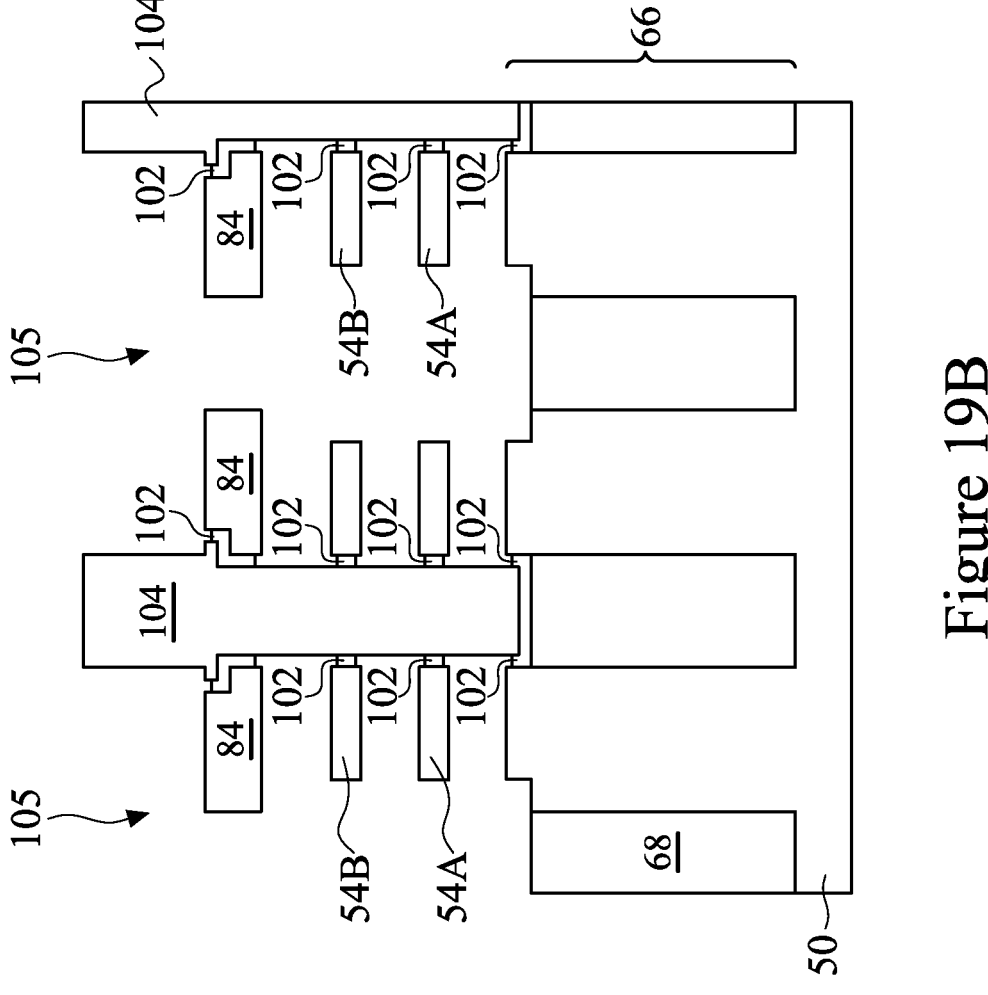
Figure 19C:
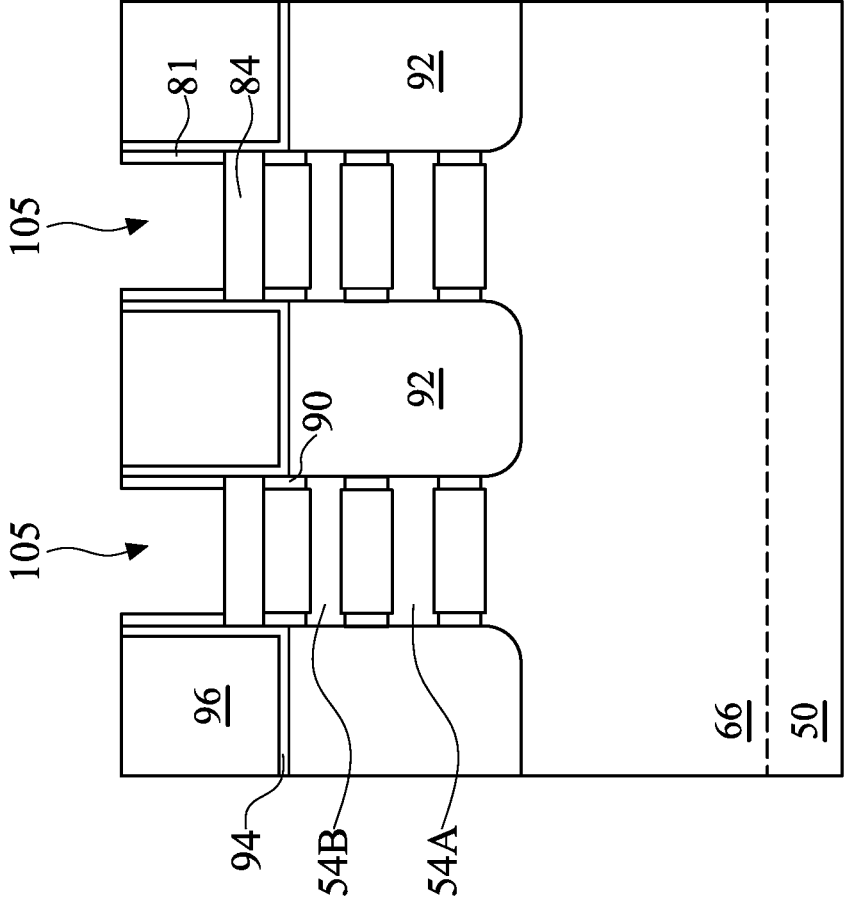

In FIGS. 19A, 19B, and 19C, exposed regions of the liner 102 are optionally removed, in accordance with some embodiments. FIG. 19A illustrates a perspective view including cross-section A-A', FIG. 19B illustrates a cross-sectional view along cross-section A-A', and FIG. 19C illustrates a cross-sectional view along cross-section B-B'. The exposed regions of the liner 102 may be removed (e.g., trimmed) using an etch process that is selective to the material of the liner 102, while the second nanostructures 54, the fins 66, the spacer layer 81, the hard masks 84, the first isolation walls 104, and the STI regions 68 remain substantially unetched. The etch process may be isotropic, and may include a wet etch process or the like.

In some embodiments, the etch process removes regions of the liner 102 within the fourth recesses 107 (see FIGS. 18B-18C) and thus extends the fourth recesses 107. For example, the etch process removes exposed regions of the liner 102 that are above and below the second nanostructures 54, such as regions of the liner 102 that are between vertically stacked second nanostructures 54 or regions of the liner 102 that are between hard masks 84 and underlying second nanostructures 54. In this manner, after performing the etch process, some surfaces of the first isolation walls 104 that are covered by the liner 102 are exposed. The etch process may remove other regions of the liner 102 or may partially etch (e.g., trim or thin) other regions of the liner 102, in some cases.

In some embodiments, after performing the etch process, portions of the liner 102 may remain between the second nanostructures 54 and the first isolation walls 104. These remaining portions of the liner 102 may have a height that is less than a thickness of the second nanostructures 54, as shown in FIGS. 19A-19B. In other cases, these remaining portions of the liner 102 may have a height that is about the same as or greater than a thickness of the second nanostructures 54. In some embodiments, after performing the etch process, portions of the liner 102 may remain between the hard masks 84 and the first isolation walls 104, and portions of the liner 102 may remain between the STI regions 68 and the first isolation walls 104. In other embodiments, the etch process is not performed, and the liner 102 remains covering the first isolation walls 104.

Figure 20A:
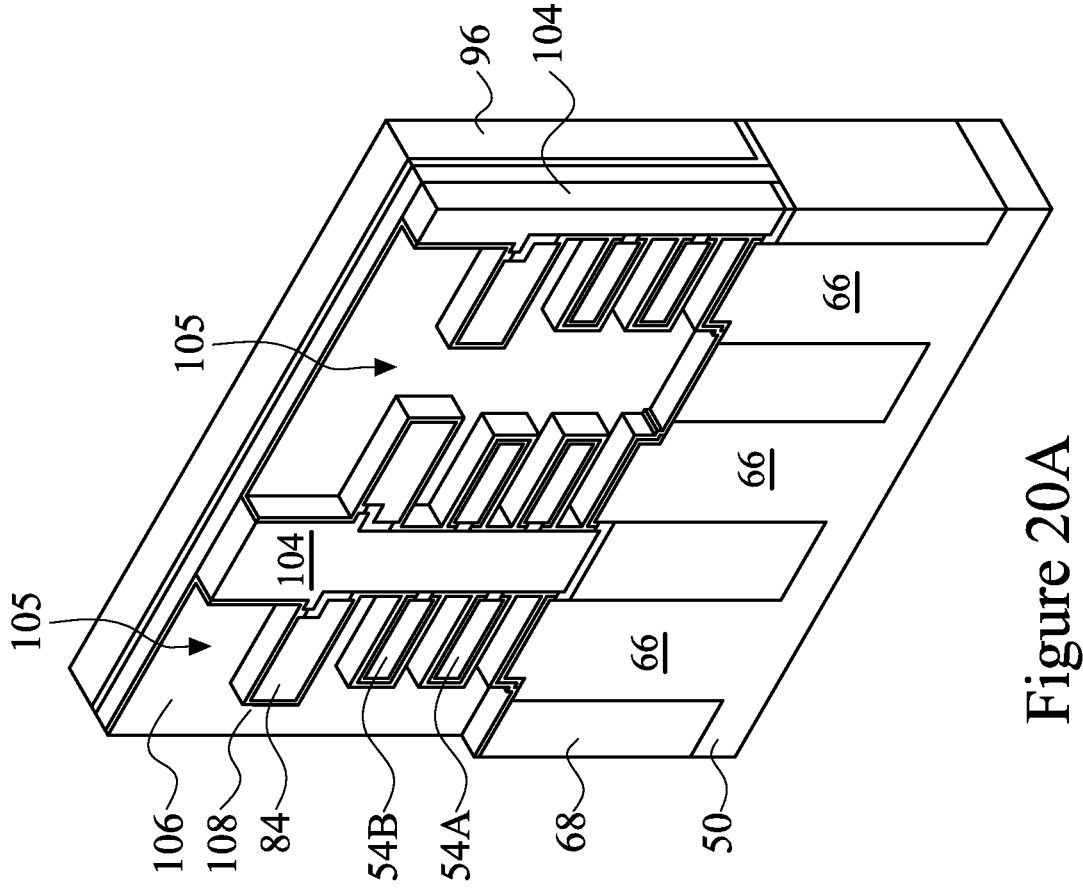
Figure 20B:
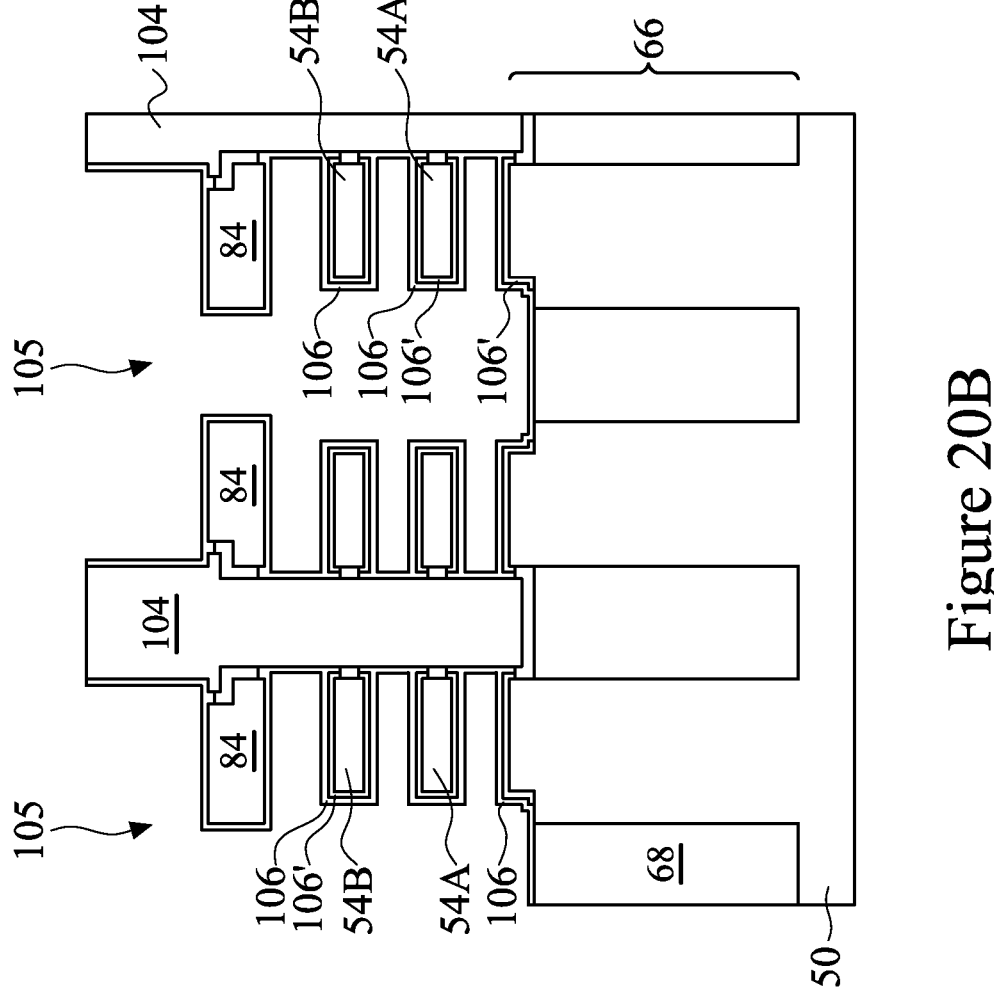
Figure 20C:
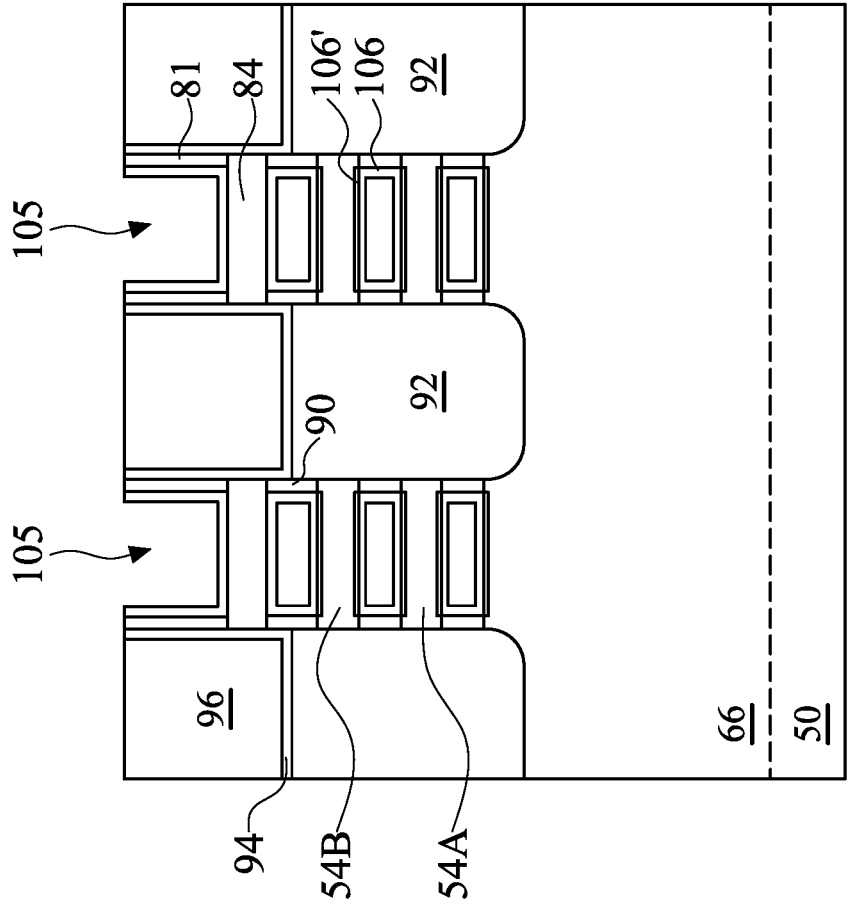

In FIGS. 20A, 20B, and 20C, gate dielectric layers 106 are formed, in accordance with some embodiments. FIG. 20A illustrates a perspective view including cross-section A-A', FIG. 20B illustrates a cross-sectional view along cross-section A-A', and FIG. 20C illustrates a cross-sectional view along cross-section B-B'. The gate dielectric layers 106 are deposited conformally in the third recesses 105. The gate dielectric layers 106 may be deposited on top surfaces, bottom surfaces, and sidewall surfaces of the second nanostructures 54. The gate dielectric layers 106 may also be deposited on the fins 66, the spacer layer 81, the hard masks 84, the first isolation walls 104, the liner 102, and/or the STI regions 68.

In accordance with some embodiments, the gate dielectric layers 106 comprise one or more dielectric layers, such as an oxide, a metal oxide, the like, or combinations thereof. In some embodiments, the gate dielectric layers 106 include a high-k dielectric material, and in these embodiments, the gate dielectric layers 106 may have a k value greater than about 7.0, and may include a metal oxide or a silicate of hafnium, aluminum, zirconium, lanthanum, manganese, barium, titanium, lead, and combinations thereof. The formation methods of the gate dielectric layers 106 may include molecular-beam deposition (MBD), ALD, PECVD, or the like. In some embodiments, the gate dielectric layers 106 comprise an interfacial layer 106' formed on surfaces of the second nanostructures 54 and/or the fins 66. For example, in some embodiments, the gate dielectric layers 106 may comprise an interfacial layer 106' of silicon oxide formed by thermal or chemical oxidation and a metal oxide layer over the interfacial layer 106'. Other materials or deposition techniques are possible.

Figure 21A:
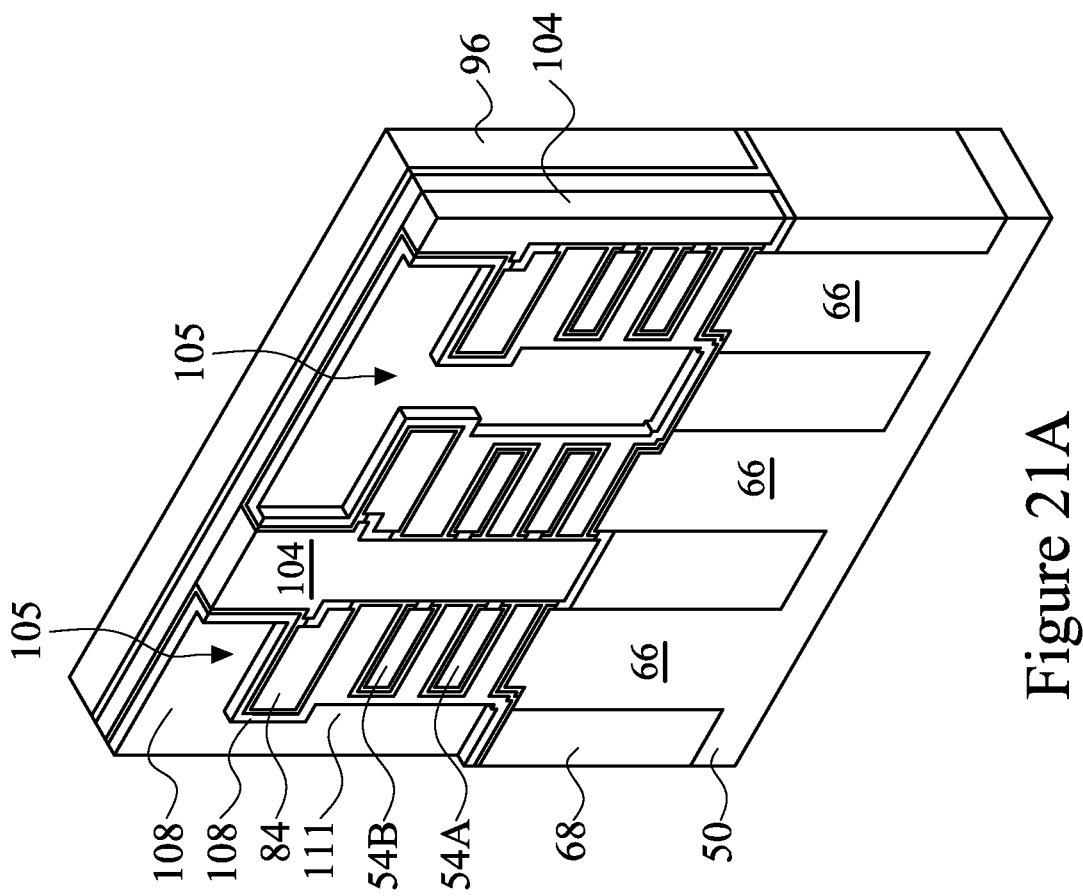
Figure 21B:
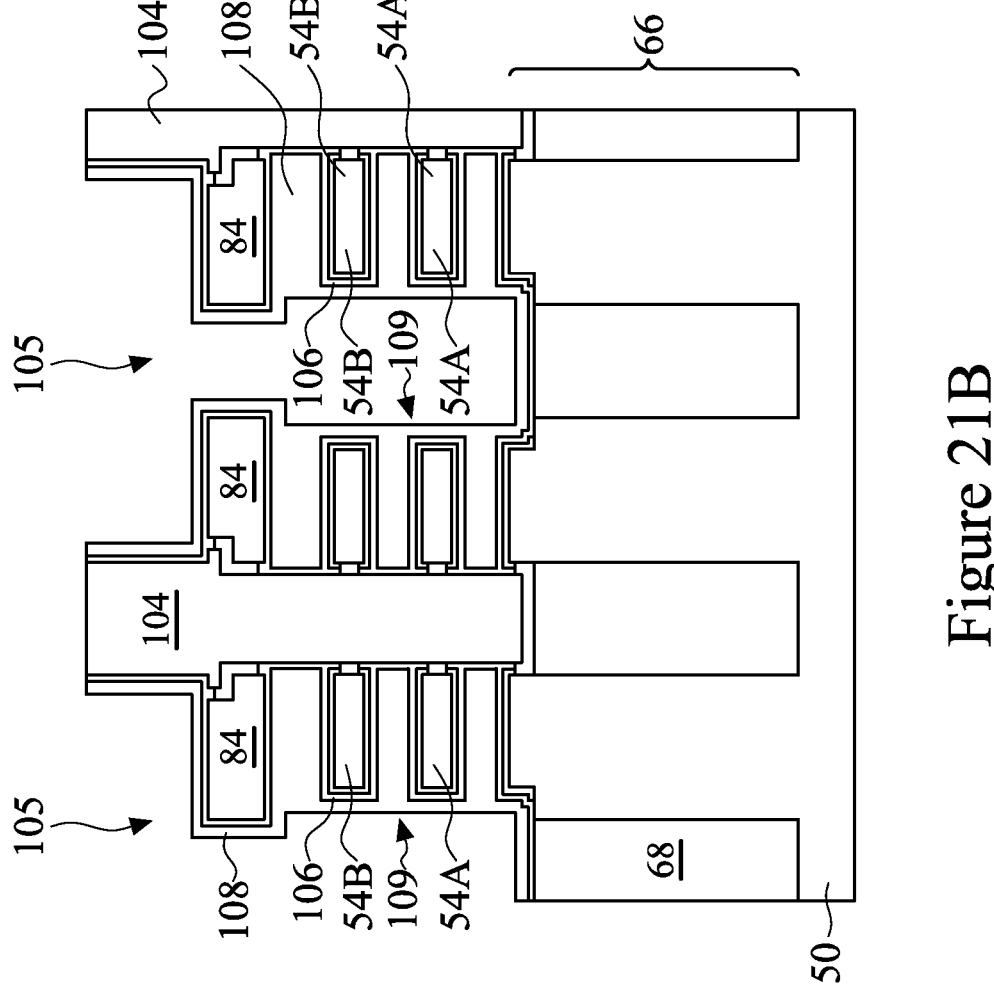
Figure 21C:
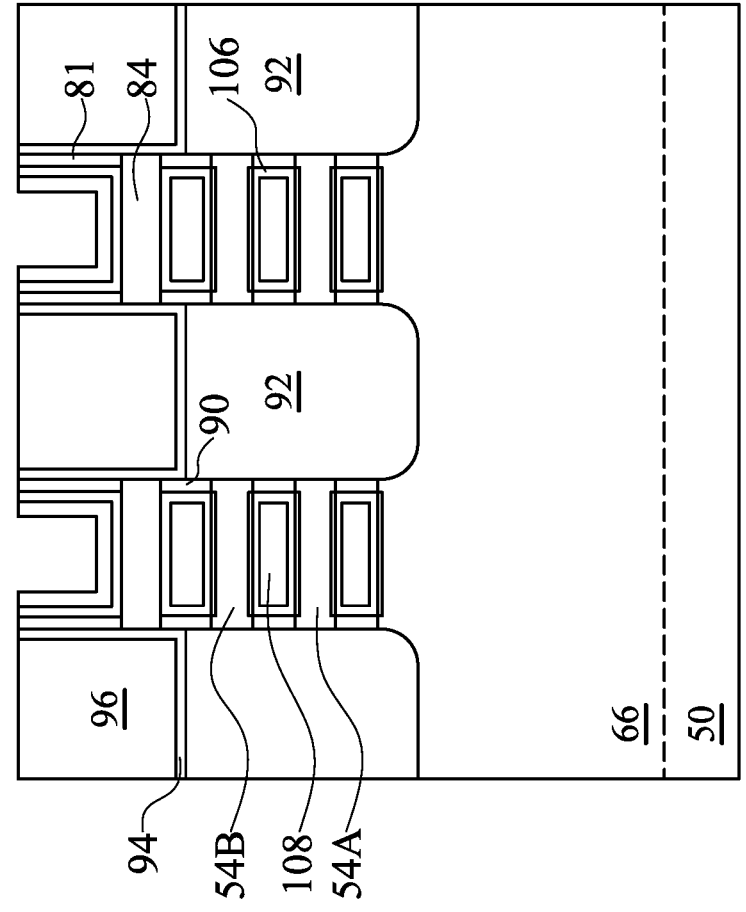

In FIGS. 21A, 21B, and 21C, gate electrode layers 108 are formed, in accordance with some embodiments. FIG. 21A illustrates a perspective view including cross-section A-A', FIG. 21B illustrates a cross-sectional view along cross-section A-A', and FIG. 21C illustrates a cross-sectional view along cross-section B-B'. The gate electrode layers 108 are deposited conformally in the third recesses 105. For example, the gate electrode layers 108 are deposited on the gate dielectric layers 106, over the second nanostructures 54, and within the fourth recesses 107 (see FIGS. 18B-18C). In some embodiments, the gate electrode layers 108 may fill or partially fill the fourth recesses 107. The gate electrode layers 108 may also be conformally deposited over the fins 66, the spacer layer 81, the hard masks 84, the first isolation walls 104, the liner 102, and/or the STI regions 68. The gate electrode layers 108 may include a metal-containing material such as titanium nitride, titanium oxide, tantalum nitride, tantalum carbide, cobalt, ruthenium, aluminum, tungsten, the like, combinations thereof, or multi-layers thereof. For example, although gate electrode layers 108 having a single layer are illustrated in FIGS. 21A-21C, the gate electrode layers 108 may comprise any number of liner layers, any number of work function tuning layers, and a fill material. Other layers or combinations of layers are possible. The gate electrode layers 108 may be formed using suitable techniques, such as plating, ALD, CVD, PVD, PECVD, or the like.

The formation of the gate dielectric layers 106 in the n-type region 50N and the p-type region 50P may occur simultaneously such that the gate dielectric layers 106 in each region are formed from the same materials. The formation of the gate electrode layers 108 in the n-type region 50N and the p-type region 50P may occur simultaneously such that the gate electrode layers 108 in each region are formed from the same materials. In some embodiments, the gate dielectric layers 106 in each region may be formed by distinct processes, such that the gate dielectric layers 106 may be different materials and/or have a different number of layers. The gate electrode layers 108 in each region may be formed by distinct processes, such that the gate electrode layers 108 may be different materials and/or have a different number of layers. Various masking steps may be used to mask and expose appropriate regions when using distinct processes. After depositing the gate electrode layers 108, a planarization process, such as a CMP process, may be performed to remove the excess portions of the gate dielectric layers 106 and the material of the gate electrode layers 108. In some embodiments, conformally depositing the gate electrode layers 108 forms fifth recesses 109 within the third recesses 105. The fifth recesses 109 may be lateral recesses located adjacent the second nanostructures 54 and underneath overhanging portions of the hard masks 84, as shown in FIG. 21B.

Figure 22A:
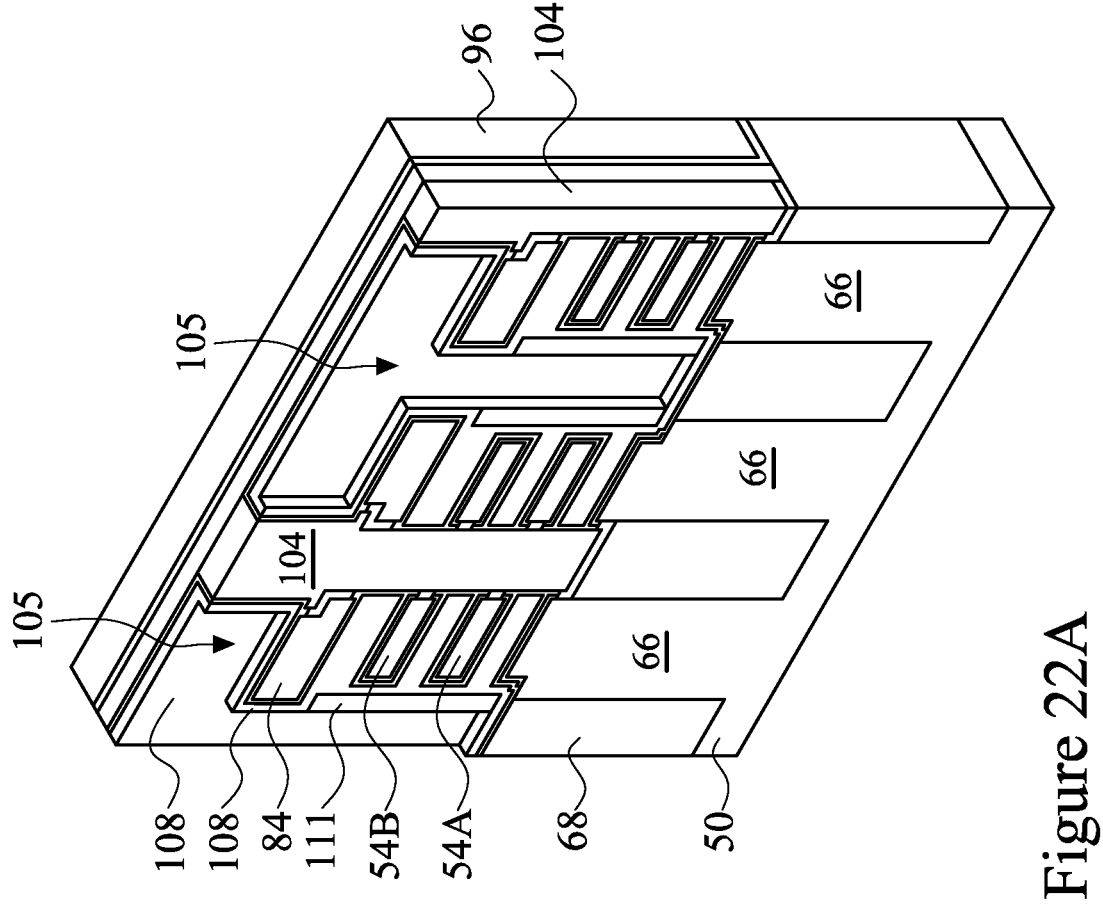
Figure 22B:
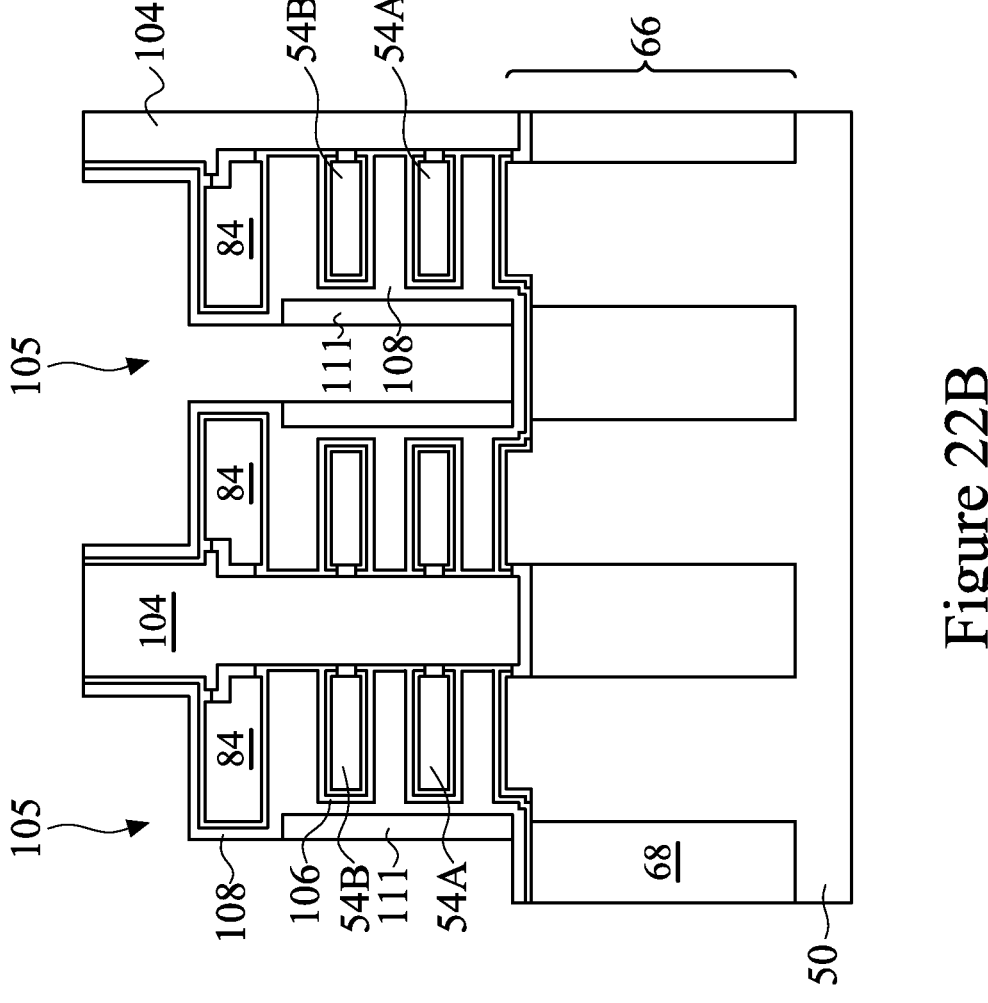

In FIGS. 22A and 22B, mask layers 111 are formed in the fifth recesses 109, in accordance with some embodiments. FIG. 22A illustrates a perspective view including cross-section A-A' and FIG. 22B illustrates a cross-sectional view along cross-section A-A'. The mask layers 111 protect portions of the gate electrode layers 108 during subsequent removal of excess material of the gate electrode layers 108.

The mask layers 111 may be formed on sidewall surfaces of the gate electrode layers 108 within the fifth recesses 109 such that surfaces of the gate electrode layers 108 adjacent the second nanostructures 54 are covered by the mask layers 111. In some embodiments, the mask layers 111 fill the fifth recesses 109. In other embodiments, the mask layers 111 may partially fill or overfill the fifth recesses 109. In some embodiments, sidewalls of the mask layers 111 may be approximately coplanar with adjacent surfaces of the gate electrode layers 108, such as surfaces of the gate electrode layers 108 on sidewalls of the hard masks 84. In other embodiments, sidewalls of the mask layers 111 may be extend beyond or be recessed from adjacent surfaces of the gate electrode layers 108.

In some embodiments, the mask layers 111 may be formed by depositing a mask material into the third recesses 105 and into the fifth recesses 109, and then performing an etch process to remove portions of the mask material outside of the fifth recesses 109. The remaining portions of the mask material form the mask layers 111. In some embodiments, the mask material comprises a photoresist or the like. The mask material may be a single layer or may include multiple layers. In some embodiments, the mask material may comprise an anti-reflective coating, which may be a bottom anti-reflective coating (BARC). Other materials are possible. The etch process may include, for example, a wet etch process, a dry etch process, a photoresist developing process, a cleaning process, or the like. For example, in some embodiments, the etch process includes an anisotropic dry etching process. The etch process may incompletely remove the mask material from within the fifth recesses 109, with the mask layers 111 comprising the mask material left within the fifth recesses 109.

Figure 23A:
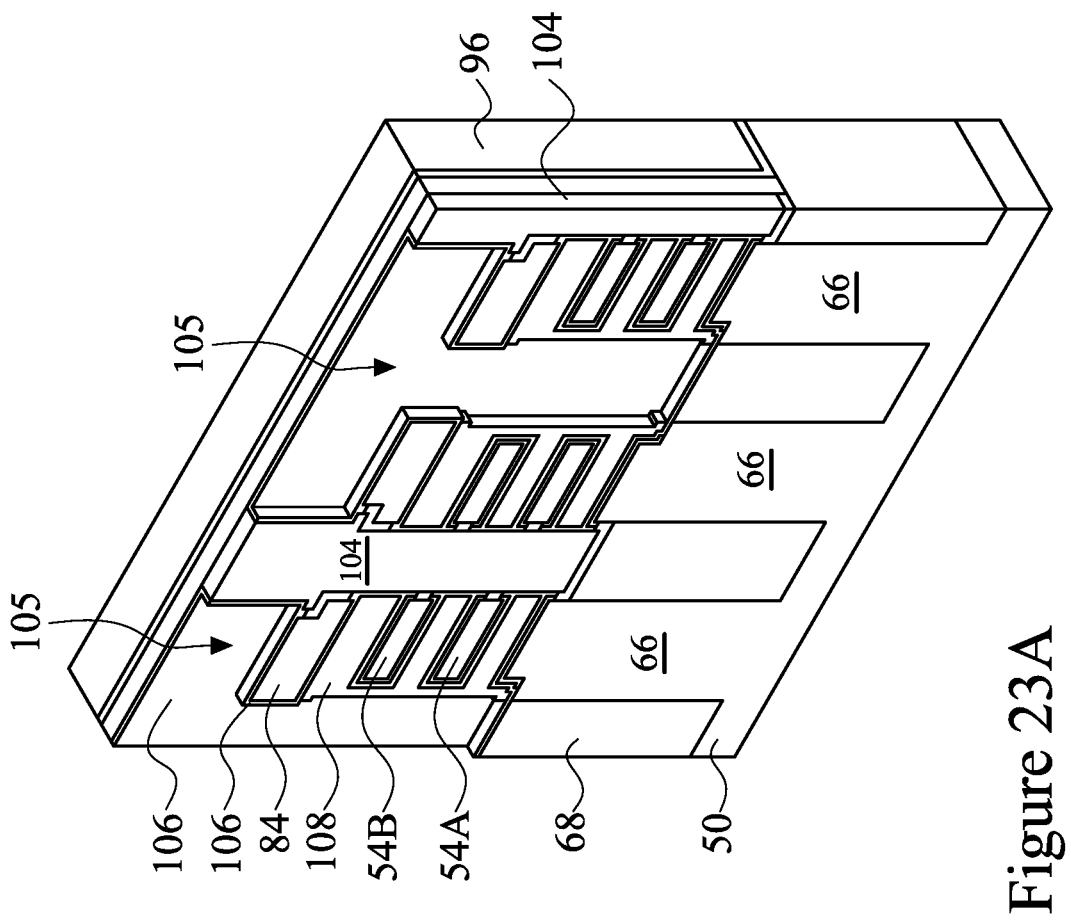
Figure 23B:
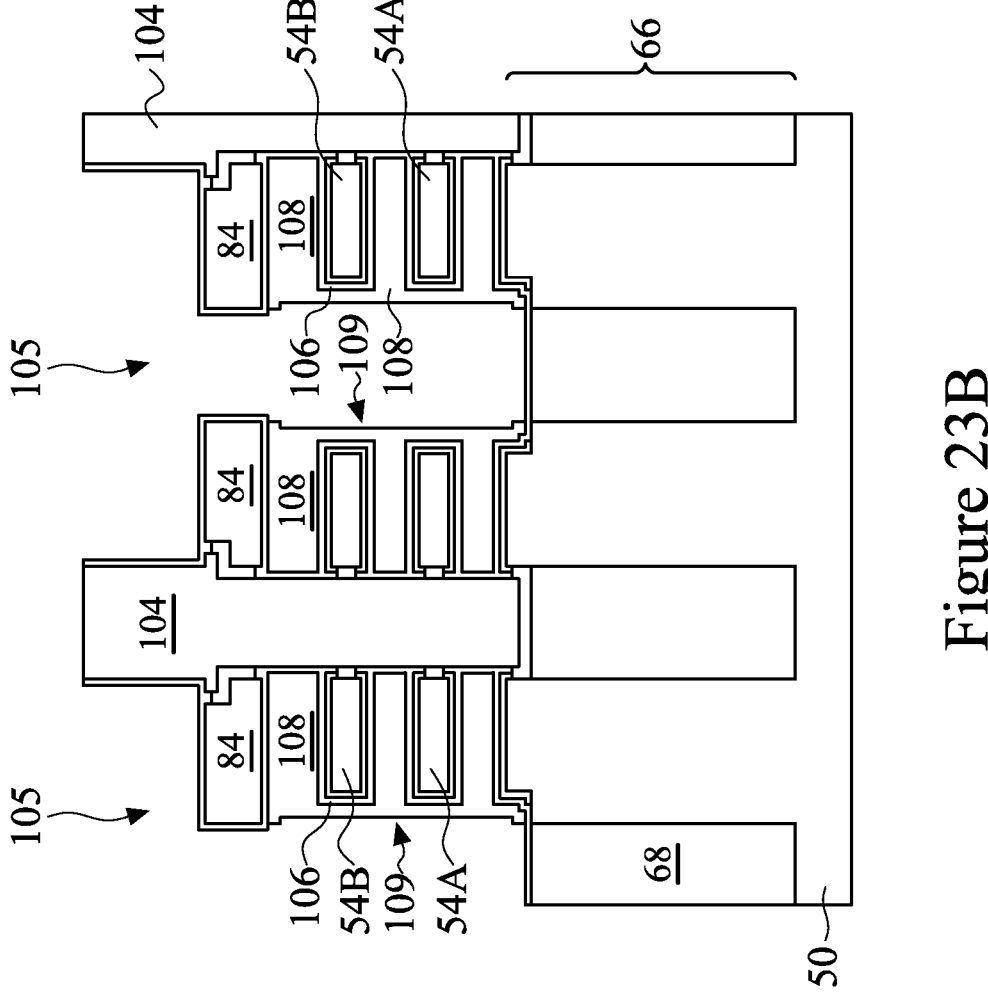

In FIGS. 23A and 23B, excess material of the gate electrode layers 108 is removed to form gate electrodes 108, in accordance with some embodiments. FIG. 23A illustrates a perspective view including cross-section A-A' and FIG. 23B illustrates a cross-sectional view along cross-section A-A'. The excess material of the gate electrode layers 108 may be removed, for example, using an etch process that etches exposed portions of the gate electrode layers 108. The etch process may include a wet etch process or a dry etch process. The etch process may remove portions of the gate electrode layers 108 over the first isolation walls 104, the hard masks 84, and the STI regions 68, and may expose underlying portions of the gate dielectric layers 106. In some embodiments, the hard masks 84 and/or the mask layers 111 may block the etch process from significantly etching portions of the gate electrode layers 108 covering the second nanostructures 54. The remaining portions of the gate electrode layers 108 cover the second nanostructures 54 and form gate electrodes for the resulting nano-FETs. Accordingly, the remaining portions of the gate electrode layers 108 may be referred to as gate electrodes 108 herein. In this manner, the gate dielectric layers 106 and gate electrodes 108 form replacement gate structures of the resulting nano-FETs. The gate dielectric layers 106 and gate electrodes 108 may be collectively referred to as "replacement gates," "gate stacks," or "gate structures."

After removing excess material of the gate electrode layers 108, the mask layers 111 may be removed using a suitable process, such as an ashing process or the like. In some embodiments, after removing the mask layers 111, fifth recesses 109 may remain on sidewalls of the gate electrodes 108. The sidewall surfaces of the gate electrodes 108 may have a different profile than shown. For example, the sidewall surfaces of the gate electrodes 108 may be straight, convex, or concave in other embodiments. In some embodiments, sidewall surfaces of the gate electrodes 108 may be recessed from the overlying hard masks 84 or portions of the gate dielectric layers 106 on the overlying hard masks 84. In other embodiments, sidewall surfaces of the gate electrodes 108 may be approximately aligned with or extend beyond the overlying hard masks 84 or portions of the gate dielectric layers 106 on the overlying hard masks 84.

Figure 24A:
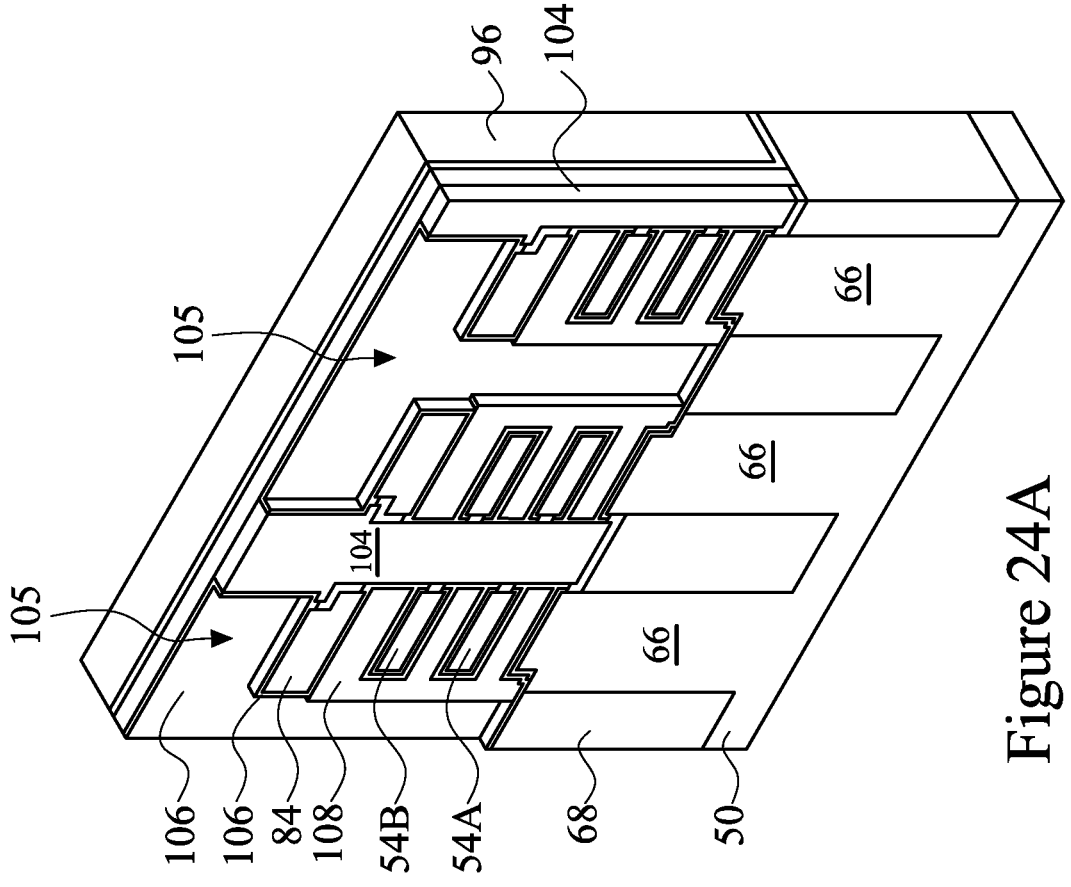
Figure 24B:
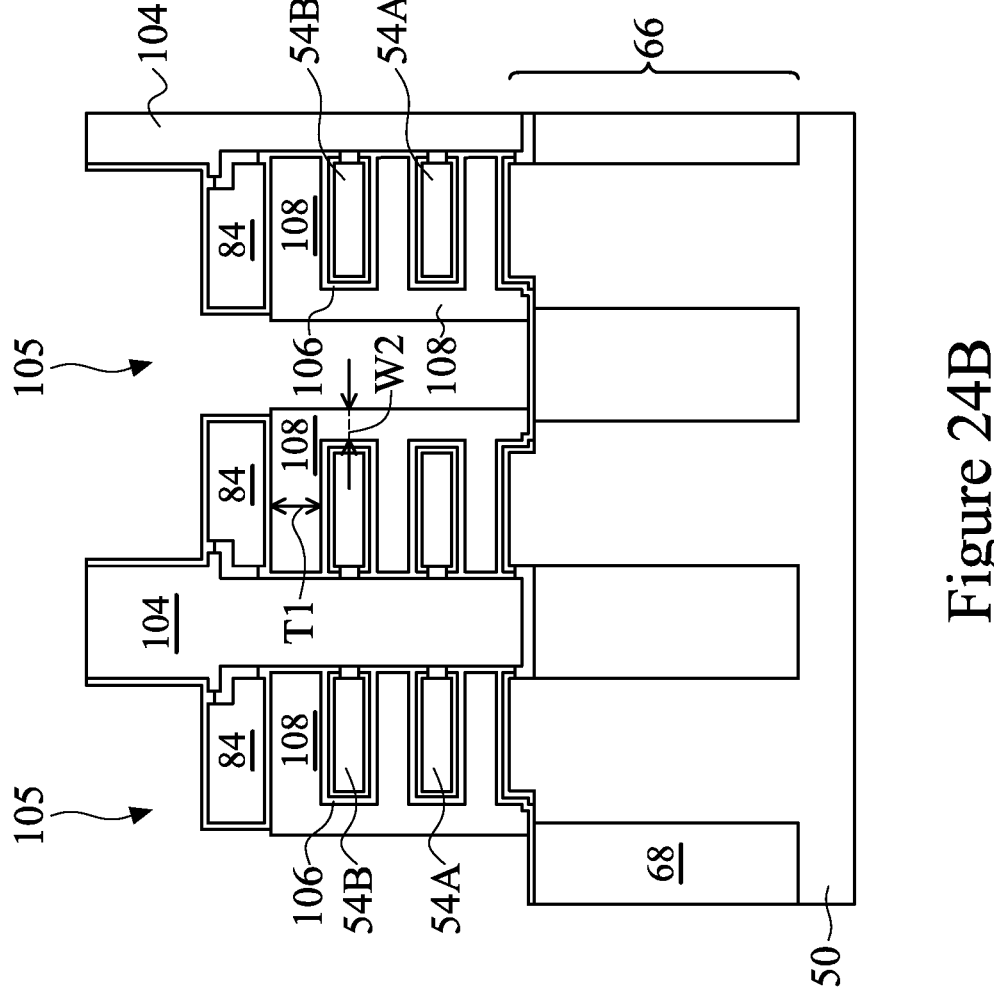

In FIGS. 24A and 24B, additional electrode material is optionally deposited on the gate electrodes 108 previously formed in FIGS. 23A-23B, in accordance with some embodiments. FIG. 24A illustrates a perspective view including cross-section A-A' and FIG. 24B illustrates a cross-sectional view along cross-section A-A'. The additional electrode material may be deposited on the previously formed gate electrodes 108 after the mask layers 111 are removed. The additional electrode material may comprise conductive material(s) similar to those used for the previously formed gate electrodes 108. In other embodiments, the additional electrode material may comprise materials, layers, or compositions of materials that are different than the gate electrodes 108. In some embodiments, the additional electrode material may be selectively deposited on the gate electrodes 108 using a suitable process. For example, the additional electrode material may be deposited using a technique such as plating, ALD, or another suitable technique. In other embodiments, the additional electrode material is not deposited, or a different amount (e.g., thickness) of additional electrode material is deposited than shown. The previously formed gate electrodes 108 with the additional electrode material together may be collectively referred to as the gate electrodes 108.

In some embodiments, the additional electrode material may fill or partially fill the fifth recesses 109 of the previously formed gate electrodes 108. After depositing the additional electrode material, the gate electrodes 108 may have straight sidewalls, as shown in FIGS. 24A-24B, or may have sidewall surfaces that are angled, convex, concave, recessed, or have another profile shape. In some embodiments, after depositing the additional electrode material, sidewall surfaces of the gate electrodes 108 may extend beyond the overlying hard masks 84 or portions of the gate dielectric layers 106 on the overlying hard masks 84. In other embodiments, sidewall surfaces of the gate electrodes 108 may be approximately aligned with or be recessed from the overlying hard masks 84 or portions of the gate dielectric layers 106 on the overlying hard masks 84.

In some embodiments, the portions of the gate electrodes 108 above the topmost second nanostructures 54 (e.g., above second nanostructures 54B in FIG. 24A-24B) may have a thickness T1 that is in the range of about 4 nm to about 10 nm, though other thicknesses are possible. The thickness T1 may correspond to a vertical distance between a top surface of a gate electrode 108 and a top surface of the gate dielectric layers 106 on an underlying second nanostructure 54. In some embodiments, the thickness T1 may be controlled by controlling the vertical position of the hard masks 84 above the second nanostructures 54. For example, in some embodiments, the thickness T1 may be controlled by controlling the thicknesses of layers between the hard masks 84 and the topmost second nanostructures 54, such as the thickness of the topmost first nanostructures 52 (e.g., first nanostructures 52C in FIG. 2) or the thickness of the third semiconductor layer 57A (see FIG. 2). Controlling the thickness T1 in this manner can also control the overall height of the gate electrodes 108, which may correspond to the overall height of the gate structures. In some cases, forming gate electrodes 108 with a smaller thickness T1 or a smaller overall height can reduce parasitic capacitances, such as parasitic capacitances between the gate electrodes 108 and the source/drain contacts 112 (see FIGS. 26C-26D) or the like. Additionally, the techniques described herein allow for the formation of gate electrodes 108 and gate structures having improved height uniformity and less height variation. The improved uniformity and reduced variation may be due, for example, to the height of the gate electrodes 108 being controlled by the location of the hard masks 84.

In some embodiments, portions of the gate electrodes 108 on sidewalls of the second nanostructures 54 may have a width W2 in the range of about 3 nm to about 10 nm, though other widths are possible. In other words, the width W2 may be a thickness of a gate electrode 108 along a sidewall of a second nanostructure 54. The width W2 may correspond to a lateral distance between a sidewall surface of a gate electrode 108 and a surface of the gate dielectric layers 106. In some cases, portions of the gate electrodes 108 on sidewalls of the second nanostructures 54 (e.g., portions having a width W2) may be referred to as "gate end caps." In some embodiments, the width W2 may be controlled by controlling the deposition of the additional electrode material. Controlling the width W2 in this manner can also control the overall width of the gate electrodes 108, the locations of the sidewalls of the gate electrodes 108, and/or the separation between some neighboring gate electrodes 108. In some cases, the techniques described herein allow for the formation of gate electrodes 108 having a smaller width W2, which can reduce parasitic capacitances. Additionally, the techniques described herein allow for the formation of gate electrodes 108 and gate structures having improved width uniformity and less width variation. The improved uniformity and reduced variation may be due, for example, to the width of the gate electrodes 108 being controlled by the sizes of the hard masks 84 and/or the deposition of additional electrode material.

Figure 25A:
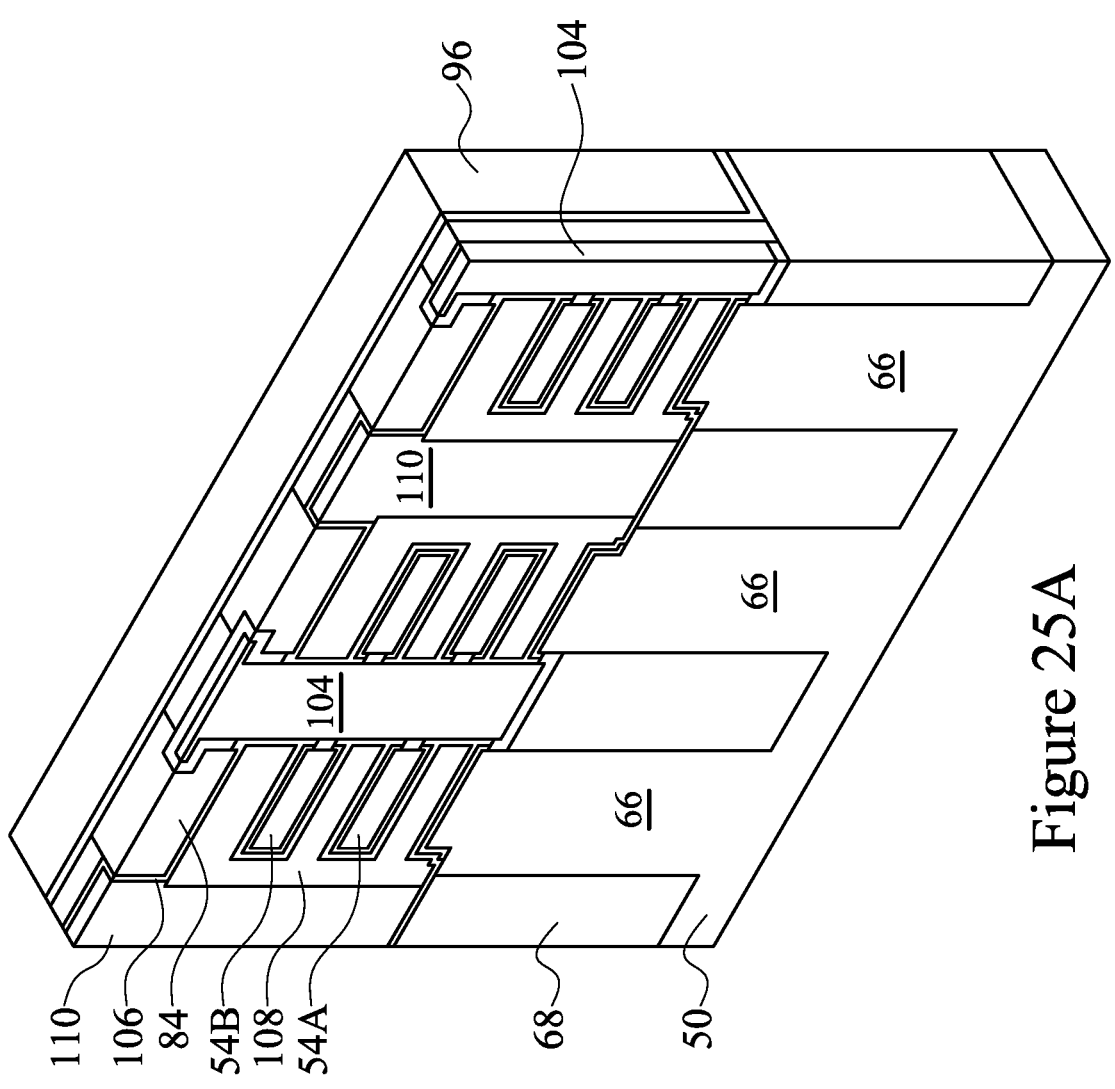
Figure 25B:
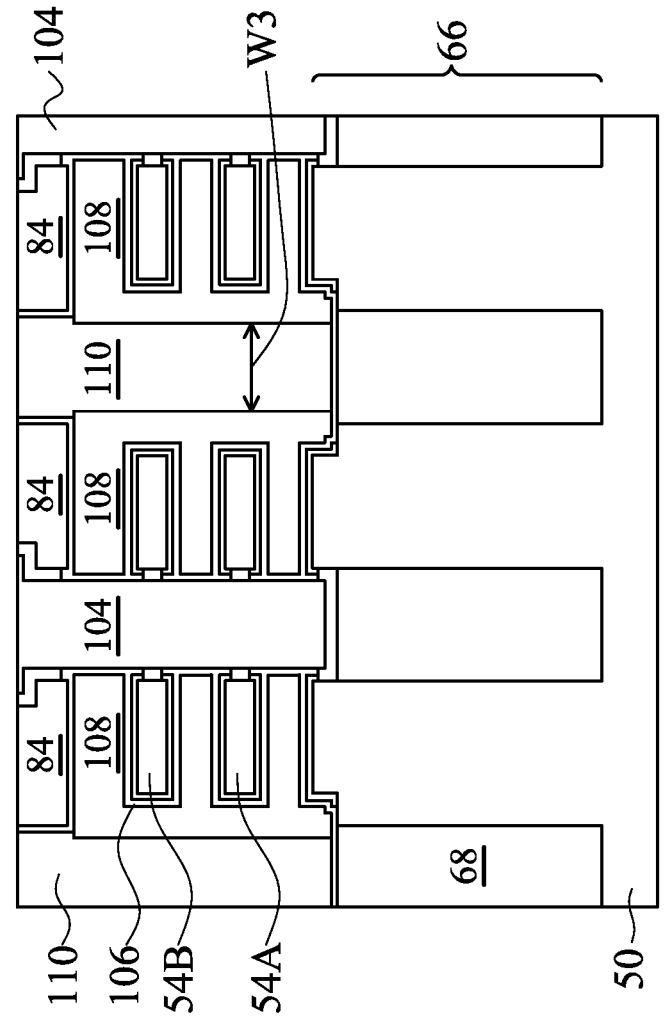

In FIGS. 25A and 25B, second isolation walls 110 are formed in the third recesses 105, in accordance with some embodiments. FIG. 25A illustrates a perspective view including cross-section A-A', and FIG. 25B illustrates a cross-sectional view along cross-section A-A'. The second isolation walls 110 isolate, insulate, and separate neighboring gate structures. In some embodiments, the second nanostructures 54 and the gate structure of each nano-FET may be sandwiched between a first isolation wall 104 and a second isolation wall 110. The second isolation walls 110 are formed by depositing dielectric material within the third recesses 105. The dielectric material may fill or overfill the third recesses 105. The dielectric material of the second isolation walls 110 may comprise one or more layers of one or more different materials, such as silicon oxide, silicon nitride, silicon carbonitride, silicon oxycarbide, silicon oxycarbonitride, a combination thereof, or the like. Other materials or combinations of materials are possible. The dielectric material may be deposited using one or more suitable techniques such as ALD, CVD, PVD, or the like. The material(s) of the second isolation walls 110 may be similar to the material(s) of the first isolation walls 104 or may be different from the material(s) of the first isolation walls 104.

In some embodiments, after depositing the material of the second isolation walls 110, a planarization process may be performed to remove excess material of the second isolation walls 110, as shown in FIGS. 25A-25B. The planarization process may include, for example, a CMP process, a grinding process, an etching process, the like, or a combination thereof. In some embodiments, the planarization process may also remove upper portions of at least the first ILD 96, the CESL 94, the spacer layers 81, and the first isolation walls 104. The planarization process may remove portions of the gate dielectric layers 106 and may expose top surfaces of the hard masks 84, in some embodiments. After performing the planarization process, top surfaces of the first isolation walls 104, the second isolation walls 110, the hard masks 84, the first ILD 96, the spacer layer 81, the CESL 94, and/or the gate dielectric layers 106 may be substantially level.

Because the third recesses 105 are formed using a self-aligned process, the second isolation walls 110 may be considered self-aligned structures, in some cases. Forming the second isolation walls 110 using self-aligned processes can improve uniformity, reduce process sensitivity, and improve yield. In some cases, the formation of second isolation walls 110 using self-aligned processes can allow for improved uniformity and less variation. In some cases, forming second isolation walls 110 between neighboring channel regions of nano-FETs as described herein can allow the channel regions to be formed having a smaller separation distance (e.g. distances D1 of FIG. 18B), which can improve device density. In some embodiments, the second isolation walls 110 may have a width W3 that is in the range of about 15 nm to about 100 nm. The width W3 of the second isolation walls 110 may be about the same or different than the width W1 of the first isolation walls 104 (see FIG. 14B).

Figure 26A:
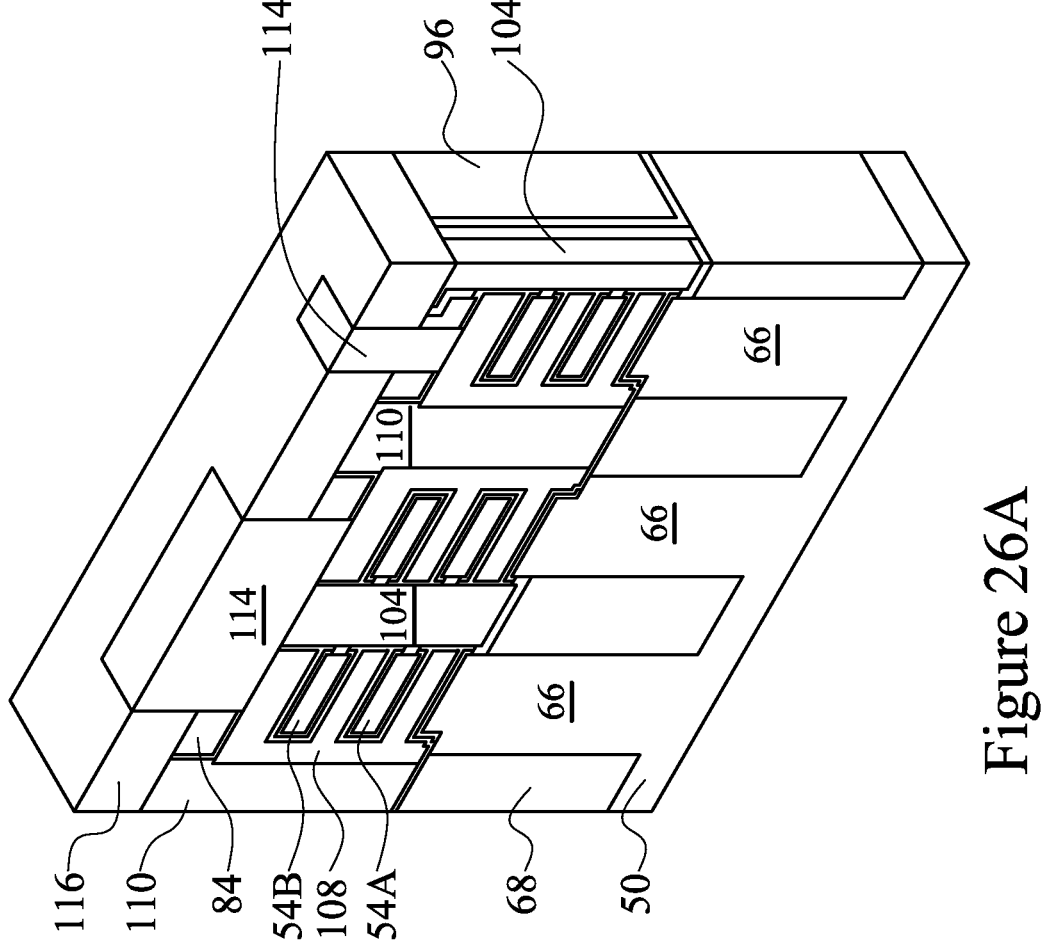
Figure 26B:
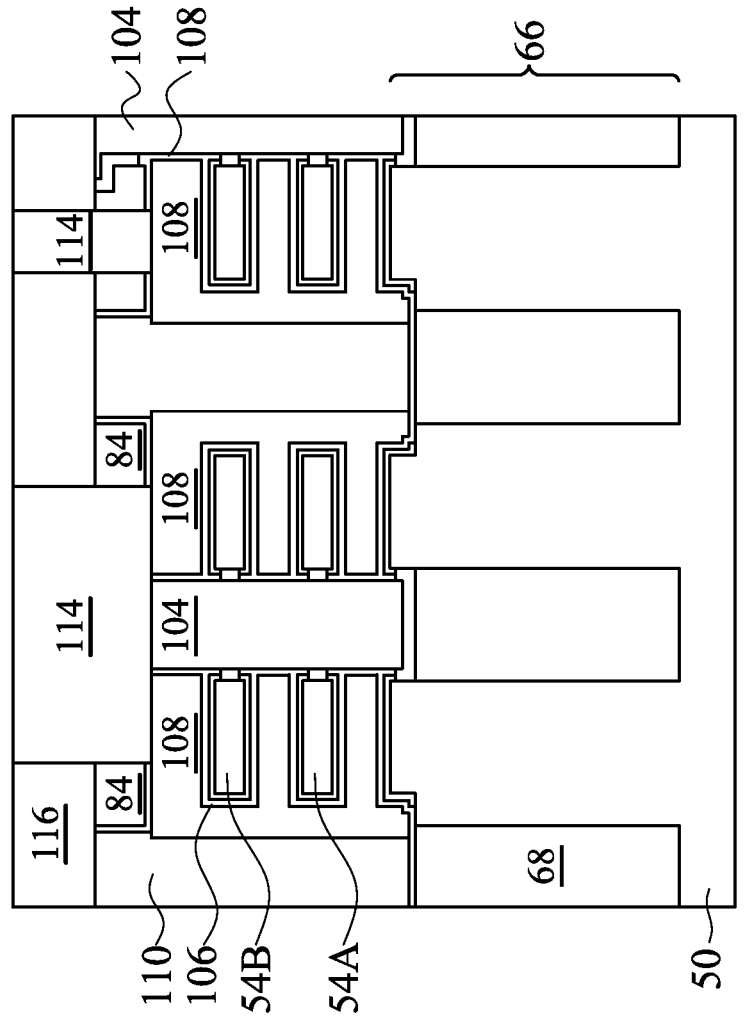
Figure 26C:
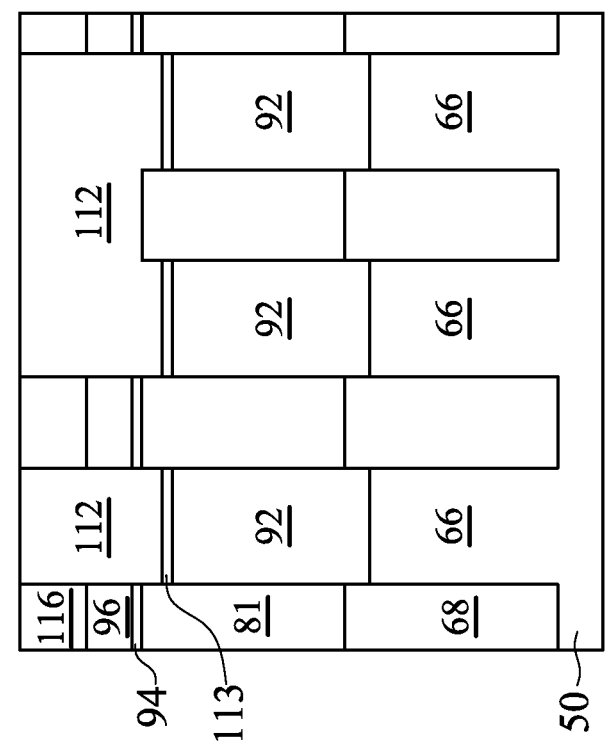
Figure 26D:
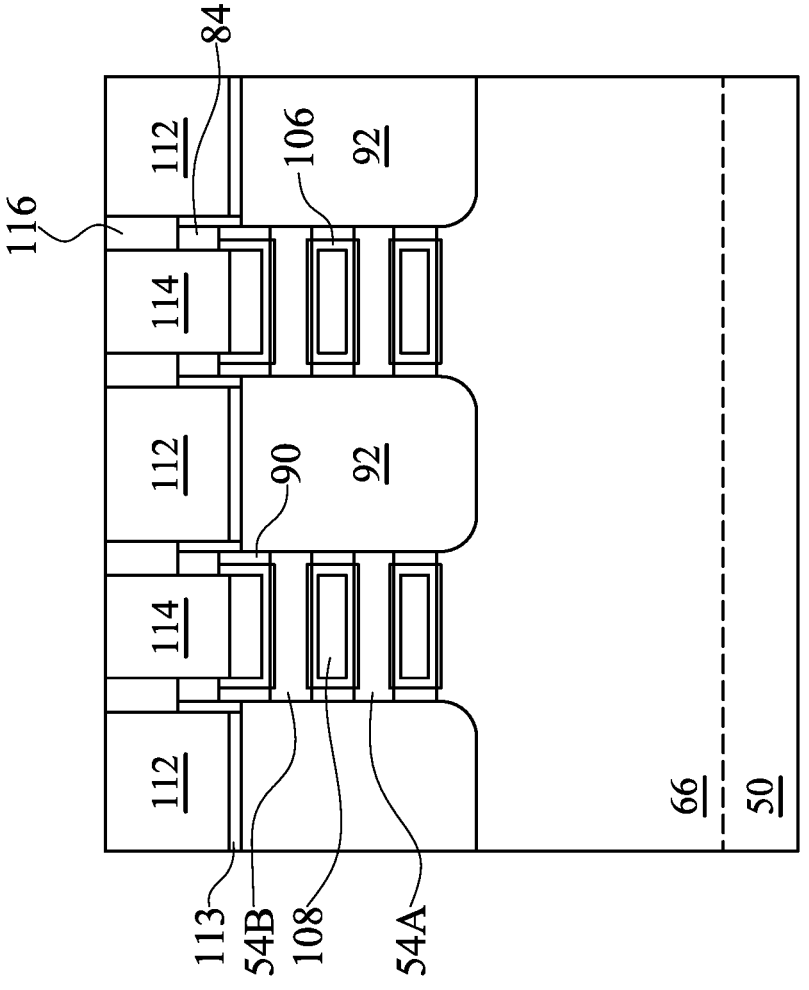

In FIGS. 26A, 26B, 26C, and 26D, source/drain contacts 112 and gate contacts 114 are formed, in accordance with some embodiments. FIG. 26A illustrates a perspective view including cross-sections A-A' and C-C', FIG. 26B illustrates a cross-sectional view along cross-section A-A', FIG. 26C illustrates a cross-sectional view along cross-section C-C', and FIG. 26D illustrates a cross-sectional view along cross-section B-B'. The source/drain contacts 112 (which may also be referred to as contact plugs 112) form electrical connections to the epitaxial source/drain regions 92. As shown in FIG. 26C, a single source/drain contact 112 may electrically connect more than one epitaxial source/drain regions 92. The gate contacts 114 (which may also be referred to as contact plugs 114) form electrical connections to the gate electrodes 108. As shown in FIG. 26B, a single gate contact 114 may electrically connect more than one gate electrode 108. Although FIG. 26D illustrates source/drain contacts 112 and gate contacts 114 in a same cross section, in various embodiments, source/drain contacts 112 and gate contacts 114 may be formed in different cross-sections, thereby reducing the risk of shorting.

In some embodiments, a second ILD 116 is deposited over the first ILD 96, the hard masks 84, the first isolation walls 104, and the second isolation walls 110. The second ILD 116 may comprise an oxide, a nitride, or the like, which may be a material similar to those described previously for the first ILD 96. In some embodiments, the second ILD 116 is a flowable film formed by FCVD. In some embodiments, the second ILD 116 is formed of a dielectric material such as PSG, BSG, BPSG, USG, or the like, and may be deposited using any suitable technique, such as CVD, PECVD, or the like. Other materials or formation techniques are possible.

In some embodiments, after forming the second ILD 116, recesses (not shown in the figures) for the gate contacts 114 are formed that expose the gate electrodes 108 and recesses (not shown in the figures) for the source/drain contacts 112 are formed that expose the epitaxial source/drain regions 92. The recesses for the gate contacts 114 and the recesses for the source/drain contacts 112 may be formed simultaneously or in separate steps. The various recesses may be formed by etching through the second ILD 116, the first ILD 96, the CESL 94, the hard masks 84, and/or the first isolation walls 104. Portions of the gate dielectric layers 106 and/or the liner 102 may also be etched, in some cases. The recesses may be etched using one or more suitable etch processes, which may include wet etch processes, dry etch processes, or a combination thereof. In some embodiments, one or more masks, such as photoresist, may be formed and patterned over the second ILD 116, with the patterned mask used as an etch mask during etching of the recesses.

In some embodiments, silicide regions 113 are formed over the epitaxial source/drain regions 92 in the recesses for the source/drain contacts 112. The silicide regions 113 may be formed, for example, by first depositing a metal (not shown) capable of reacting with the semiconductor materials of the underlying epitaxial source/drain regions 92 (e.g., silicon, silicon-germanium, germanium, or the like) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 113. The un-reacted portions of the deposited metal are then removed, e.g., by an etching process. Although silicide regions 113 are referred to as silicide regions, silicide regions 113 may also be germanide regions, silicon-germanide regions (e.g., regions comprising silicide and germanide), or the like. In an embodiment, the silicide region 113 comprises TiSi, and has a thickness in a range between about 2 nm and about 10 nm.

The gate contacts 114 and the source/drain contacts 112 may then be formed in the recesses. The gate contacts 114 and the source/drain contacts 112 may each comprise one or more layers, such as barrier layers, diffusion layers, and fill materials. For example, in some embodiments, the gate contacts 114 and the source/drain contacts 112 each include a barrier layer and a conductive material, and is electrically coupled to the underlying conductive feature (e.g., the gate structure and/or silicide region 113 in the illustrated embodiment). The gate contacts 114 are electrically coupled to the gate structure, and the source/drain contacts 112 are electrically coupled to the silicide regions 113. The barrier layer(s) may comprise titanium, titanium nitride, tantalum, tantalum nitride, or the like. The conductive material may comprise copper, a copper alloy, silver, gold, tungsten, cobalt, aluminum, nickel, ruthenium, or the like. A planarization process, such as a CMP, may be performed to remove excess material from a surface of the second ILD 116. Further processing may be performed, such as the formation of Inter-Metal Dielectric (IMD) layers over the gate contacts 114 and the source/drain contacts 112, through which vias or other conductive features may be formed that electrically connect to the gate contacts 114 and the source/drain contacts 112. In this manner, nano-FETs may be formed, in accordance with some embodiments.

Figure 27:
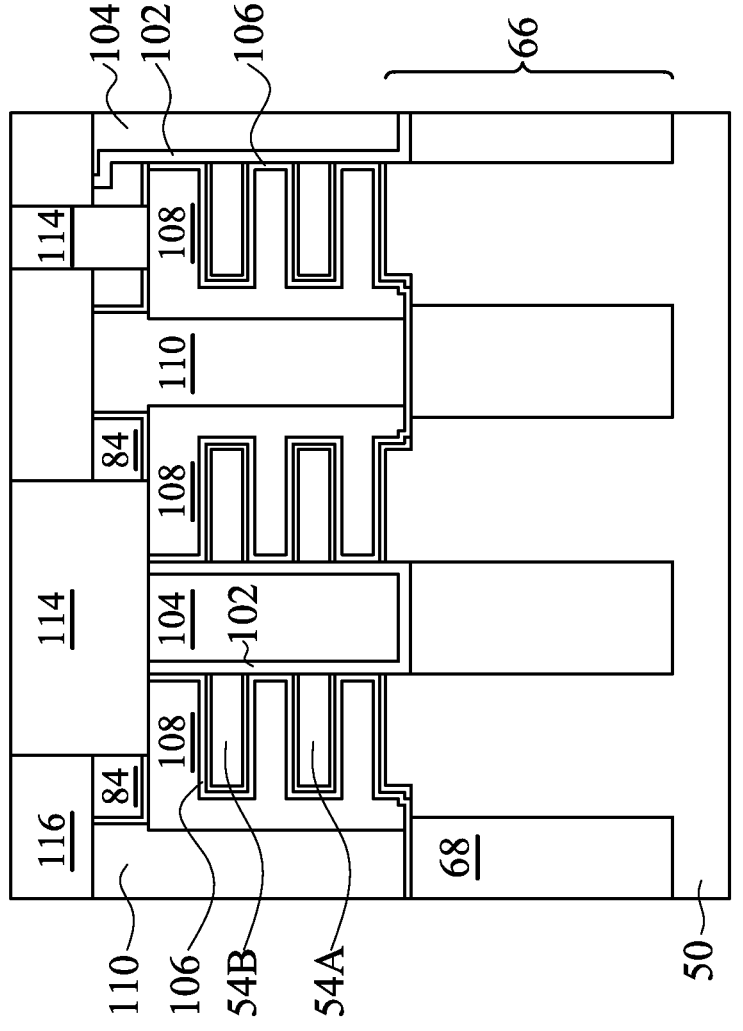
FIG. 27 is a cross-sectional view of a nano-FET structure, in accordance with some embodiments.

FIG. 27 illustrates a nano-FET structure, in accordance with some embodiments. FIG. 27 illustrates a cross-sectional view along cross-section A-A'. The nano-FET structure shown in FIG. 27 is similar to the nano-FET structure shown in FIGS. 26A-26D, except that regions of the liner 102 are not removed as described in FIGS. 19A-19C. Because the optional liner 102 removal step is not performed, the liner 102 remains covering surfaces of the first isolation walls 104 and separates the first isolation walls 104 from the gate dielectric layers 106. The presence of the liner 102 also blocks the gate dielectric layers 106 from forming on sidewalls of the second nanostructures 54 that are adjacent the liner 102. Additionally, the presence of the liner 102 may form gate electrodes 108 having a smaller overall width, which can reduce parasitic capacitances, in some cases.

Figure 28:
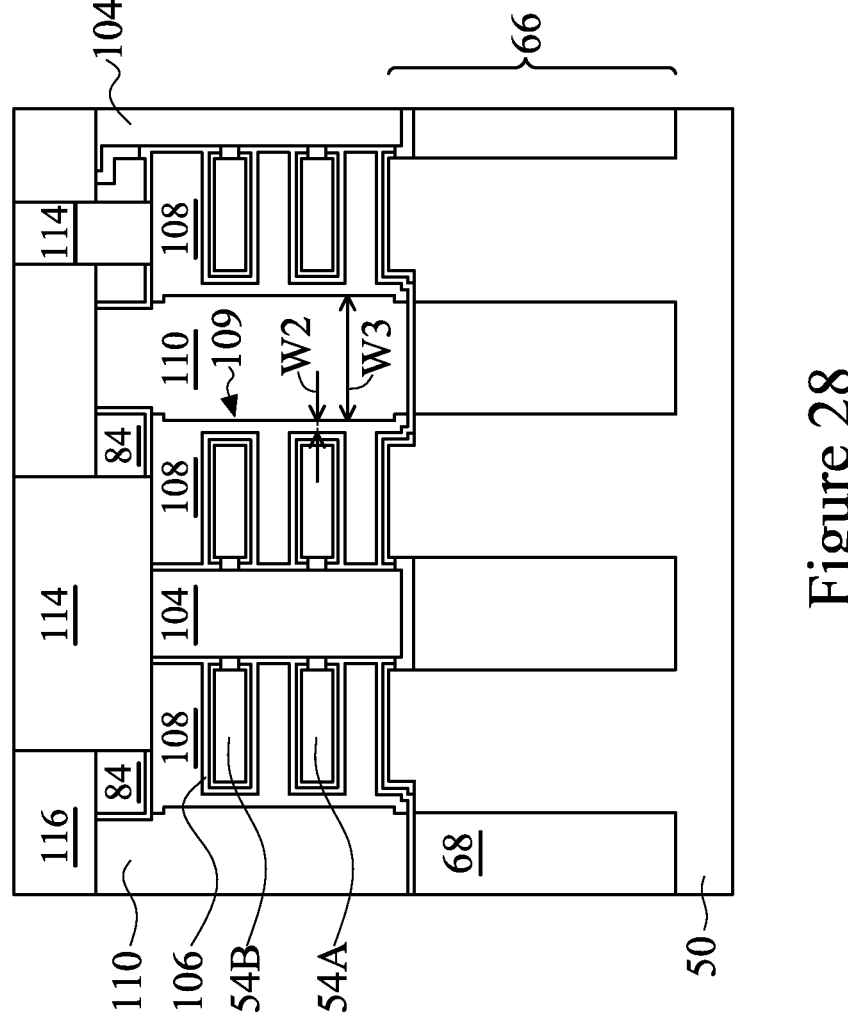
FIG. 28 is a cross-sectional view of a nano-FET structure, in accordance with some embodiments.

FIG. 28 illustrates a nano-FET structure, in accordance with some embodiments. FIG. 28 illustrates a cross-sectional view along cross-section A-A'. The nano-FET structure shown in FIG. 28 is similar to the nano-FET structure shown in FIGS. 26A-26D, except that additional electrode material is not deposited as described in FIGS. 24A-24B. Because the optional additional electrode material deposition step is not performed, the fifth recesses 109 may remain in the gate electrodes 108. Additionally the gate electrodes 108 may be formed having a smaller width W2, and the second isolation walls 110 may be formed having a larger width W3. In this manner, the gate electrodes 108 may be formed having a smaller overall width, which can reduce parasitic capacitances, in some cases.

Figure 29:
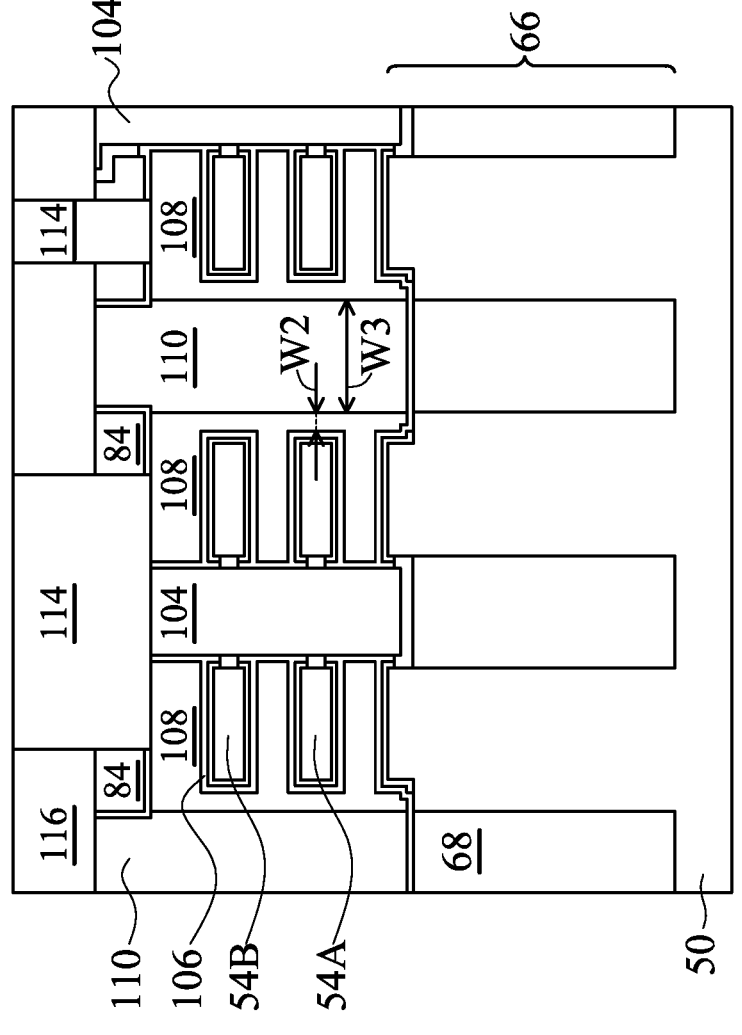
FIG. 29 is a cross-sectional view of a nano-FET structure, in accordance with some embodiments.

FIG. 29 illustrates a nano-FET structure, in accordance with some embodiments. FIG. 29 illustrates a cross-sectional view along cross-section A-A'. The nano-FET structure shown in FIG. 29 is similar to the nano-FET structure shown in FIGS. 26A-26D, except that a smaller amount of additional electrode material has been deposited, compared with FIGS. 24A-24B. The gate electrodes 108 shown in FIG. 29 have sidewall surfaces that are approximately aligned with sidewall surfaces of the hard masks 84, though the sidewall surfaces of the gate electrodes 108 and the hard masks 84 may be offset in other embodiments. Additionally, depositing a smaller amount of additional electrode material may result in a smaller width W2 of the gate electrodes 108 and a larger width W3 of the second isolation walls 110, compared with FIGS. 24A-24B. In this manner, controlling the deposition of the additional electrode material can allow for control of the width W2 of the gate electrodes 108, the overall width of the gate electrodes 108, and/or the width W3 of the second isolation walls 110.

Figure 30:
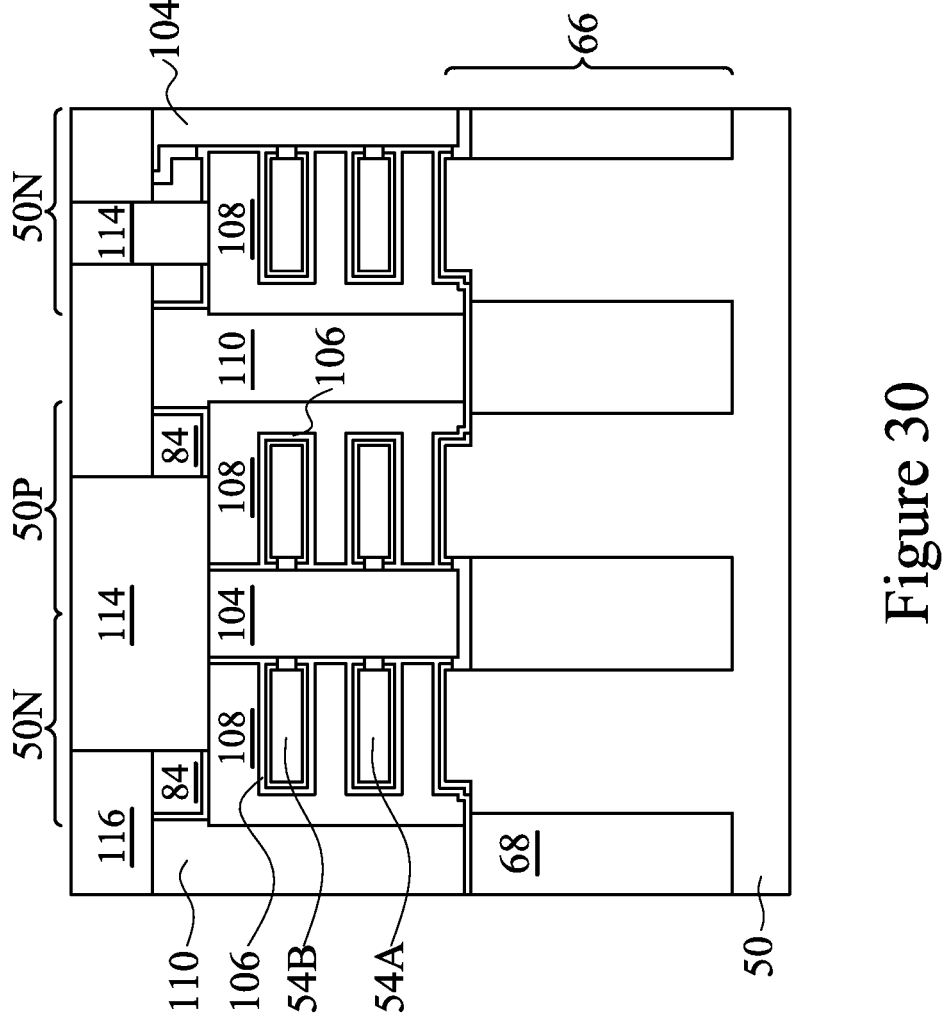
FIG. 30 is a cross-sectional view of a nano-FET structure having n-type nano-FETs and p-type nano-FETs, in accordance with some embodiments.

FIG. 30 illustrates a nano-FET structure, in accordance with some embodiments. FIG. 30 illustrates a cross-sectional view along cross-section A-A'. The nano-FET structure shown in FIG. 30 is similar to the nano-FET structure shown in FIGS. 26A-26D, except that the nano-FET structure includes both n-type nano-FETs and p-type nano-FETs. For example, in the embodiment of FIG. 30, n-type nano-FETs are formed in n-type regions 50N and p-type nano-FETs are formed in p-type regions 50P, wherein the n-type regions 50N are separated from the p-type regions 50P by the first isolation walls 104 and the second isolation walls 110. The arrangement of n-type nano-FETs and p-type nano-FETs shown in FIG. 30 is an illustrative example, and other arrangements of nano-FETs are possible.

Embodiments may achieve advantages. For example, the isolation walls that separate gate electrodes are formed in a self-aligned process that improves uniformity and reduces process variation, such as variation due to photolithography shift. The self-aligned isolation walls described herein may also allow for smaller separation between nano-FETs or the gate electrodes thereof, which can improve device density. In some embodiments, the locations of the isolation walls are defined by hard masks formed over the nanostructures of the nano-FETs. This allows for greater control over the sizes of the gate structures. For example, the techniques described herein allow for the gate electrodes to be formed having smaller heights, widths, and/or end caps, which can reduce parasitic capacitances and improve device performance. Forming gate electrodes of smaller size can also improve device density. Additionally, the techniques described herein allow for improved uniformity and control of the heights, widths, and/or end caps of the gate electrodes.

In some embodiments of the present disclosure, a device includes a first stack of nanostructures formed over a substrate; a second stack of nanostructures formed adjacent to the first stack; a first gate structure on the nanostructures of the first stack; a second gate structure on the nanostructures of the second stack; a first insulating wall separating the first gate structure and the second gate structure; a hard mask layer on the first gate structure and on the second gate structure; and a gate contact extending through the hard mask layer to physically and electrically contact the first gate structure. In an embodiment, the first insulating wall is along a first side of the first gate structure, and further comprising a second insulating wall along a second side of the first gate structure. In an embodiment, the gate contact extends over the first insulating wall to physically and electrically contact the second gate structure. In an embodiment, a portion of the first insulating wall extends over the hard mask layer. In an embodiment, the hard mask layer has a thickness in the range of 4 nm to 8 nm. In an embodiment, the device includes a source/drain region adjacent the first stack of nanostructures, wherein a top surface of the source/drain region is lower than a top surface of the hard mask layer. In an embodiment, the first insulating wall has a width in the range of 10 nm to 30 nm.

In some embodiments of the present disclosure, a device includes a first dielectric wall over a substrate; a second dielectric wall over the substrate, wherein the second dielectric wall is adjacent the first dielectric wall; nanostructures between the first dielectric wall and the second dielectric wall; a gate stack on each nanostructure, wherein the gate stack includes a gate electrode over a gate dielectric, wherein the gate stack is sandwiched between the first dielectric wall and the second dielectric wall; and a hard mask on the gate stack, wherein the hard mask is between the first dielectric wall and the second dielectric wall. In an embodiment, the gate dielectric physically contacts the first dielectric wall and the gate electrode physically contacts the second dielectric wall. In an embodiment, the first dielectric wall is a different dielectric material than the second dielectric wall. In an embodiment, a top surface of the second dielectric wall and a top surface of the hard mask are level. In an embodiment, a width of the hard mask is greater than a width of the nanostructures. In an embodiment, a lateral thickness of the gate electrode between a nanostructure and the second dielectric wall is in the range of 3 nm to 10 nm. In an embodiment, a vertical thickness of the gate electrode between a nanostructure and the hard mask is in the range of 4 nm to 10 nm.

In some embodiments, of the present disclosure, a method includes forming a first stack of nanostructures over a substrate; forming a hard mask on the first stack of nanostructures; after forming the hard mask, forming a gate structure on the first stack of nanostructures; forming a first isolation wall on a first side of the first stack of nanostructures and a first side of the hard mask; forming a second isolation wall on a second side of the first stack of nanostructures and a second side of the hard mask; and forming a contact extending through the hard mask and contacting the gate structure. In an embodiment, forming the first isolation wall includes forming a dummy gate over the hard mask and adjacent the first stack of nanostructures; etching the dummy gate using the hard mask as an etch mask to form a recess adjacent the first stack of nanostructures; and depositing a dielectric material in the recess. In an embodiment, forming the hard mask includes forming a sacrificial material on the first stack of nanostructures; removing the sacrificial material to form an opening; and depositing a hark hard mask material in the opening. In an embodiment, the sacrificial material includes silicon-germanium. In an embodiment, forming the gate structure includes depositing an electrode material over the first stack of nanostructures; depositing a mask layer on a sidewall of the electrode material; after depositing the mask layer, performing an etch process to remove excess electrode material; and removing the mask layer. In an embodiment, the method includes, after removing the mask layer, depositing additional electrode material over the first stack of nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first stack of nanostructures formed over a substrate;
a second stack of nanostructures formed adjacent to the first stack;
a first gate structure on the first stack of nanostructures;
a second gate structure on the second stack of nanostructures;
a first insulating wall separating the first gate structure and the second gate structure;
a hard mask layer on the first gate structure and on the second gate structure; and
a gate contact extending through the hard mask layer to physically and electrically contact the first gate structure, wherein a bottom surface of the gate contact is closer to the substrate than a top surface of the first insulating wall.

2. The device of claim 1, wherein the first insulating wall is along a first side of the first gate structure, and further comprising a second insulating wall along a second side of the first gate structure.

3. The device of claim 1, wherein the gate contact extends over the first insulating wall to physically and electrically contact the second gate structure.

4. The device of claim 1, wherein a portion of the first insulating wall extends over the hard mask layer.

5. The device of claim 1, wherein the hard mask layer has a thickness in a range of 4 nm to 8 nm.

6. The device of claim 1 further comprising a source/drain region adjacent the first stack of nanostructures, wherein a top surface of the source/drain region is lower than a top surface of the hard mask layer.

7. The device of claim 1, wherein the first insulating wall has a width in a range of 10 nm to 30 nm.

8. A device comprising:
a first dielectric wall over a substrate;
a second dielectric wall over the substrate, wherein the second dielectric wall is adjacent the first dielectric wall;
a plurality of nanostructures between the first dielectric wall and the second dielectric wall;

a gate stack on each nanostructure of the plurality of nanostructures, wherein the gate stack comprises a gate electrode over a gate dielectric, wherein the gate stack is sandwiched between the first dielectric wall and the second dielectric wall; and
a hard mask on the gate stack, wherein the hard mask is sandwiched between the first dielectric wall and the second dielectric wall.

9. The device of claim 8, wherein the gate dielectric physically contacts the first dielectric wall and the gate electrode physically contacts the second dielectric wall.

10. The device of claim 8, wherein the first dielectric wall is a different dielectric material than the second dielectric wall.

11. The device of claim 8, wherein a top surface of the second dielectric wall and a top surface of the hard mask are level.

12. The device of claim 8, wherein a width of the hard mask is greater than a width of the nanostructures of the plurality of nanostructures.

13. The device of claim 8, wherein a lateral thickness of the gate electrode between a nanostructure of the plurality of nanostructures and the second dielectric wall is in a range of 3 nm to 10 nm.

14. The device of claim 8, wherein a vertical thickness of the gate electrode between a nanostructure of the plurality of nanostructures and the hard mask is in a range of 4 nm to 10 nm.

15. A method comprising:
forming a first stack of nanostructures over a substrate;
forming a hard mask on the first stack of nanostructures;
after forming the hard mask, forming a gate structure on the first stack of nanostructures;
forming a first isolation wall on a first side of the first stack of nanostructures and a first side of the hard mask;
forming a second isolation wall on a second side of the first stack of nanostructures and a second side of the hard mask; and
forming a contact extending through the hard mask and contacting the gate structure.

16. The method of claim 15, wherein forming the first isolation wall comprises:
forming a dummy gate over the hard mask and adjacent the first stack of nanostructures;
etching the dummy gate using the hard mask as an etch mask to form a recess adjacent the first stack of nanostructures; and
depositing a dielectric material in the recess.

17. The method of claim 15, wherein forming the hard mask comprises:
forming a sacrificial material on the first stack of nanostructures;
removing the sacrificial material to form an opening; and
depositing a hard mask material in the opening.

18. The method of claim 17, wherein the sacrificial material comprises silicon-germanium.

19. The method of claim 15, wherein forming the gate structure comprises:
depositing an electrode material over the first stack of nanostructures;
depositing a mask layer on a sidewall of the electrode material;
after depositing the mask layer, performing an etch process to remove excess electrode material; and
removing the mask layer.

20. The method of claim 19 further comprising, after removing the mask layer, depositing additional electrode material over the first stack of nanostructures.

\* \* \* \* \*